US008399302B2

(12) United States Patent
Tanaka et al.

(10) Patent No.: US 8,399,302 B2
(45) Date of Patent: Mar. 19, 2013

(54) METHOD OF MANUFACTURING SEMICONDUCTOR DEVICE

(75) Inventors: Shigeki Tanaka, Nanae (JP); Atsushi Fujisawa, Nanae (JP); Masahiro Tani, Nanae (JP); Satoru Suzuki, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 21 days.

(21) Appl. No.: 13/155,377

(22) Filed: Jun. 7, 2011

(65) Prior Publication Data

US 2011/0300670 A1 Dec. 8, 2011

(30) Foreign Application Priority Data

Jun. 8, 2010 (JP) ................................ 2010-130688

(51) Int. Cl.
*H01L 21/00* (2006.01)

(52) U.S. Cl. ........ 438/123; 438/122; 438/124; 438/125; 438/126; 438/127; 257/666; 257/667; 257/E21.506; 257/E21.507

(58) Field of Classification Search ........................ None
See application file for complete search history.

(56) References Cited

U.S. PATENT DOCUMENTS

| | | | | |
|---|---|---|---|---|
| 6,424,023 | B1 * | 7/2002 | Kim et al. | 257/666 |
| 6,664,647 | B2 * | 12/2003 | Kasuga et al. | 257/787 |
| 2007/0181985 | A1 * | 8/2007 | Danno | 257/666 |

FOREIGN PATENT DOCUMENTS

| | | | |
|---|---|---|---|
| JP | 07-14965 | A | 1/1995 |
| JP | 2004-96022 | A | 3/2004 |

* cited by examiner

*Primary Examiner* — Fernando L Toledo
*Assistant Examiner* — Yasser Abdelaziez
(74) *Attorney, Agent, or Firm* — Miles and Stockbridge P.C.

(57) ABSTRACT

The occurrence of a resin seal failure is suppressed. A molding step is carried out using a lead frame in which there are formed multiple air vent portions for discharging gas in each cavity formed in the upper die of a molding die to outside the cavity. The air vent portions are formed at positions overlapping with the other corner portions, arranged inside a gate portion of the cavity. Each of the air vent portions is led out from the other corner portions of the cavity to outside a clamp area and is extended along sides of the cavity, respectively, in the clamp area.

17 Claims, 39 Drawing Sheets

METHOD OF MANUFACTURING SEMICONDUCTOR DEVICE

CROSS-REFERENCE TO RELATED APPLICATIONS

The disclosure of Japanese Patent Application No. 2010-130688 filed on Jun. 8, 2010 including the specification, drawings and abstract is incorporated herein by reference in its entirety.

BACKGROUND

The present invention relates to manufacturing techniques for semiconductor devices and in particular to a technology effectively applicable to a method of manufacturing a semiconductor device obtained by placing a semiconductor chip over a die pad of a lead frame and sealing this semiconductor chip with resin.

Japanese Unexamined Patent Publication No. 2004-96022 (Patent Document 1) and Japanese Unexamined Patent Publication Hei 7(1995)-14965 (Patent Document 2) describe that a groove for air vent is formed in part of a lead frame during a molding step.

[Patent Document 1]
Japanese Unexamined Patent Publication 2004-96022
[Patent Document 2]
Japanese Unexamined Patent Publication Hei 7(1995)-14965

SUMMARY

Method of manufacturing semiconductor device involves a step of sealing a semiconductor chip with resin to form a sealed body (molding step). If a void is formed in a sealed body formed by this molding step, it will degrade the reliability of the semiconductor device. For this reason, it is necessary to apply a means for suppressing the formation of a void to the molding step.

As a means for suppressing the formation of a void, for example, there is the method described in Patent Document 1 above. In this method, a groove portion is formed in the tie bar area between adjacent lead frames and this groove portion is coupled with a cavity to discharge the air in the cavity.

However, the investigation conducted by the present inventors revealed that it was difficult to suppress the formation of a void just by coupling together a groove portion and a cavity as in Patent Document 1 above.

For example, Patent Document 2 describes a method as another means. In this method, a groove portion is formed in a dam portion that couples together multiple leads so that it traverses the dam portion.

However, the following was revealed by the investigation conducted by the present inventors. When a hollow space formed by a groove portion and a molding die is large in volumetric capacity, a resin leak may be caused because the outside of the dam portion is an open space. When the volumetric capacity of a hollow space formed by a groove portion and a molding die is reduced, a void may be formed.

The invention has been made in consideration of the above problems and it is an object thereof to provide a technology for suppressing the occurrence of a resin seal failure.

It is another object of the invention to provide a technology for enhancing the mounting strength of a semiconductor device.

The above and other objects and novel features of the invention will be apparent from the description in this specification and the accompanying drawings.

The following is a brief description of the gist of the representative elements of the invention laid open in this application:

In the method of manufacturing a semiconductor device as an embodiment of the invention laid open in this application, a molding step is carried out using the following lead frame: a lead frame in which multiple air vent portions are formed for discharging gas in a cavity formed in the upper die of a molding die to outside the cavity. The air vent portions are formed at positions, respectively, overlapping with the other corner portions of the cavity. The air vent portions are each led out from the other corner portions of the cavity to outside a clamp area, respectively, and are extended along sides of the cavity, respectively, in the clamp area.

The following is a brief description of the gist of the effect obtained by the representative elements of the invention laid open in this application:

According to an embodiment of the invention laid open in this application, a resin seal failure can be suppressed at a step of sealing a semiconductor chip with resin.

DETAILED DESCRIPTION

Figure 1:
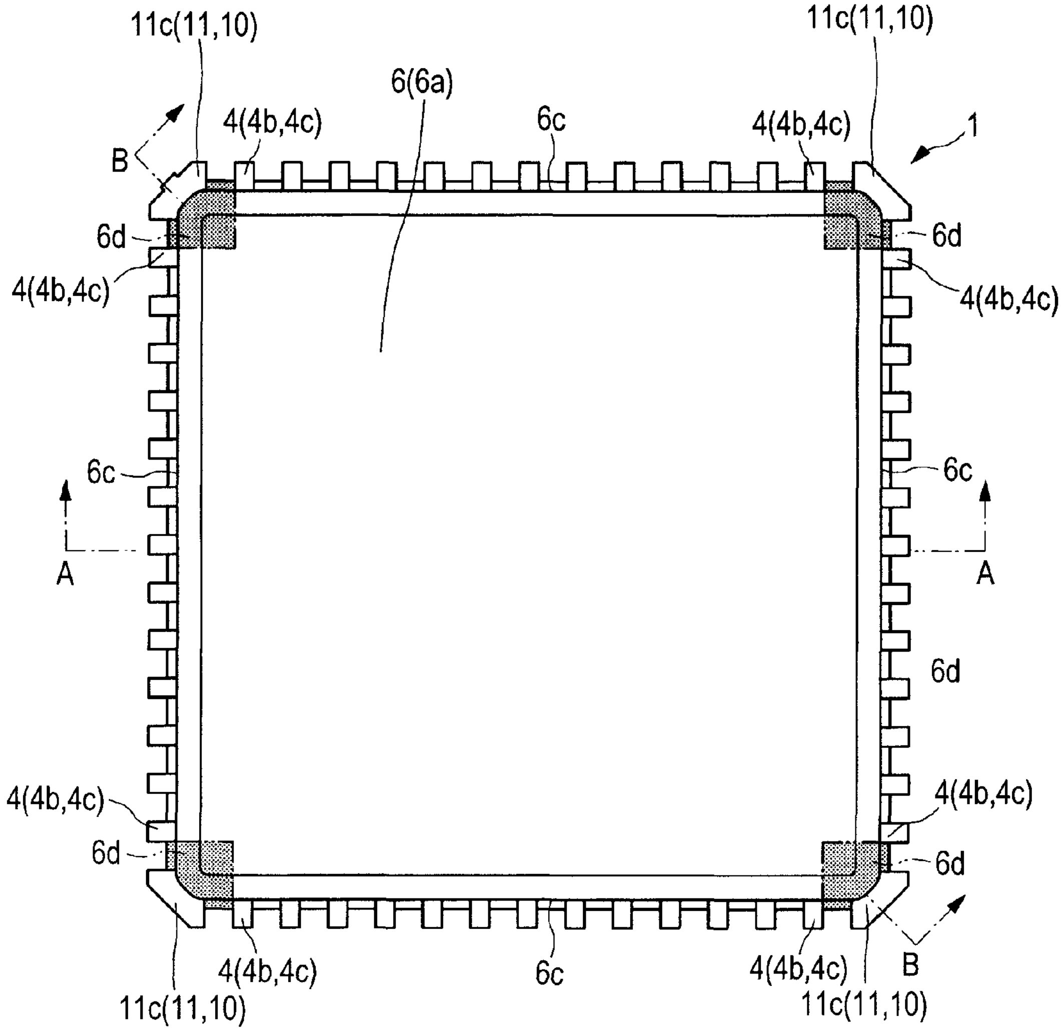
FIG. 1 is a top view of a semiconductor device in an embodiment of the invention.

Explanation of Style of Description, Basic Terms, and Usage Thereof in this Specification The description of embodiments in this specification may be divided into multiple sections as required for the sake of convenience. These sections are not independent of or separate from one another unless otherwise explicitly stated. Each section is each part of a single example and one section is the details of part of another or a modification or the like to part or all of another. The repetitive description of a similar part will be omitted as a rule. Each constituent element of the embodiments is not indispensable unless otherwise explicitly stated, the number of constituent elements is theoretically limited, or the constituent element is contextually obviously indispensable.

Even when the wording of "X formed of A" or the like is used in the description of the embodiments or the like with respect to material, composition, or the like, what containing an element other than A is not excluded. This applies unless otherwise explicitly stated or it is contextually obviously excluded. Examples will be taken. With respect to component, the above wording means that "X including A as a main component" or the like. A term of "silicon member" or the like is not limited to members of pure silicon and includes SiGe (silicon-germanium) alloys, other multi-element alloys predominantly composed of silicon, and members containing other additive or the like, needless to add. The terms of gold plate, copper layer, nickel plate, and the like include not only pure ones but also members respectively predominantly composed of gold, copper, nickel, and the like unless otherwise explicitly stated.

When reference is made to any specific numeric value or quantity, the specific numeric value or quantity may be exceeded or may be underrun. This applies unless otherwise explicitly stated, any other specific numerical value or quantity, is theoretically impermissible, or the specific value or quantity contextually may not be exceeded or underrun.

In the every drawing in relation to embodiments, the same or similar elements will be marked with the same or similar codes or reference numerals and the description thereof will not be repeated as a rule.

In each accompanying drawing, hatching or the like may be omitted even from a section when it complicates the drawing or it is clearly distinguishable from an airspace. Even in case of a planarly closed hole, a background contour line may be omitted when the hole is clearly recognizable from description or the like. Hatching or a dot pattern may be given to something to clearly indicate that it is not an airspace even though it is not a section or clearly indicate the border of some area.

First Embodiment

Figure 2:
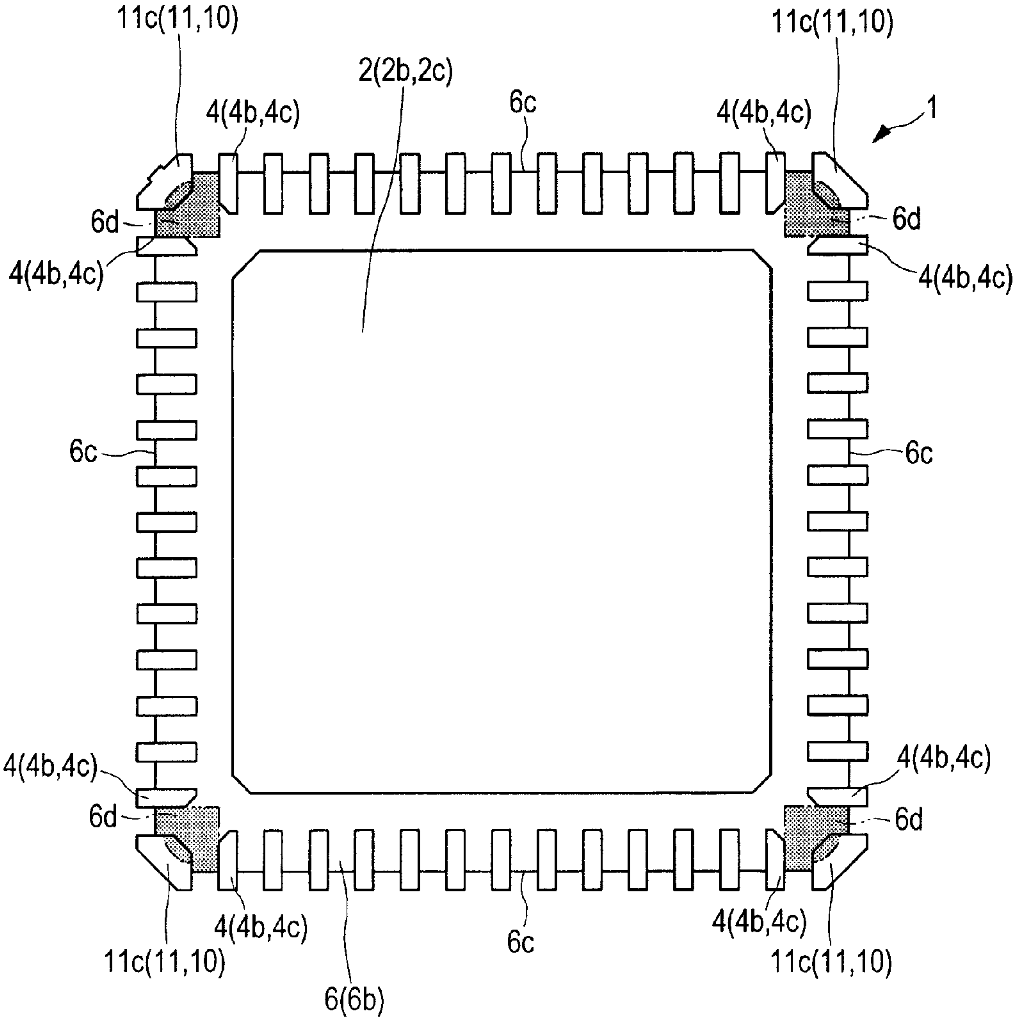
FIG. 2 is a bottom view of the semiconductor device illustrated in FIG. 1.
Figure 3:
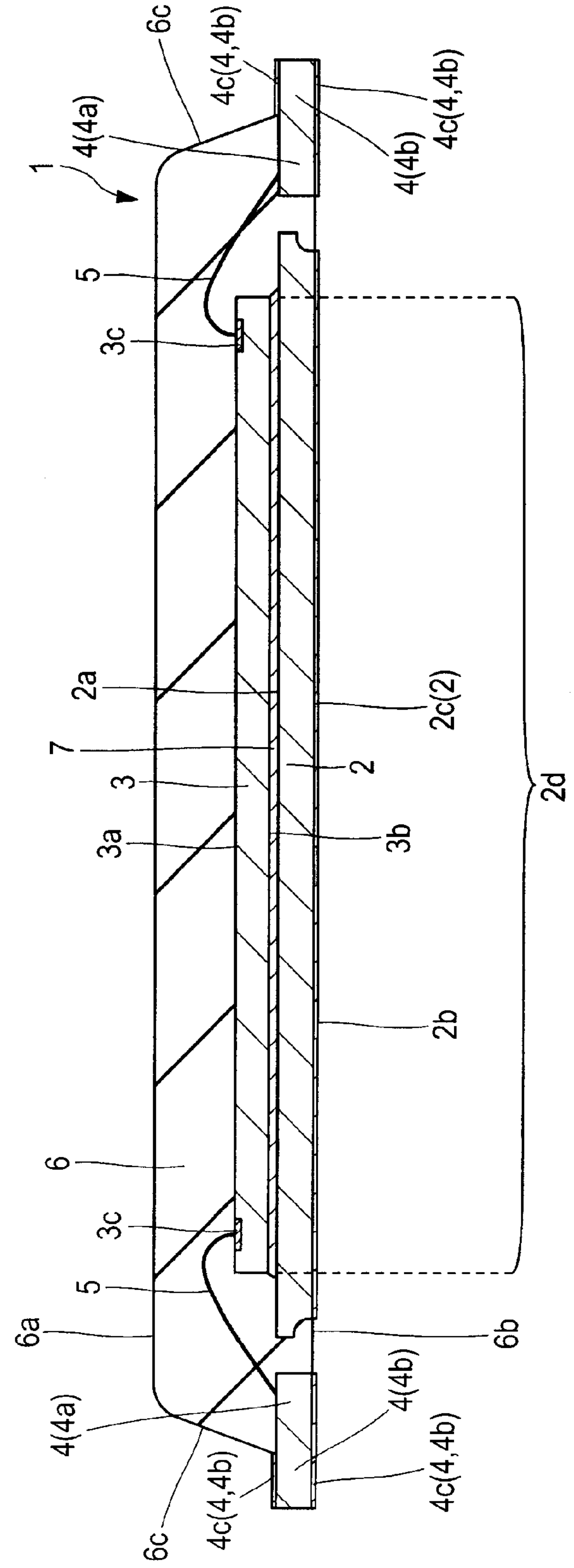
FIG. 3 is a sectional view taken along line A-A of FIG. 1.
Figure 4:
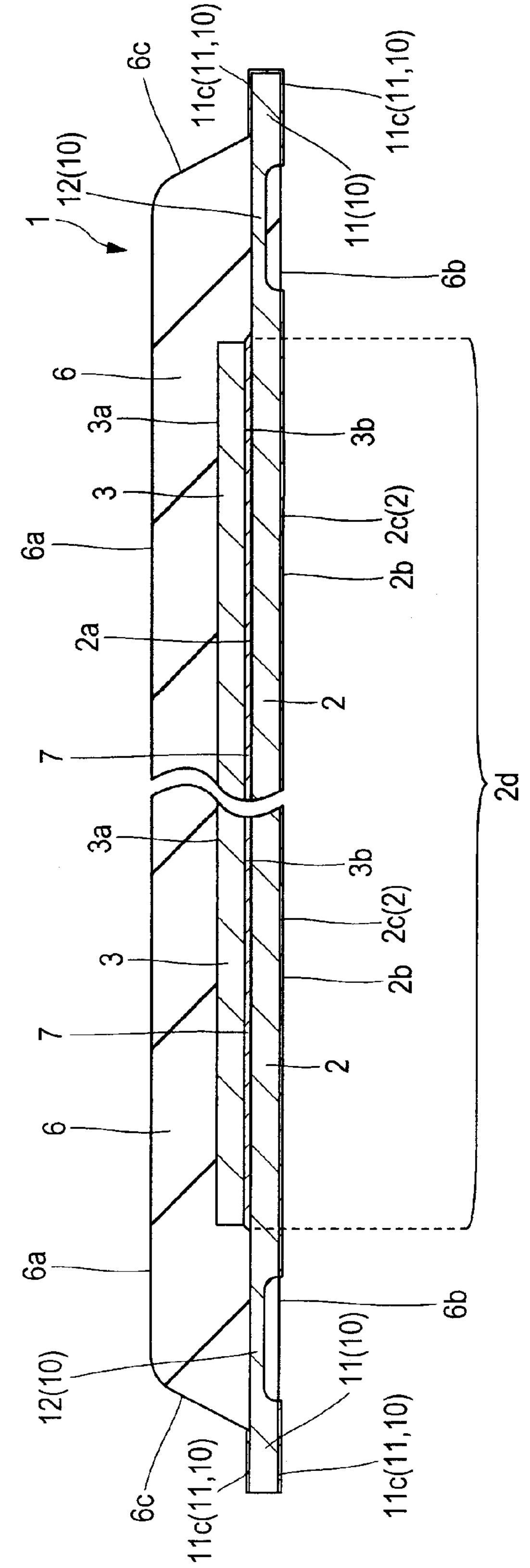
FIG. 4 is a sectional view taken along line B-B of FIG. 1.
Figure 5:
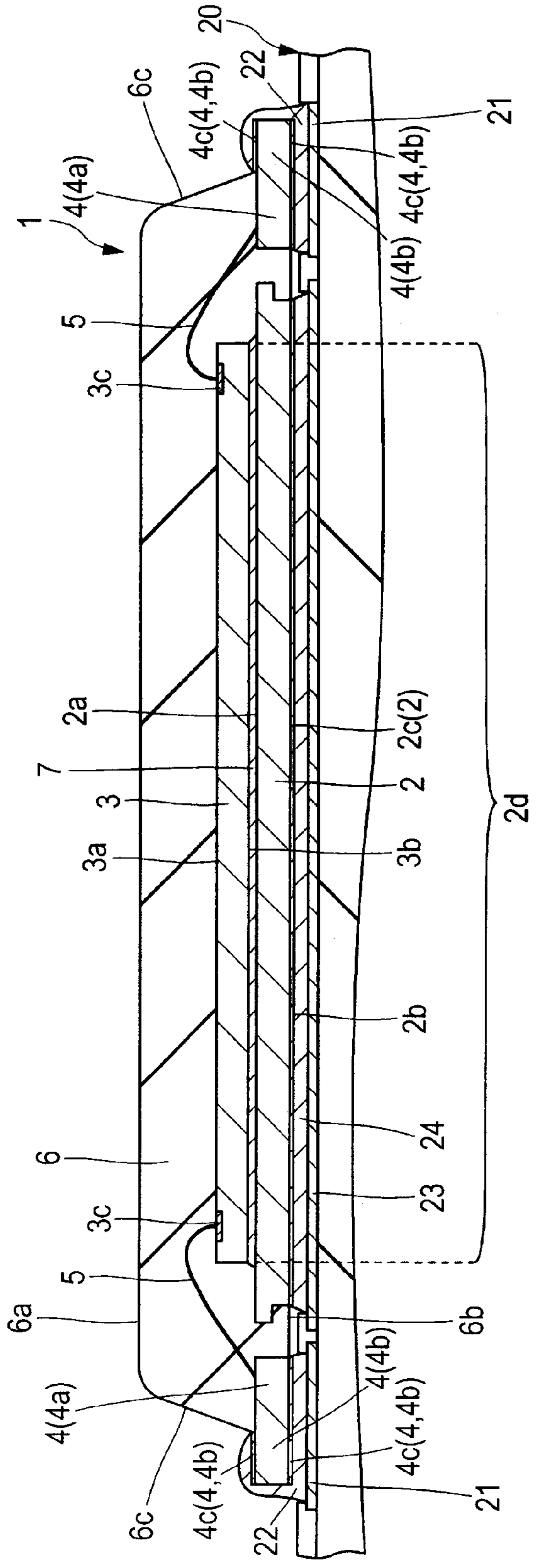
FIG. 5 is an enlarged sectional view illustrating a mounting structure obtained by mounting the semiconductor device illustrated in FIG. 3 over a mounting board.
Figure 6:
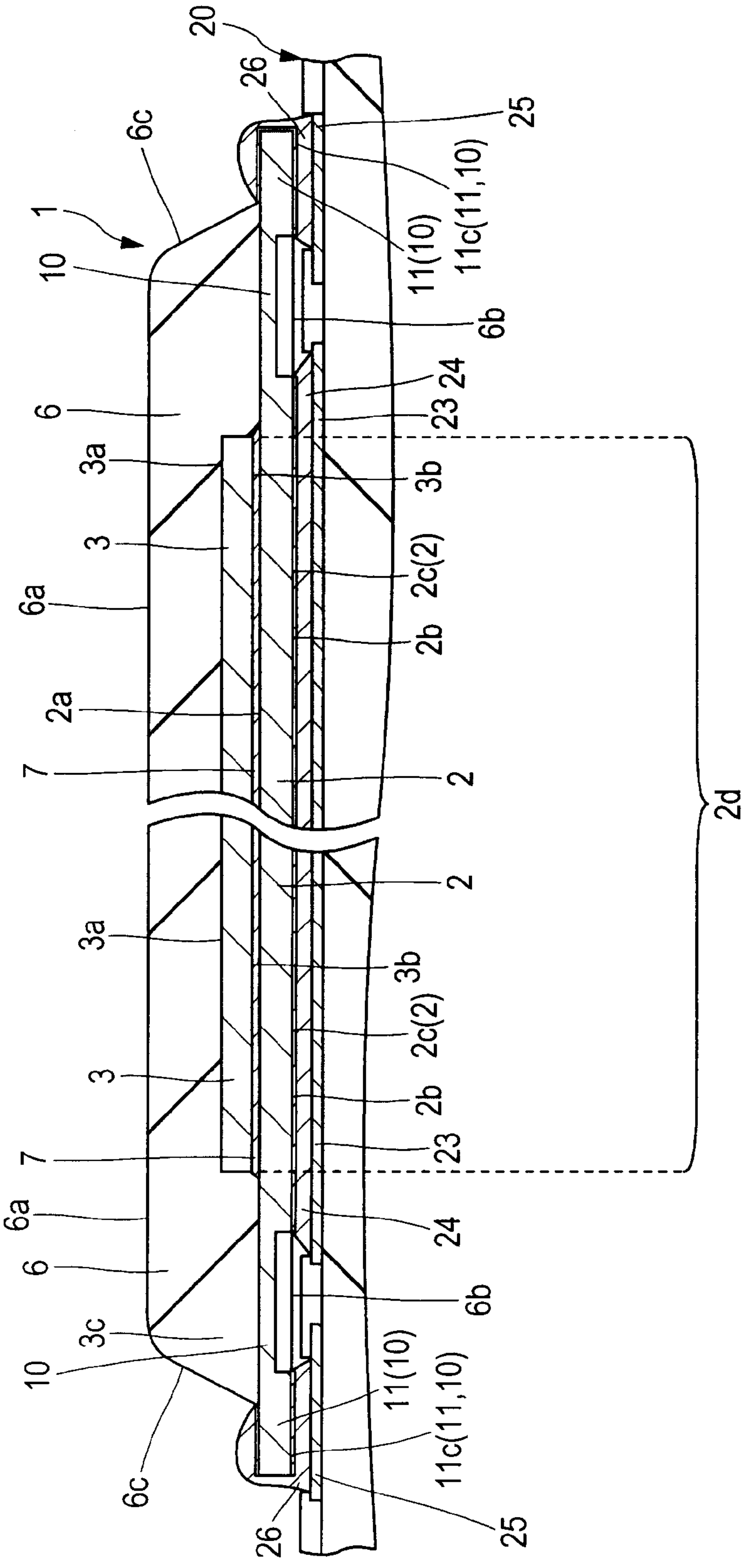
FIG. 6 is an enlarged sectional view illustrating a mounting structure obtained by mounting the semiconductor device illustrated in FIG. 4 over a mounting board.
Figure 7:
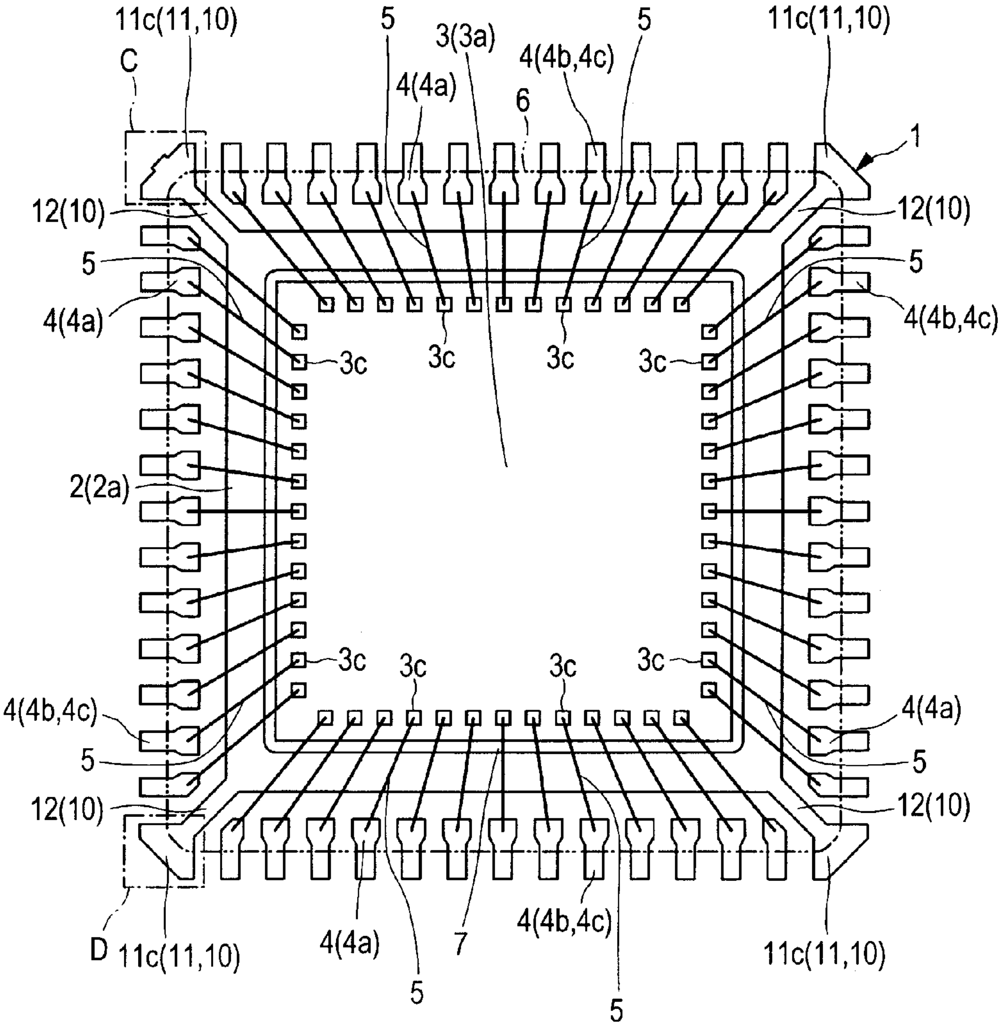
FIG. 7 is a plan view illustrating the internal structure of a semiconductor device with the sealing resin illustrated in FIG. 1 removed.
Figure 8:
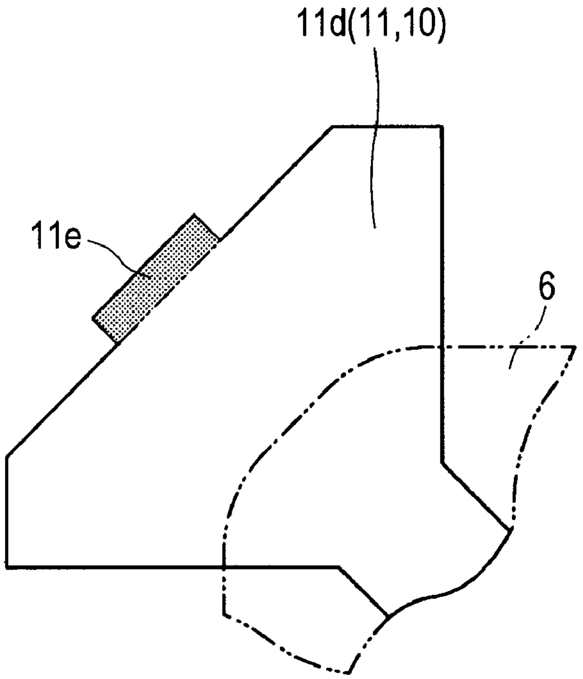
FIG. 8 is an enlarged plan view of the C part in FIG. 7.
Figure 9:
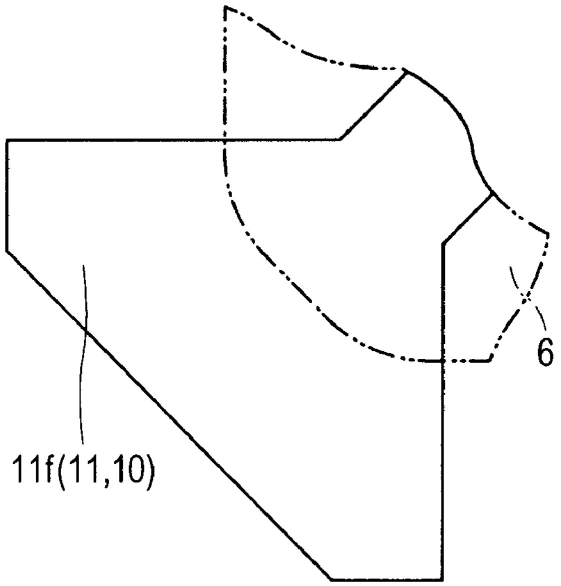
FIG. 9 is an enlarged plan view of the D part in FIG. 7.

In the description of this embodiment, a case where the invention is applied to QFN will be taken as an example of a semiconductor device. The QFN is a type of semiconductor device, concretely examined by the present inventors, in which part of a hanging lead is exposed outside a corner portion of sealing resin in a square planar shape. FIG. 1 is a top view of a semiconductor device in this embodiment; FIG. 2 is a bottom view of the semiconductor device illustrated in FIG. 1; FIG. 3 is a sectional view taken along line A-A of FIG. 1; and FIG. 4 is a sectional view taken along line B-B of FIG. 1. FIG. 5 is an enlarged sectional view illustrating a mounting structure obtained by mounting the semiconductor device illustrated in FIG. 3 over a mounting board; and FIG. 6 is an enlarged sectional view illustrating a mounting structure obtained by mounting the semiconductor device illustrated in FIG. 4 over a mounting board. FIG. 7 is a plan view illustrating the internal structure of a semiconductor device with the sealing resin illustrated in FIG. 1 removed. FIG. 8 is an enlarged plan view of the C part in FIG. 7 and FIG. 9 is an enlarged plan view of the D part in FIG. 7.

<Semiconductor Device>

First, description will be given to the configuration of QFN (semiconductor device) 1 in this embodiment with reference to FIG. 1 to FIG. 9. As illustrated in FIG. 1 to FIG. 7, the QFN 1 in this embodiment includes: a die pad 2 (Refer to FIG. 3 and FIG. 7); and a semiconductor chip 3 (Refer to FIG. 3 and FIG. 7) mounted over the die pad 2 with a die bond material 7 (Refer to FIG. 3 and FIG. 7) in between. Further, the QFN 1 includes: multiple leads 4 (Refer to FIG. 3 and FIG. 7) arranged around the semiconductor chip 3; and multiple wires 5 (Refer to FIG. 3 and FIG. 7) respectively electrically coupling together multiple electrode pads 3*c* (Refer to FIG. 3 and FIG. 7) of the semiconductor chip 3 and multiple leads 4. Further, the QFN 1 includes sealing resin 6 (Refer to FIG. 3 and FIG. 7) sealing the semiconductor chip 3, wires 5, and leads 4. The die pad 2 is coupled with multiple hanging leads 10 (Refer to FIG. 4 and FIG. 7).

<External Structure>

First, description will be given to the external structure of the QFN 1. The sealing resin (sealed body) 6 illustrated in FIG. 1 is in a rectangular planar shape and in this embodiment, it is a square of, for example, 7.4 mm×7.4 mm. Specifically, each corner portion 6*d* is chamfered and chipping of the sealing resin 6 is thereby suppressed. The sealing resin 6 includes: an upper surface 6*a*; a lower surface (back surface, mounting surface) 6*b* (Refer to FIG. 2) located on the opposite side to the upper surface 6*a*; and side surfaces 6*c* positioned between the upper surface 6*a* and the lower surface 6*b*. As illustrated in FIG. 3 and FIG. 4, the side surfaces 6*c* are sloped. The thickness of the sealing resin 6 is, for example, 0.9 mm.

Each corner portion 6*d* of the sealing resin 6 includes the peripheral area of a corner that is an intersection of any two sides (two main sides) intersecting with each other of the four sides (four main sides) of the sealing resin 6. As illustrated in FIG. 1 and FIG. 2, each corner portion 6*d* of the sealing resin 6 is partly chamfered. Therefore, to be exact, the intersections of the main sides are placed outside the corner portions 6*d* of the sealing resin 6. However, since each chamfered portion is sufficiently smaller than the length of each main side, the center of each chamfered portion will be regarded as a corner of the sealing resin 6 in the description in this specification. In detail, the corner portions 6*d* are areas indicated by dot patterns in FIG. 1 and FIG. 2 and the their border is defined as follows: in the QFN 1, multiple leads 4 are arranged along each of the four sides of the sealing resin 6; and the area from each corner (the center of each chamfered portion) of the sealing resin 6 to the adjacently placed leads 4 of the leads 4 arranged along each side is defined as corner portion. When a corner portion 6*d* of the sealing resin 6 or a corner portion of a cavity is cited in the following description, it should be taken as the same semantic content as above unless it is explicitly stated that it is used as different semantic content.

In the QFN 1, as illustrated in FIG. 1 and FIG. 2, multiple leads 4 are arranged along each side (each main side) of the sealing resin 6 in a square planar shape. Each of the leads 4 is formed of metal material and in this embodiment, they are formed of, for example, copper (Cu). In detail, a plating film (not shown) composed of, for example, nickel (Ni) is formed over the surface of a base material composed of copper (Cu). In this embodiment, 13 leads 4, for example, 0.2 mm in width are arranged along each side with an arrangement pitch (center line-to-center line distance) of 0.5 mm. The thickness of each lead 4 is, for example, 0.2 mm.

The lower surface of each of the leads 4 is exposed from the sealing resin 6 in the lower surface 6*b* of the sealing resin 6. (This lower surface includes the lower surface of each inner lead 4*a* and the lower surface of each outer lead 4*b* illustrated in FIG. 3.) Part (outer lead 4*b*) of each of the leads 4 is exposed also from a side surface 6*c* of the sealing resin 6. In detail, as illustrated in FIG. 3, part (outer lead 4*b*) of each of the leads 4 formed along each side of the sealing resin 6 is protruded outward from a side surface 6*c* (side) of the sealing resin 6. In this embodiment, they are protruded outward by, for example, 0.3 mm or so from a side surface 6*c* of the sealing resin 6. The leads 4 are external coupling terminals (external terminals) used when the QFN 1 is mounted over the mounting board 20 illustrated in FIG. 5. They are electrically coupled with multiple lands (terminals) 21 formed in the mounting surface of the mounting board 20 through joining material such as solder material 22. For this reason, the following can be implemented by exposing the leads 4 from the side surfaces 6*c* as well as the lower surface 6*b* of the sealing resin 6: the solder material 22 can be let to wet up to the outer lead 4*b* of each lead 4 as illustrated in FIG. 5 and thus the mounting strength of the leads 4 can be enhanced. As a result, it is possible to enhance the reliability of the electrical coupling between the QFN 1 and the mounting board 20. As illustrated in FIG. 1 to FIG. 3, the following measure is taken to enhance the quality of coupling (wettability) between the leads 4 and the solder material (joining material) 22 (Refer to FIG. 5) at the time of mounting: a face plating film 4*c* composed of, for example, solder is formed over the surface of the exposed portion (and the lower surface, upper surface, and side surfaces of each outer lead 4*b*) of each of the leads 4. This makes it possible to further enhance the wettability of the solder material 22 at the time of mounting.

When an inner lead 4*a* and an outer lead 4*b* are distinguished from each other in the description in this specification, the border between them is defined as follows: in each lead 4 illustrated in FIG. 3, part of the lead 4 whose upper surface is exposed from the sealing resin 6 is taken as an outer lead 4*b* and the other part (part whose upper surface is sealed with the sealing resin 6) is taken as an inner lead 4*a*.

As illustrated in FIG. 2, the lower surface 2*b* of the die pad (chip placement portion, tab) 2 is exposed from the sealing resin 6 in the lower surface 6*b* of the sealing resin 6. That is, the QFN 1 is a die pad exposed-type (tab exposed-type) semiconductor device. The die pad 2 is formed of a metal material higher in thermal conductivity than the sealing resin 6 and in this embodiment, it is formed of, for example, copper (Cu). Specifically, a plating film (not shown) formed of, for example, nickel (Ni) is formed over the surface of a base material formed of copper (Cu). In the die pad exposed-type semiconductor device, as mentioned above, the metal member (die pad 2) of, for example, copper (Cu) higher in thermal conductivity than the sealing resin 6 is exposed. As a result, the heat radiation performance of the package can be enhanced as compared with semiconductor devices with their die pad 2 not exposed. When the QFN 1 is mounted over the mounting board 20 illustrated in FIG. 5, the lower surface 2*b* of the die pad 2 and a terminal 23 of the mounting board 20 are coupled together through, for example, solder material (joining material) 24. This makes it possible to more efficiently radiate heat produced in the QFN 1 to the mounting board 20 side. The terminal 23 illustrated in FIG. 5 may be a terminal for heat radiation not electrically coupled with the semiconductor chip 3. When it is electrically coupled with the lower surface 3*b* of the semiconductor chip 3, however, it can be used as, for example, an electrode terminal that supplies power supply potential or reference potential to the semiconductor chip 3. When the lower surface 2*b* of the die pad 2 is coupled to the terminal 23 of the mounting board 20 as illustrated in FIG. 5, it is desirable to take the following measure: a face plating film 2*c* formed of, for example, solder is formed over the lower surface 2*b* of the die pad 2 as illustrated in FIG. 3. Thus the quality of coupling (wettability) between the lower surface 2*b* of the die pad 2 and the solder material (joining material) 24 can be enhanced.

In the QFN 1, as illustrated FIG. 1 and FIG. 2, the hanging leads 10 are partly exposed from the sealing resin 6 outside the corner portions 6*d* of the sealing resin 6. Specifically, as illustrated in FIG. 4, one end of each of the hanging leads 10 is coupled to (formed integrally with) the die pad 2 and the other end (exposed portion 11) is exposed from the sealing resin 6. Since the hanging leads 10 are formed integrally with the die pad 2, they, including the exposed portions (fins, corner leads) 11, are formed of the same metal material as that of the die pad 2. In this embodiment, the hanging leads are obtained by forming a plating film (not shown) formed of, for example, nickel (Ni) over the surface of a base material formed of copper (Cu). As the result of the hanging leads 10 being partly exposed from the sealing resin 6, the following can be implemented when the QFN 1 is mounted over the mounting board 20 illustrated in FIG. 6: the exposed portions 11 can be joined with multiple lands (terminals) 25 formed in the mounting surface of the mounting board 20 through joining material such as solder material 26. This makes it possible to enhance the mounting strength of the QFN 1. Further, by letting the solder material 26 wet up to the entire exposed surfaces (lower surfaces, upper surfaces, and side surfaces) of the exposed portions 11 as illustrated in FIG. 6, the mounting strength of the exposed portions 11 can be further enhanced. In this embodiment, the following measure is taken to enhance the quality of coupling (wettability) between the exposed surfaces of the exposed portions 11 and the solder material (joining material) 26: a face plating film 11*c* formed of, for example, solder is formed over the exposed surfaces of the exposed portions 11 as illustrated in FIG. 4.

<Internal Structure>

Description will be given to the internal structure of the QFN 1. As illustrated in FIG. 7, the upper surface (chip placement surface) 2*a* of the die pad 2 is in a square planar shape. In this embodiment, it is a square of, for example, 6.1 mm×6.1 mm. The outer edge portion of the die pad 2 is etched from the lower surface 2*b* side. The lower surface 2*b* of the die pad 2, exposed from the sealing resin 6, illustrated in FIG. 2 is of a square with outer dimensions of, for example, 5.9 mm×5.9 mm. In the upper surface 2*a* of the die pad 2, there is provided a chip placement area 2*d* in a square planar shape (Refer to FIG. 3 and FIG. 4). (This chip placement area is an area overlapping with the lower surface 3*b* of the semiconductor chip 3). In this embodiment, the outer dimensions (planar dimensions) of the die pad 2 are larger than the outer dimensions of the semiconductor chip 3 (the planar dimensions of the chip placement area 2*d* illustrated in FIG. 3 and FIG. 4). In this embodiment, for example, the semiconductor chip 3 is of a square with outer dimensions (the planar dimensions of the chip placement area 2*d* illustrated in FIG. 3 FIG. 4) of approximately 5 mm×5 mm. As mentioned above, the semiconductor chip 3 is placed over the die pad 2 having an area larger than the outer dimensions thereof and the lower surface 2*b* of the die pad 2 is exposed from the sealing resin 6. The heat radiation performance can be thereby enhanced.

The thickness of the die pad 2 is, for example, 0.2 mm similarly to, for example, the leads 4. In this embodiment, as illustrated in FIG. 3, the edge portion of the die pad 2 is half etched from the lower surface 2*b*. The half etched edge portion is sealed with the sealing resin 6 also on the lower surface side. The above thickness of the die pad 2 is the thickness of its area that is not half etched and the half etched edge portion is, for example, 0.1 mm in thickness. Half etching the edge portion of the die pad 2 as mentioned above makes it possible to prevent the die pad 2 from falling off from the sealing resin 6. This half etching is carried out from the lower surface 2*b* toward the upper surface 2*a*. In this embodiment, the half etched portion is formed to an intermediate position between the upper surface 2*a* and the lower surface 2*b* (for example, a position at a distance of 0.1 mm from the upper surface).

The semiconductor chip 3 is mounted over the chip placement area 2*d* of the die pad 2. In this embodiment, the semiconductor chip 3 is mounted in the center of the die pad 2. The semiconductor chip 3 is mounted over the chip placement area 2*d* through die bond material (adhesive) 7 with its lower surface 3*b* opposed to the upper surface 2*a* of the die pad 2. That is, it is mounted by a so-called face-up mounting method, in which the surface (lower surface 3*b*) opposite the upper surface (main surface) 3*a* where the multiple electrode pads 3*c* are formed is opposed to the chip placement surface (upper surface 2*a*). This die bond material 7 is adhesive used to die bond the semiconductor chip 3 and in this embodiment, a die bond material provided by, for example, including metal particles composed of silver (Ag) or the like in epoxy thermosetting resin is used.

As illustrated in FIG. 7, the semiconductor chip 3 mounted over the die pad 2 is in a square planar shape. In this embodiment, as mentioned above, it is a square of, for example, approximately 5 mm×5 mm. As illustrated in FIG. 3, the semiconductor chip 3 includes: an upper surface (main surface, front surface) 3*a*; a lower surface (main surface, back surface) 3*b* on the opposite side to the upper surface 3*a*; and side surfaces located between the upper surface 3*a* and the lower surface 3*b*.

As illustrated in FIG. 3 and FIG. 7, the electrode pads (bonding pads) 3*c* are formed in the upper surface 3*a* of the semiconductor chip 3 and in this embodiment, multiple electrode pads 3*c* are formed along each side of the upper surface 3*a*. Though not shown in the drawings, multiple semiconductor elements (circuit elements) are formed in the main surface of the semiconductor chip 3. (Specifically, this main surface is a semiconductor element formation region provided in the upper surface of the base material (semiconductor substrate) of the semiconductor chip 3.) The electrode pads 3*c* are electrically coupled to the semiconductor elements through wiring (not shown) formed in a wiring layer arranged inside the semiconductor chip 3 (specifically, between the upper surface 3*a* and the semiconductor element formation region, not shown).

The semiconductor chip 3 (specifically, the base material of the semiconductor chip 3) is formed of, for example, silicon (Si). An insulating film covering the base material and wiring of the semiconductor chip 3 is formed in the upper surface 3*a*. The surface of each of the electrode pads 3*c* is exposed from the insulating film in an opening formed in the insulating film.

The electrode pads 3*c* are formed of metal and in this embodiment, they are formed of, for example, aluminum (Al). A plating film is formed over the surface of each electrode pad 3*c* and in this embodiment, it is of a multilayer structure in which, for example, a gold (Au) film is formed with a nickel (Ni) film in between. Covering the surface of each electrode pad 3*c* with the nickel film makes it possible to suppress corrosion (contamination) of each electrode pad 3*c*.

As illustrated in FIG. 7, multiple leads 4 formed of, for example, copper (Cu) similarly to the die pad 2 are arranged around the semiconductor chip 3 (specifically, around the die pad 2). The electrode pads (bonding pads) 3*c* formed in the upper surface 3*a* of the semiconductor chip 3 are respectively electrically coupled with leads 4 (inner leads 4*a*) located inside the sealing resin 6 through multiple wires (conductive members) 5. The wires 5 are formed of, for example, gold (Au) and part of each wire 5 (for example, one end) is joined to an electrode pad 3*c* and another part (for example, the other end) is joined to the bonding area of an inner lead 4*a*. Though not shown in the drawings, a plating film is formed over the surface of the bonding area of each inner lead 4*a* (specifically, the surface of the plating film formed of nickel (Ni)). The plating film is formed of, for example, silver (Ag) or gold (Au). Forming the plating film formed of silver (Ag) or gold (Au) over the surface of the bonding area of each inner lead 4*a* makes it possible to enhance the strength of junction with a wire 5 formed of gold (Au).

As illustrated in FIG. 7, the die pad 2 is coupled (jointed) with multiple hanging leads 10. One end of each of the hanging leads 10 is coupled with a corner portion (corner) of the die pad 2. The other end of each of the hanging leads 10 is extended toward a corner portion 6*d* (Refer to FIG. 1) of the sealing resin 6 and is exposed from the sealing resin 6 outside the corner portion 6*d*.

Extending each hanging lead 10 toward a corner portion 6*d* (Refer to FIG. 1) of the sealing resin 6 makes it possible to arrange it without interfering with the arrangement of the leads 4 arranged along each side (main side) of the sealing resin 6. Therefore, it is possible to increase the number of leads 4, that is, the number of terminals of the QFN 1.

As illustrated in FIG. 4, the sealed portion 12 of each hanging lead 10 that couples the die pad 2 and an exposed portion 11 together is half etched from the lower surface side. The lower surface side is also sealed with the sealing resin 6. This makes it possible to firmly fix the hanging leads 10 and the sealing resin 6 together. Therefore, it is possible to prevent a hanging lead 10 from falling off from the sealing resin 6.

The width of each exposed portion 11 illustrated in FIG. 7 is larger than the width of each sealed portion 12. In this embodiment, the width of each sealed portion 12 is, for example, 0.2 mm. Meanwhile, the width of the widest portion of each exposed portion 11 in a fan (substantially trapezoidal) planar shape is approximately 0.8 mm. Making the width of each exposed portion 11 larger as mentioned above makes it possible to implement the following when the QFN 1 is mounted over the mounting board 20 illustrated in FIG. 6: the area of junction between each exposed portion 11 and the solder material 26 can be increased. As a result, the mounting strength of the QFN 1 can be enhanced. Meanwhile, it is desirable that the width of each sealed portion 12 should be reduced from the viewpoint of arranging a large number of leads 4 as illustrated in FIG. 7. For this reason, the width of each sealed portion 12 is reduced to the extent that strength sufficient to prevent breaking during a manufacturing process or after completion can be ensured.

In this embodiment, the exposed portions 11 are respectively formed outside the four corner portions 6*d* (Refer to FIG. 1) of the sealing resin 6. One of the four exposed portions 11 is different in shape from the other three exposed portions 11. In the exposed portion 11*d* illustrated in FIG. 8, specifically, a protruded portion 11*e* (portion marked with a dot pattern in FIG. 8) is formed on the side on the opposite side opposed to the sealing resin 6. The protruded portion 11*e* illustrated in FIG. 8 is not formed in the other three exposed portions 11*f* (Refer to FIG. 9). Though detailed description will be given later, the gate portion of a molding die is coupled to the exposed portion 11*d* at a molding step in a manufacturing process for the QFN 1. The protruded portion 11*e* is formed because of a manufacturing method for preventing unwanted resin (resin flash) from being formed on the surface (upper surface) of the exposed portion 11*d* placed at the gate portion at the molding step.

<Manufacturing Process for Semiconductor Device>

Figure 10:
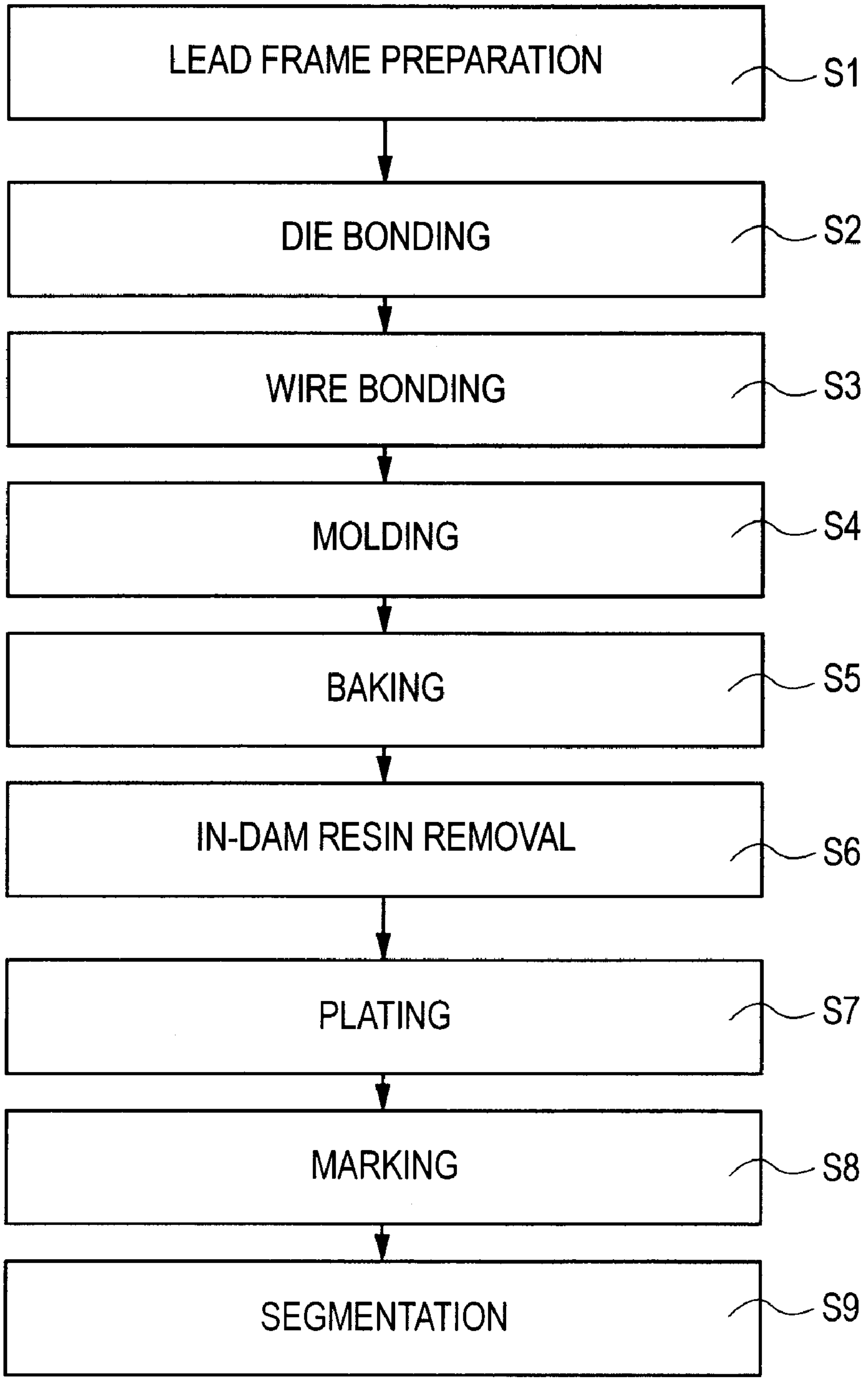
FIG. 10 is an explanatory drawing illustrating the flow of assembly of a semiconductor device in an embodiment.

Description will be given to a manufacturing process for the QFN 1 illustrated in FIG. 1 to FIG. 7. The QFN 1 in this embodiment is manufactured in accordance with the assembling flow illustrated in FIG. 10. FIG. 10 is an explanatory drawing illustrating the flow of assembly of the semiconductor device in this embodiment. Detailed description will be given to each step with reference to FIG. 11 to FIG. 38.

1. Lead Frame Preparation Step

Figure 11:
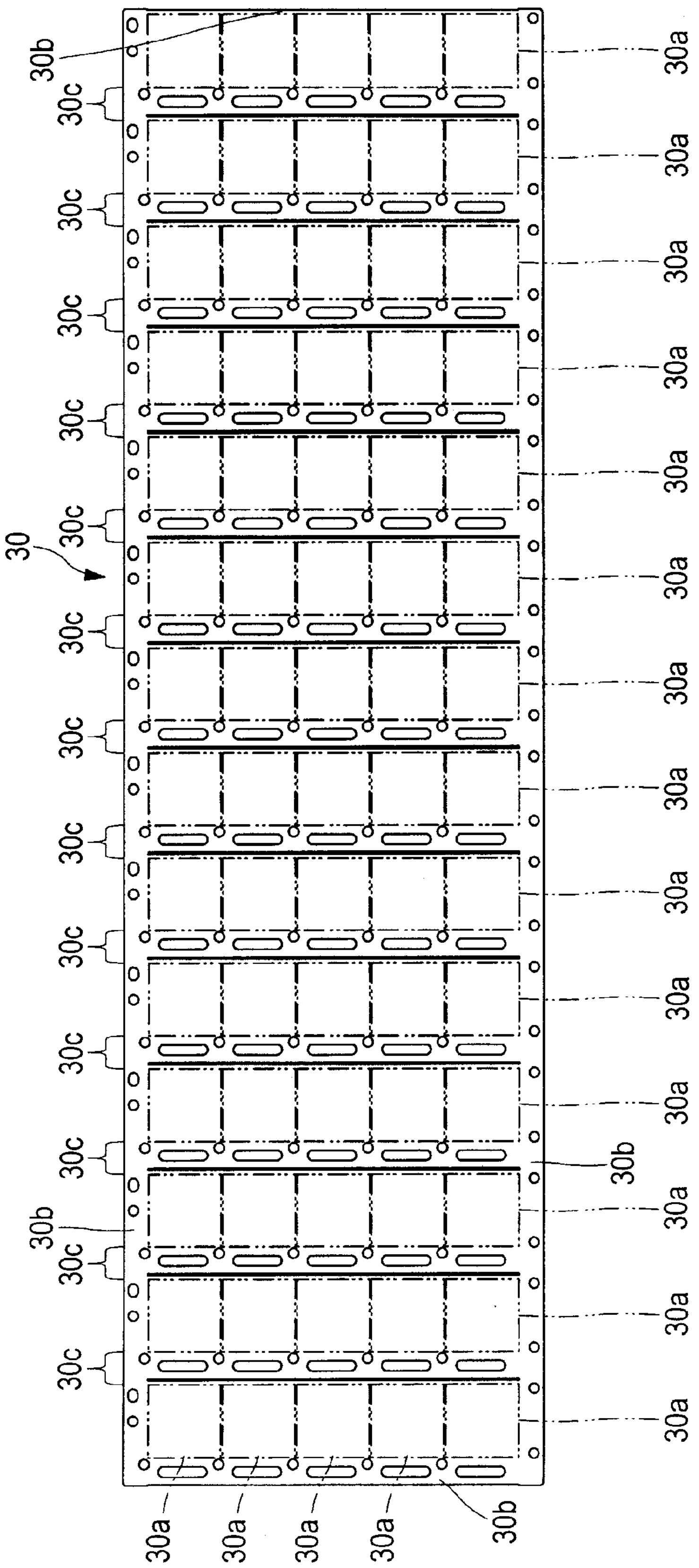
FIG. 11 is a plan view illustrating the overall structure of a lead frame provided at a lead frame preparation step.
Figure 12:
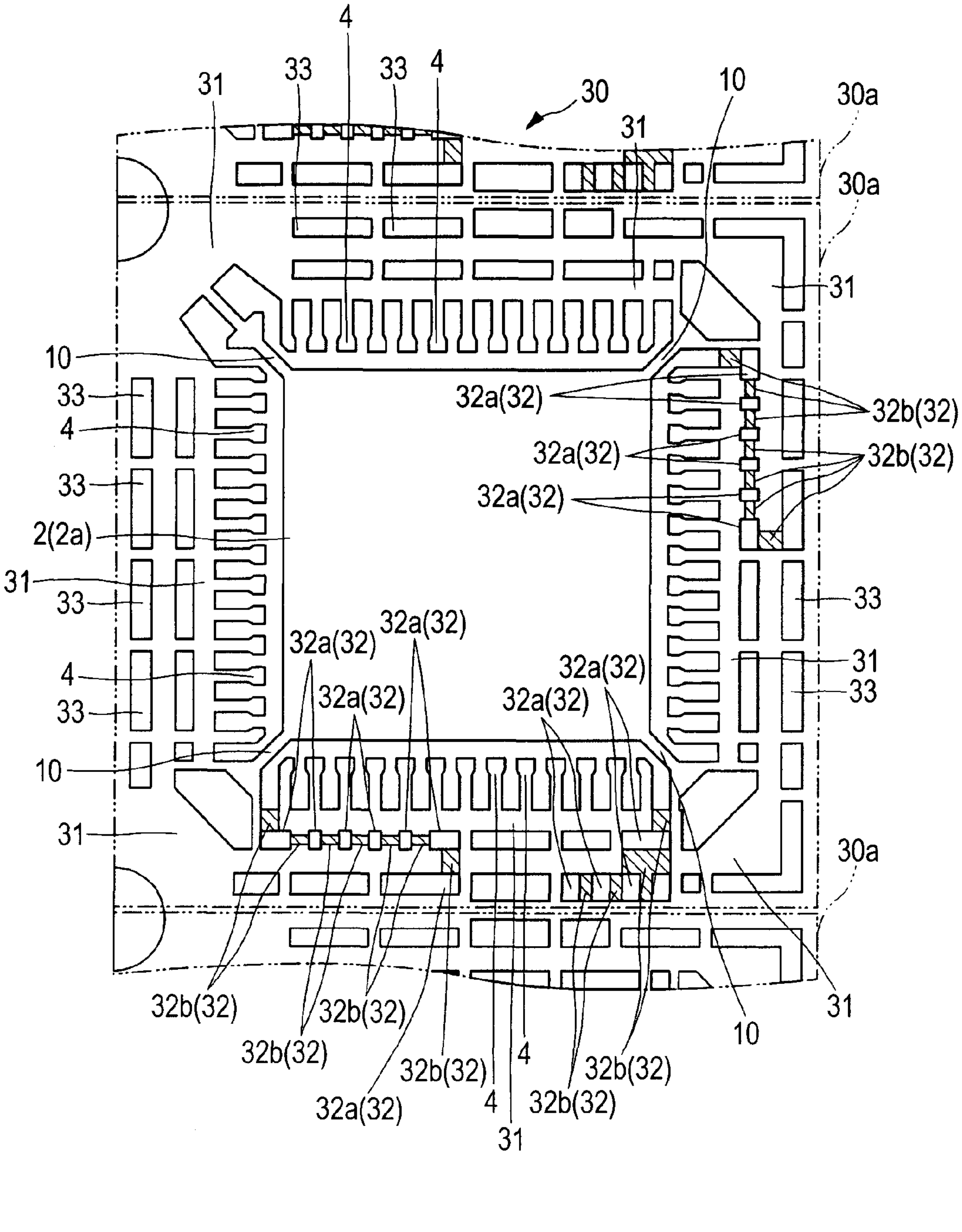
FIG. 12 is an enlarged plan view of the vicinity of one product formation region of the multiple product formation regions illustrated in FIG. 11.
Figure 13:
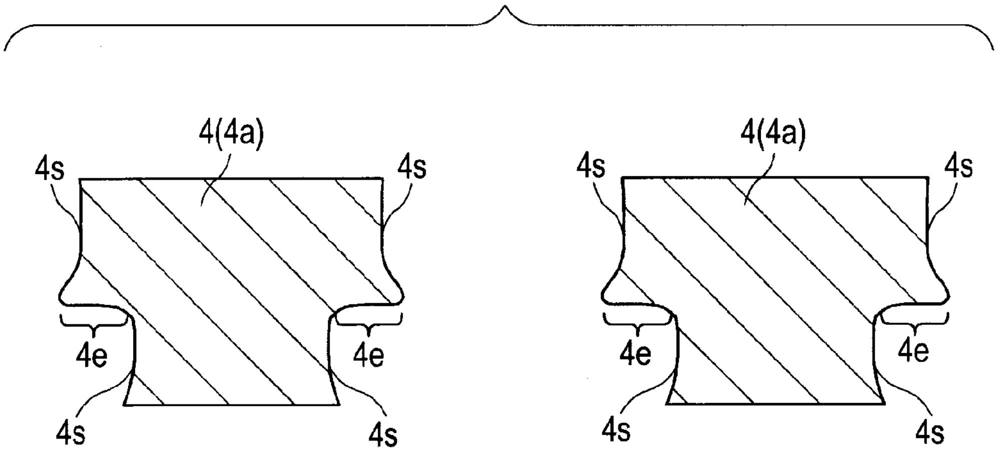
FIG. 13 is a sectional view illustrating the cross-sectional shape of the tip portions of inner leads obtained after a lead frame is etched.
Figure 14:
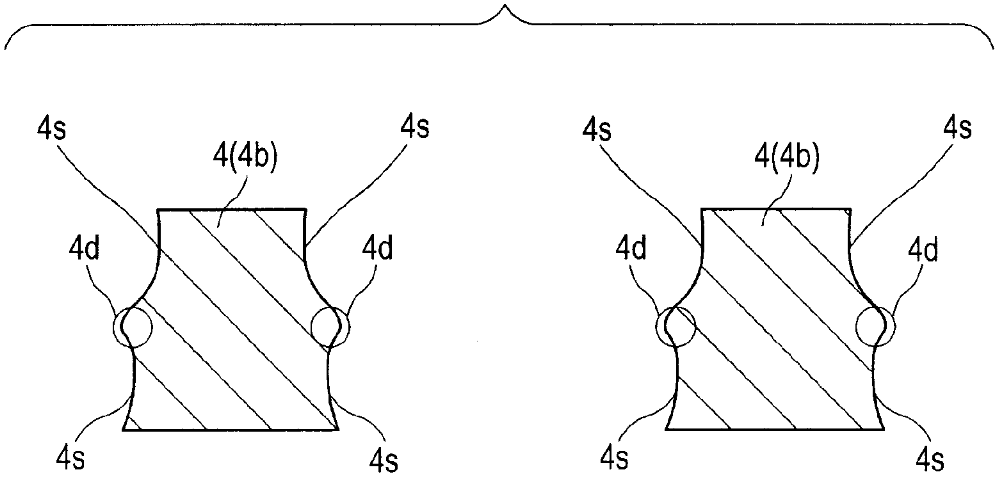
FIG. 14 is a sectional view illustrating the cross-sectional shape of the outer lead portions of the leads illustrated in FIG. 13.
Figure 15:
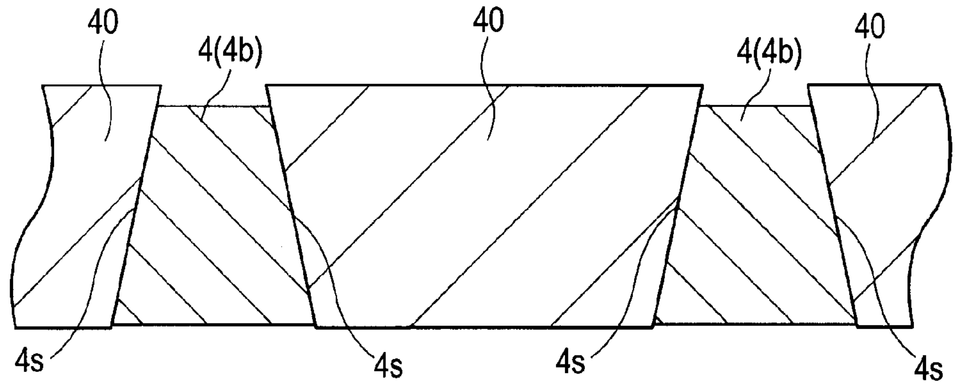
FIG. 15 is a sectional view illustrating a state obtained by cutting the side surfaces of the leads illustrated in FIG. 14 with a punch.
Figure 16:
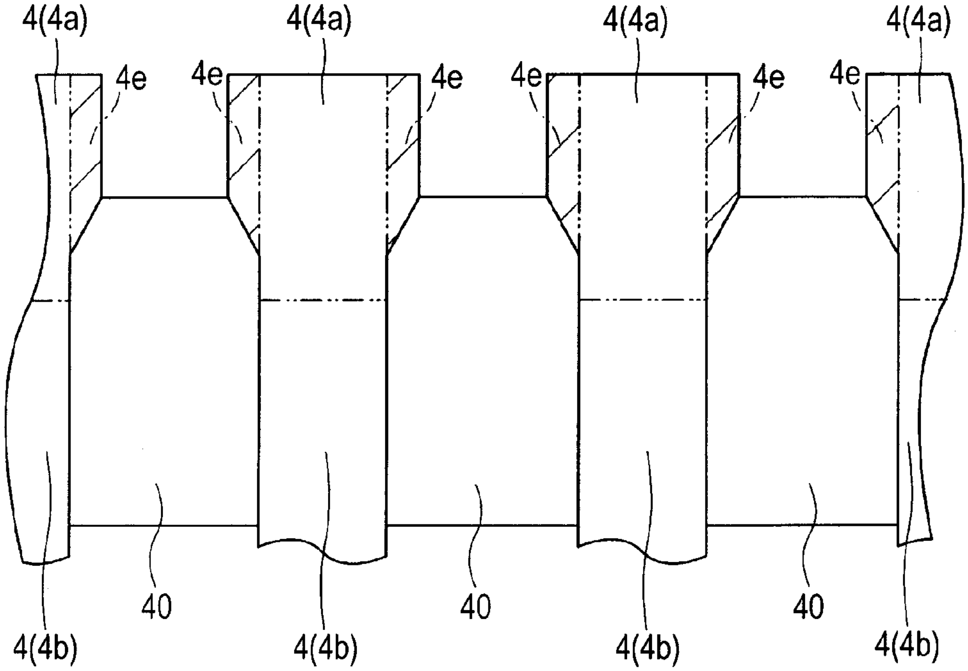
FIG. 16 is an enlarged plan view illustrating the positional relation between leads and a punch as viewed in a plane.

FIG. 11 is a plan view illustrating the overall structure of a lead frame provided at the lead frame preparation step; and FIG. 12 is an enlarged plan view of the vicinity of one product formation region of the multiple product formation regions illustrated in FIG. 11. FIG. 13 is a sectional view illustrating the cross-sectional shape of the tip portions of inner leads after the lead frame is etched; FIG. 14 is a sectional view illustrating the cross-sectional shape of the outer lead portions of the leads illustrated in FIG. 13; and FIG. 15 is a sectional view illustrating a state in which the side surfaces of the leads illustrated in FIG. 14 are cut with a punch. FIG. 16 is an enlarged plan view illustrating the positional relation between leads and a punch as viewed in a plane.

At the lead frame preparation step (S1) shown in FIG. 10, the lead frame 30 illustrated in FIG. 11 is provided. The lead frame 30 used in this embodiment has multiple product formation regions 30*a* inside a frame portion (frame body) 30*b*. In this embodiment, as illustrated in FIG. 11, 14 product formation regions 30*a* are arranged in the direction of row and five product formation regions 30*a* are arranged in the direction of column. That is, 70 product formation regions 30*a* in total are arranged in a matrix pattern. The lead frame 30 is formed of metal and in this embodiment, it is formed of, for example, copper (Cu). Specifically, as mentioned above, a plating film formed of, for example, nickel (Ni) is formed over the surface of a base material formed of copper (Cu).

Runner areas 30*c* are arranged along the direction of column between product formation regions 30*a* in each row. These runner areas 30*c* are areas where a runner portion for supplying resin for sealing toward a cavity placed in each product formation region 30*a* at the molding step described later is placed.

As illustrated in FIG. 12, which is a partial enlarged view of FIG. 11, a die pad 2 is formed in the center of each product formation region 30*a*. Each die pad 2 is coupled with multiple hanging leads 10. Multiple leads 4 are formed around each die pad 2 between hanging leads 10. The multiple leads 4 are respectively coupled to a dam portion 31 placed outside the leads 4 with respect to each die pad 2. The dam portions 31 are so formed that they surround the leads 4 and are formed integrally with the frame portion 30*b* illustrated in FIG. 11.

In the lead frame 30 provided at this step, each die pad 2, multiple leads 4, and multiple hanging leads 10 are respectively jointed (coupled) with a dam portion (tie bar, frame portion) 31 and integrally formed. Specifically, each die pad 2 is coupled with multiple (four in this embodiment) hanging leads 10 that are formed integrally with the die pad 2 and the frame portion 30*b* and joint them together and is supported by the hanging leads 10. The leads 4 are jointed with dam portions 31 that are formed integrally with the leads 4 and the frame portion 30*b* and joint them together and are supported by the dam portions 31. In this embodiment, each hanging lead 10 is coupled to a corner portion of each die pad 2 in a square planar shape. Each hanging lead 10 is extended along a diagonal line of each die pad 2. In other words, each hanging lead 10 is so arranged that it is extended from a corner portion of each die pad 2 in a square planar shape toward the following corner portion: a corner portion of a cavity of a molding die used at the molding step described later. (This corner portion is equivalent to a corner portion 6*d* of the sealing resin 6 illustrated in FIG. 1.)

In the dam portions 31, multiple air vent portions 32 are formed. The air vent portions are formed of multiple hole portions (slit portions) 32*a* that penetrate the lead frame 30 and multiple groove portions 32*b* (the hatched portions in FIG. 12) that joint the hole portions 32*a* together. The hole portions 32*a* are through holes formed by etching so that they penetrate the lead frame 30; and the groove portions 32*b* are grooves formed by half etching from the upper surface side of the lead frame 30. The depth of the groove portions 32*b* is, for example, 0.1 mm. These air vent portions 32 provide exhaust passages for discharging gas (in general, air) in a cavity to outside the cavity when the sealing resin 6 illustrated in FIG. 1 is formed at the molding step described later. A more detailed structure and a preferred embodiment of the air vent portions 32 will be described later.

In the dam portions 31, multiple slit portions 33 are formed in addition to the hole portions 32*a* forming the air vent portions 32. Some of the slit portions 33 are through holes formed to reduce the burden imposed on a cutting edge (punch) when multiple leads 4 are cut at the segmentation step described later. Details of the slit portions 33 will be described later.

The lead frame 30 illustrated in FIG. 11 and FIG. 12 can be formed, for example, as described below:

First, a thin plate formed of copper (Cu) is provided and etched to form die pads 2, hanging leads 10, leads 4, and dam portions 31 in, for example, the pattern illustrated in FIG. 12.

This embodiment includes a step of half etching the lead frame 30. Specifically, the following portions are half etched from the lower surface side: the edge portion of each die pad 2 illustrated in FIG. 3; the sealed portions 12 of the hanging leads 10 illustrated in FIG. 4; and part of each lead 4 (the wide portion 4*e* at the tip of the inner lead 4*a*) illustrated in FIG. 13. Meanwhile, the groove portions 32*b* illustrated in FIG. 12 are formed by half etching the lead frame 30 from the upper surface side. In this embodiment, as mentioned above, etching is carried out from the upper and lower surfaces of the lead frame 30. Therefore, places where the hole portions 32*a* and the slit portions 33, the leads 4, the outer edge portion of each die pad 2, and the like are patterned, that is, places where so-called full etching is carried out can be simultaneously processed.

However, it was found that when full etching was carried out by etching from the upper surface and the lower surface, a problem arose. As illustrated in FIG. 14, a protruded portion 4*d* is formed in a side surface 4*s* of each lead 4. The protruded portions 4*d* are formed at the substantially intermediate portion of a side surface 4*s*. In the method of manufacturing the semiconductor device in this embodiment, the following measure is taken at the molding step described later: resin for sealing is supplied also to between leads 4 (specifically, between inner leads 4*a* and between outer leads 4*b*) to form resin (in-dam resin) there. The resin (in-dam resin) formed between outer leads 4*b* is removed by applying a laser at the in-dam resin removal step described later. This is intended to enhance the mounting strength by taking the following measure: the in-dam resin sticking to the side surfaces 4*s* of each outer lead 4*b* is removed to let the joining material such as solder material 22 illustrated in FIG. 5 wet up to the side surfaces 4*s* of each outer lead 4*b* as well. However, when a protruded portion 4*d* is formed in the side surfaces 4*s* of each outer lead 4*b* as illustrated in FIG. 14, some portion is not irradiated with a laser at the in-dam resin removal step described later. This prevents part of the resin formed on the side surfaces 4*s* of each outer lead 4*b* from being removed. As a result, the solder material 22 illustrated in FIG. 5 does not wet up to a portion of each outer lead 4*b* where the resin is left and the mounting strength cannot be sufficiently enhanced.

To cope with this, as illustrated in FIG. 15, the following measure is taken in this embodiment: the protruded portions 4*d* (Refer to FIG. 14) formed on the side surfaces 4*s* of the outer leads 4*b* are removed by etching to planarize the side surfaces 4*s* before the molding step described later. In this embodiment, the protruded portions 4*d* illustrated in FIG. 14 are removed as follows: as illustrated in FIG. 15, press work is carried out using a punch (cutting edge) 40 to cut the side surfaces 4*s*. When press work is carried out using the punch 40, the side surfaces 4*s* of each outer lead 4*b* are planarized in accordance with the side surface shape of the punch 40. Therefore, in-dam resin can be easily removed by applying a laser thereto at the in-dam resin removal step described later.

At least the protruded portions 4*d* on the side surfaces 4*s* of each outer lead 4*b* only have to be removed from the viewpoint of enhancing the mounting strength of the QFN 1 illustrated in FIG. 5. This is because the side surfaces 4*s* of the inner leads 4*a* illustrated in FIG. 13 are sealed with the sealing, resin 6 (Refer to FIG. 3) at the molding step described later. It is desirable to take the following measure from the viewpoint of preventing a lead 4 from falling off from the sealing resin 6 (Refer to FIG. 3): as illustrated in FIG. 13, part of each inner lead 4*a* is half etched from the lower surface side to form a wide portion where the area of the upper surface is larger than the area of the lower surface and these wide portions are left. In this embodiment, for this purpose, the entire side surfaces 4*s* of each lead 4 are not pressed and the punch 40 is arranged so as to avoid part (wide portion 4*e*) of each inner lead 4*a* as illustrated in FIG. 16. This makes it possible to selectively press the side surfaces of each outer lead without cutting the wide portion 4*e* of each inner lead 4*a* hatched in FIG. 16.

2. Die Bonding Step

Figure 17:
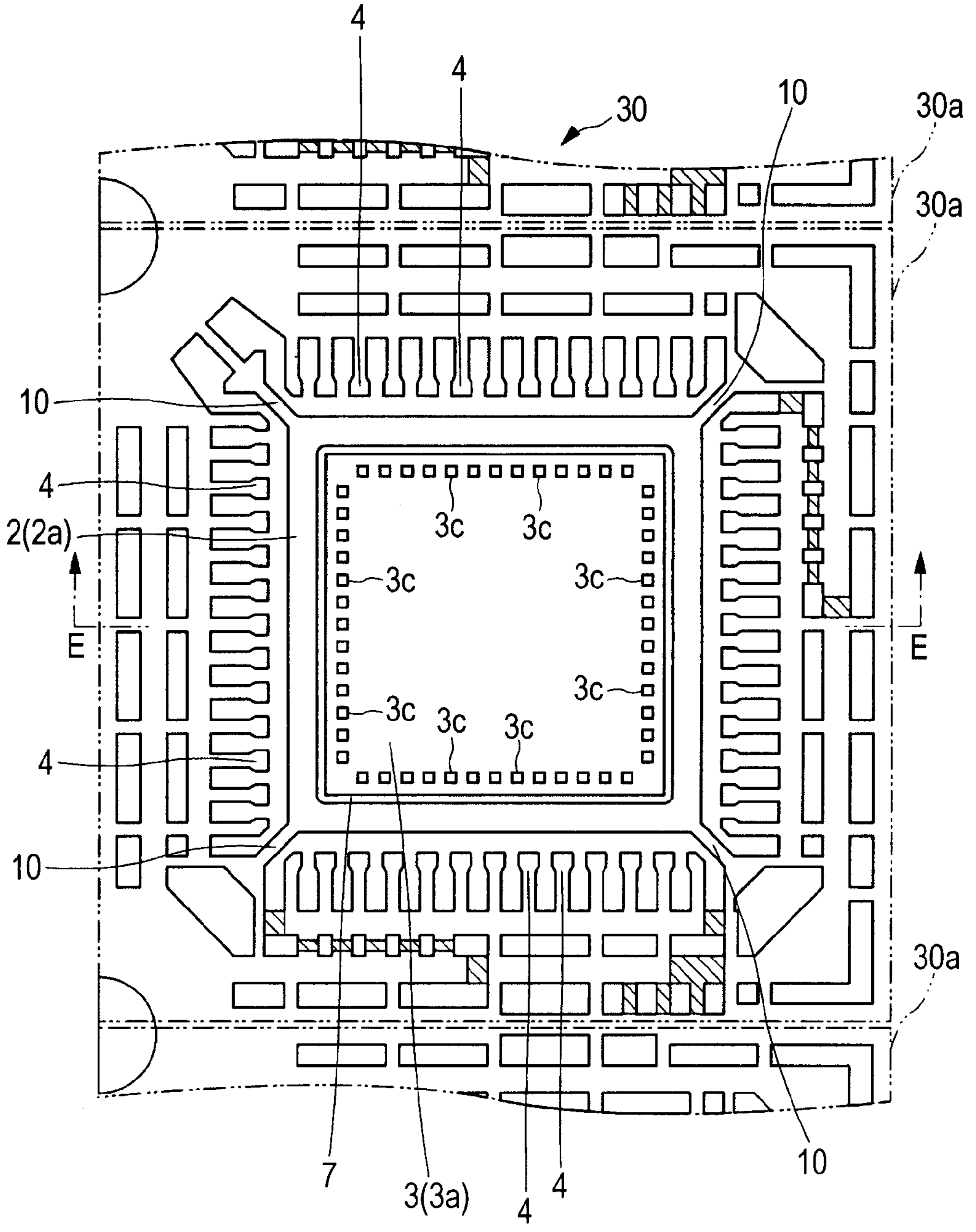
FIG. 17 is an enlarged plan view illustrating how a semiconductor chip is mounted over the die pad illustrated in FIG. 12 through bonding material.
Figure 18:
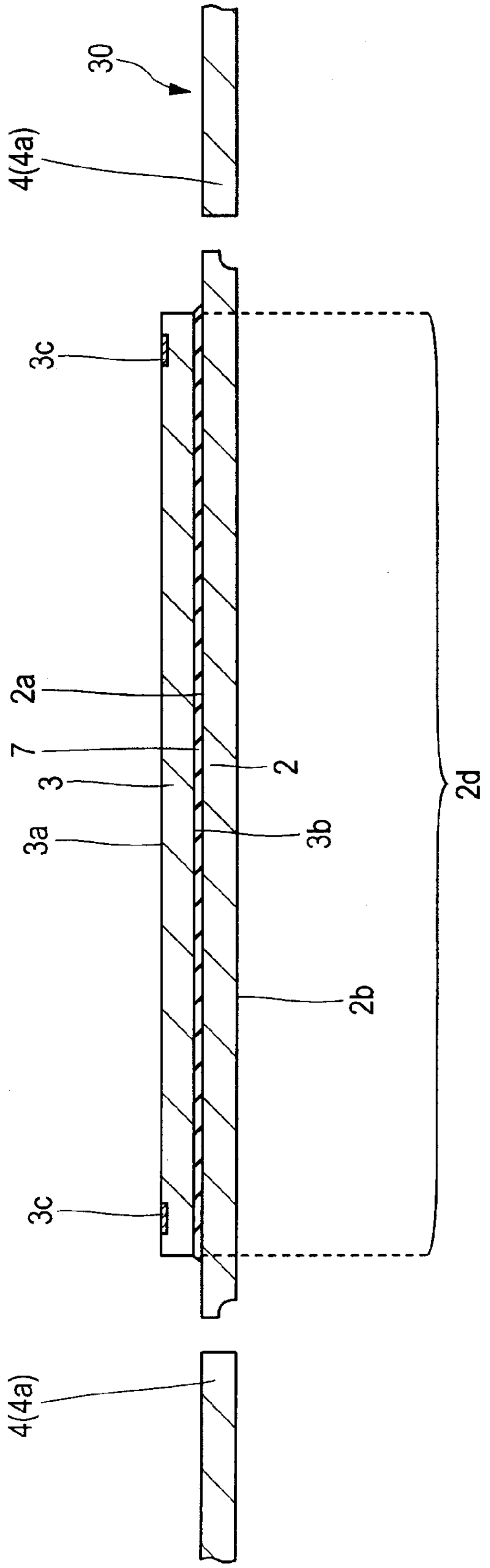
FIG. 18 is an enlarged sectional view taken along line E-E of FIG. 17.

FIG. 17 is an enlarged plan view illustrating a semiconductor chip mounted over the die pad illustrated in FIG. 12 through bonding material; and FIG. 18 is an enlarged sectional view taken along line E-E of FIG. 17.

At the die bonding step (S2) illustrated in FIG. 10, a semiconductor chip 3 is mounted over the chip placement area 2*d* of a die pad 2 through die bond material 7 as illustrated in FIG. 17 and FIG. 18. In this embodiment, it is mounted by a so-called face-up mounting method in which the semiconductor chip 3 is mounted with its lower surface 3*b* opposed to the upper surface 2*a* of the die pad 2 as illustrated in FIG. 18. (The lower surface 3*b* is the surface on the opposite side to the upper surface 3*a* where the electrode pads 3*c* are formed.) As illustrated in FIG. 17, the semiconductor chip 3 is mounted in the center of the die pad 2 so that each side of its upper surface 3*a* is placed along each side of the die pad 2.

In this embodiment, the semiconductor chip 3 is mounted with, for example, the die bond material 7 as an epoxy thermosetting resin in between. The die bond material 7 is a paste material having flowability before it is cured (thermally cured). To use paste material as the die bond material 7 as mentioned above, the following procedure is taken: the die bond material 7 is applied onto the chip placement area 2*d* and then the lower surface 3*b* of the semiconductor chip 3 is bonded to the upper surface 2*a* of the die pad 2. When the die bond material 7 is cured (for, example, heat treated) after bonding, the semiconductor chip 3 is fixed over the chip placement area 2*d* through the die bond material 7 as illustrated in FIG. 18.

In the above description of this embodiment, a case where paste material composed of thermosetting resin is used for the die bond material 7 has been taken an example. However, various modifications can be applied. For example, the following measure may be taken in place of paste material: an adhesive as a tape material (film material) having a bonding layer on both sides is stuck beforehand to the lower surface 3*b* of the semiconductor chip 3; then the semiconductor chip 3 is mounted over the chip placement area 2*d* with the tape material in between.

3. Wire Bonding Step

Figure 19:
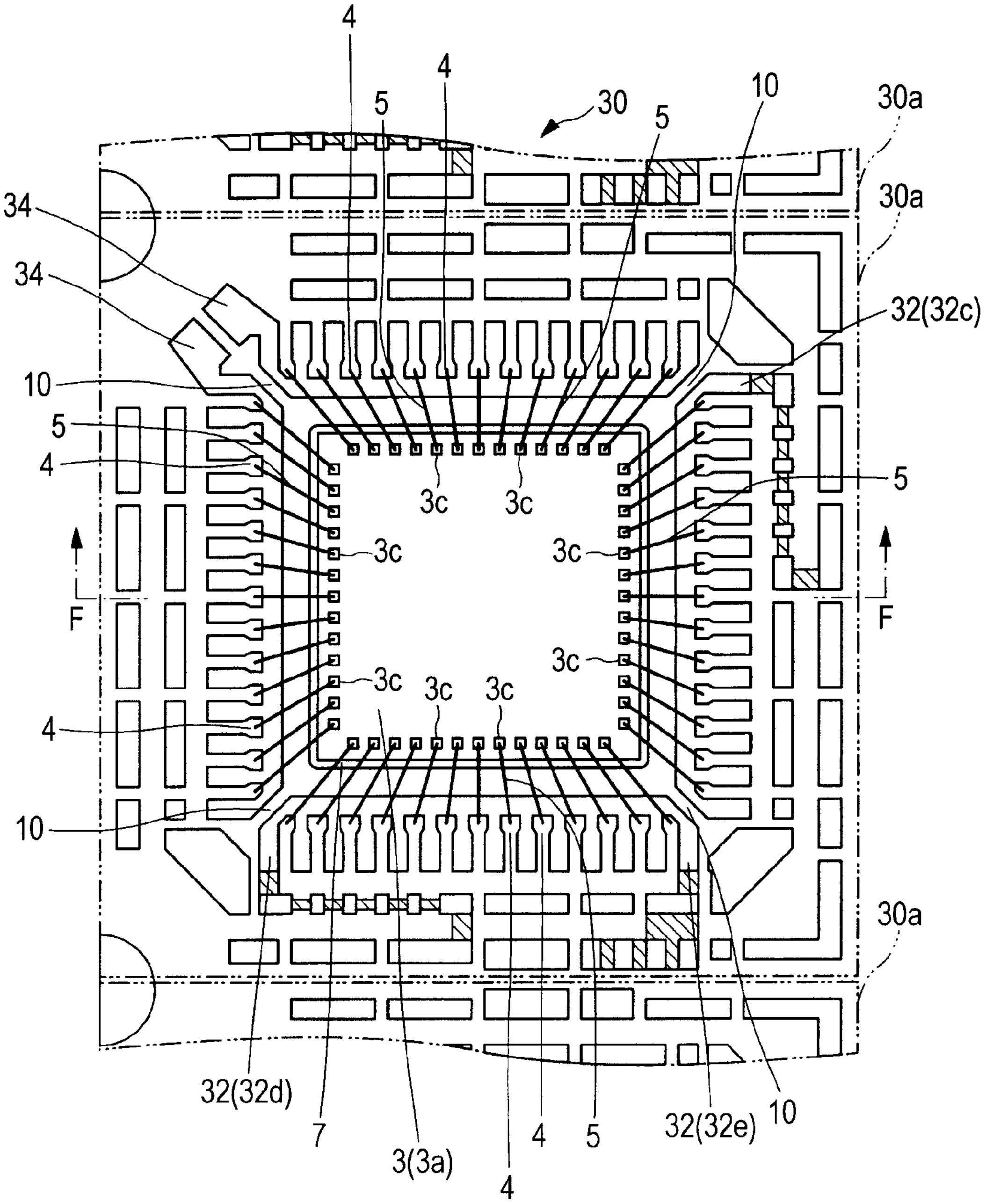
FIG. 19 is a plan view illustrating how the semiconductor chip illustrated in FIG. 17 and multiple leads are electrically coupled with each other through wires.
Figure 20:
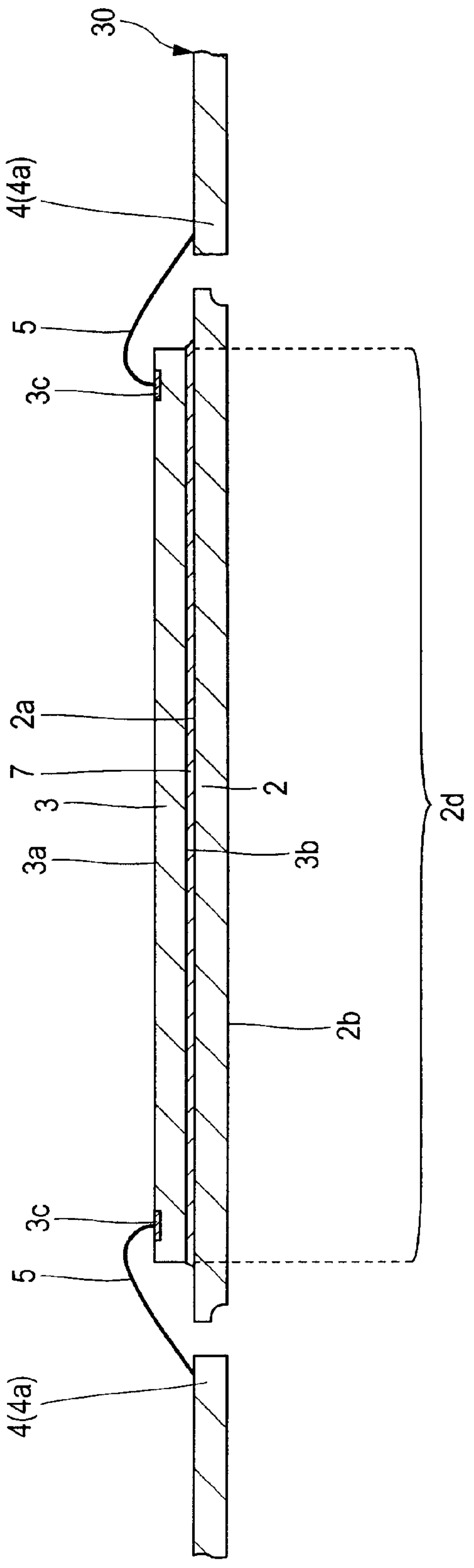
FIG. 20 is an enlarged sectional view taken along line F-F of FIG. 19.

FIG. 19 is a plan view illustrating how the semiconductor chip and leads illustrated in FIG. 17 are electrically coupled with each other through wires; and FIG. 20 is an enlarged sectional view taken along line F-F of FIG. 19.

At the wire bonding step (S3) illustrated in FIG. 10, the electrode pads 3*c* of each semiconductor chip 3 and leads 4 are respectively electrically coupled with each other through multiple wires (conductive members) 5 as illustrated in FIG. 19 and FIG. 20.

At this step, for example, a heat stage (not shown) is provided and the lead frame 30 with a semiconductor chip 3 mounted over the die pad 2 of each product formation region 30*a* is arranged over the heat stage. Then the electrode pads 3*c* of each semiconductor chip 3 and leads 4 are electrically coupled with each other through wires 5. In this embodiment, wires 5 are bonded by a so-called nail head bonding method in which a wire 5 is supplied through a capillary (not shown) and the wire 5 is joined using both ultrasonic waves and thermocompression.

On part (the bonding area of the inner lead 4*a*) of each lead 4, a plating film formed of, for example, silver (Ag) or gold (Au) is formed and part of a wire 5 is electrically coupled with the lead 4 through this plating film. The wires 5 are formed of metal and in this embodiment, they are formed of, for example, gold (Au). For this reason, the adhesion between the wires 5 and the electrode pads 3*c* can be enhanced by forming gold (Au) on the surface of each electrode pad 3*c* of each semiconductor chip 3 beforehand.

In this embodiment, the wires are bonded by so-called normal bonding. That is, part of a wire is bonded to an electrode pad 3*c* of a semiconductor chip 3 and then the other part of the wire 5 is bonded to the bonding area of a lead 4. (The bonding area of a lead 4 is the area of the upper surface of the lead 4 where a plating film is formed.)

4. Molding Step

Figure 21:
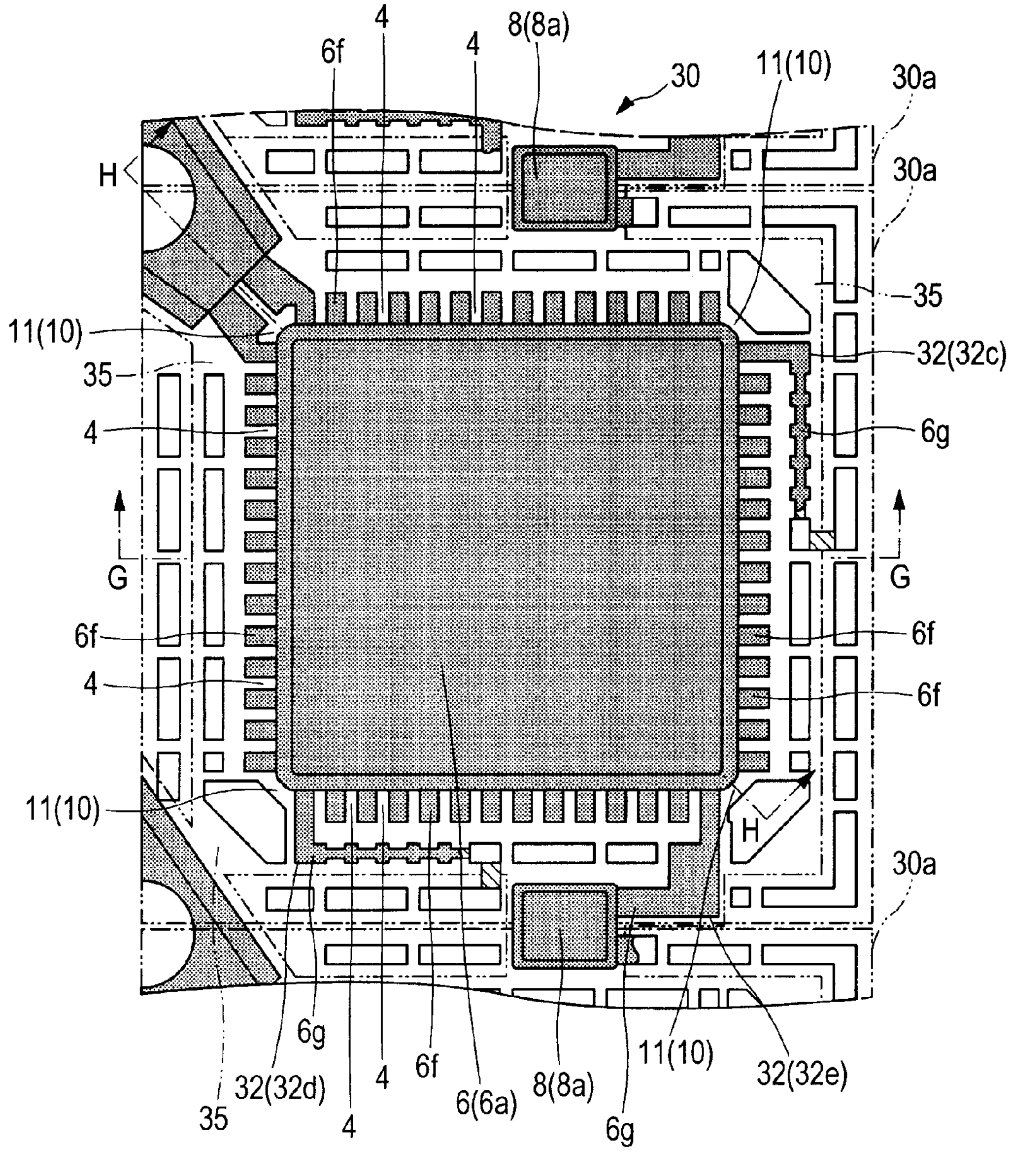
FIG. 21 is an enlarged plan view illustrating how sealing resin is formed in the product formation region of the lead frame illustrated in FIG. 19.
Figure 22:
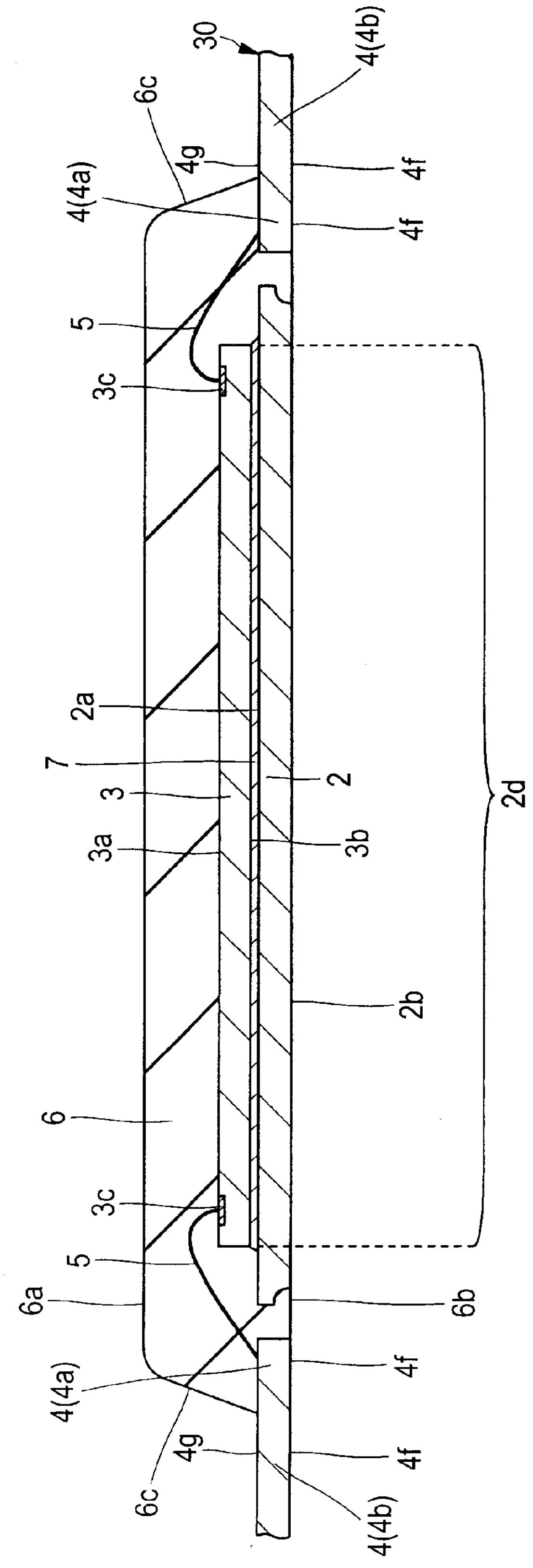
FIG. 22 is an enlarged sectional view take along line G-G of FIG. 21.

FIG. 21 is an enlarged plan view illustrating a state in which the sealing resin is formed in the product formation region of the lead frame illustrated in FIG. 19; FIG. 22 is an enlarged sectional view taken along line G-G of FIG. 21; and FIG. 23 is an enlarged sectional view taken along line H-H of FIG. 21.

Figure 23:
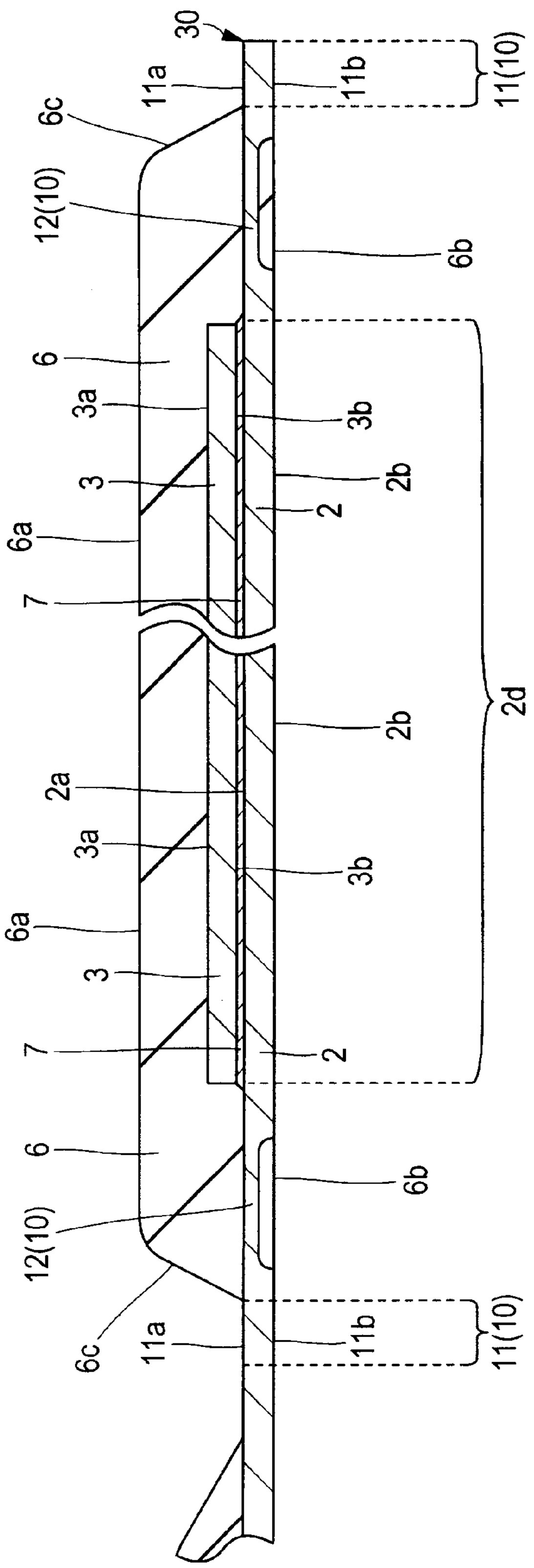
FIG. 23 is an enlarged sectional view taken along line H-H of FIG. 21.

At the molding step (S4) illustrate in FIG. 10, the sealing resin (sealed body) 6 is formed as illustrated in FIG. 21 to FIG. 23 to seal the following: the semiconductor chip 3 (Refer to FIG. 22), wires 5 (Refer to FIG. 22), die pad 2 (Refer to FIG. 22), and inner leads 4*a* (Refer to FIG. 22). In this embodiment, the sealing resin 6 is formed as illustrated in FIG. 22 and FIG. 23. That is, the lower surface 2*b* of each die pad 2 is exposed from the sealing resin 6 and the upper surface 2*a* and side surfaces of the die pad 2 are sealed. In this embodiment, the sealing resin 6 is so formed that part of each lead 4 is exposed. Specifically, as illustrated in FIG. 22, the sealing resin 6 is so formed that the lower surface 4*f* of each inner lead 4*a* and the upper surface 4*g* and lower surface 4*f* of each outer lead 4*b* are exposed. In this embodiment, the sealing resin 6 is so formed that part of each hanging lead 10 is exposed. Specifically, as illustrated in FIG. 23, the sealing resin 6 is so formed that the upper surface 11*a* and lower surface 11*b* of the exposed portion 11 of each hanging lead 10 are exposed.

<Transfer Molding>

In this embodiment, so-called transfer molding is used. In the transfer molding, the following procedure is taken: a molding die includes an upper die (upper molding die) with a cavity formed in its inner surface and a lower die (lower molding die) opposed to the upper die; the lead frame 30 illustrated in FIG. 19 and FIG. 20 is fixed between the upper die and lower die of this molding die; and in this state, softened (plasticized) thermosetting resin (resin for sealing) is pressed into the cavity and thereafter it is cured by heating.

In transfer molding, in general, a molding die with a groove for discharge air, designated as air vent portion, formed therein is used to prevent air from being left in the cavity of the molding die. When a cavity in a square planar shape is used, it is effective to form an air vent portion in a corner portion of the cavity where air is prone to be left. This is because if a void is formed in the sealing resin, the sealing resin is prone to be broken and this causes degradation in the reliability of the semiconductor device.

When a molding die with an air vent portion coupled to a corner portion of its cavity is used to carry out the molding step, part of resin for sealing is discharged together with air in the cavity from the air vent portion. Therefore, resin (a resin flash formed by resin that flowed into the air vent portion) is formed at the air vent portion. For this reason, the following takes place if it is applied to a manufacturing process for a semiconductor device like the QFN 1 in this embodiment illustrated in FIG. 1. That is, the following takes place if it is applied to a manufacturing process for a semiconductor device of such a type that part (exposed portion 11) of each hanging lead 10 is exposed outside a corner portion 6*d* of the sealing resin 6: a resin flash is formed on the upper surface 11*a* (Refer to FIG. 23) of an exposed portion 11. With a resin flash formed on an exposed portion 11, the following takes place when the QFN 1 is mounted over a mounting board 20 as illustrated in FIG. 6: even though joining material such as the solder material 26 wets up to the surface of the exposed portion 11, it cannot be joined and it is difficult to enhance the mounting strength.

A step of removing this resin flash could be carried after the molding step. However, since the strength of adhesion between the resin and the hanging leads is high, it is difficult to completely remove the resin (resin flash) formed on the surface of a lead even though a cleaning step (deflashing step) is carried out.

Consequently, the present inventors considered a method in which an air vent portion is not formed at a corner portion (area overlapping the exposed portion of a hanging lead) of a cavity and an air vent portion is formed in a lead frame. Specifically, the present inventors considered forming an air vent portion in a portion of a lead frame where a hanging lead is not formed.

The result of the consideration revealed that the following measure was effective in preventing a resin flash from being formed on a hanging lead as mentioned above: an air vent portion is formed in an area of a lead frame where a hanging lead is not formed and this air vent portion is jointed to a cavity.

However, it was found that the occurrence of resin seal failures, such as the defective shape of sealing resin, the formation of a void, and a resin leak, could not be prevented just by forming an air vent portion in a lead frame. Some examples will be taken. If the flow path in an air vent portion is too narrow, the pressure (static pressure) in a cavity becomes higher than the supply pressure of resin for sealing. Therefore, the interior of the cavity cannot be entirely filled with the resin for sealing and this causes the defective shape of the sealing resin. Air is prone to be left in the cavity and this causes the formation of a void. Meanwhile, if the flow path in an air vent portion is too wide or the length of the path in an air vent portion is too short, resin for sealing supplied into a cavity flows out of the air vent portion before it fills the interior of the cavity. This causes the defective shape of the sealing resin. If a resin leak occurs and the resin for sealing flowing out of an air vent portion leaks to outside the air vent portion, the pressure balance in the cavity is further disrupted. This causes the defective shape of sealing resin, the formation of a void, or a resin leak in multiple product formation regions.

<Molding Die Preparation Step>

Based on the result of the above consideration, hereafter, detailed description will be given to the molding step in this embodiment.

Figure 24:
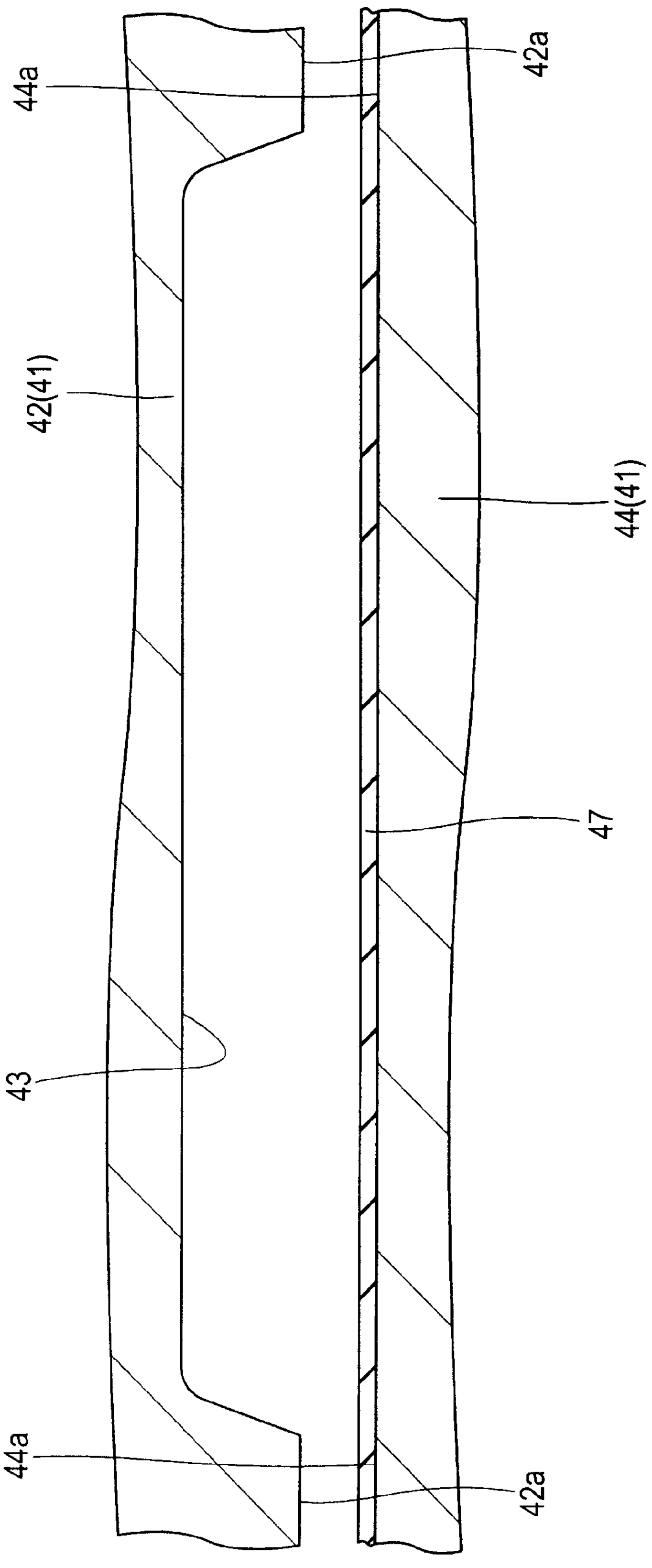
FIG. 24 is an enlarged sectional view illustrating a molding die used at a molding step.
Figure 25:
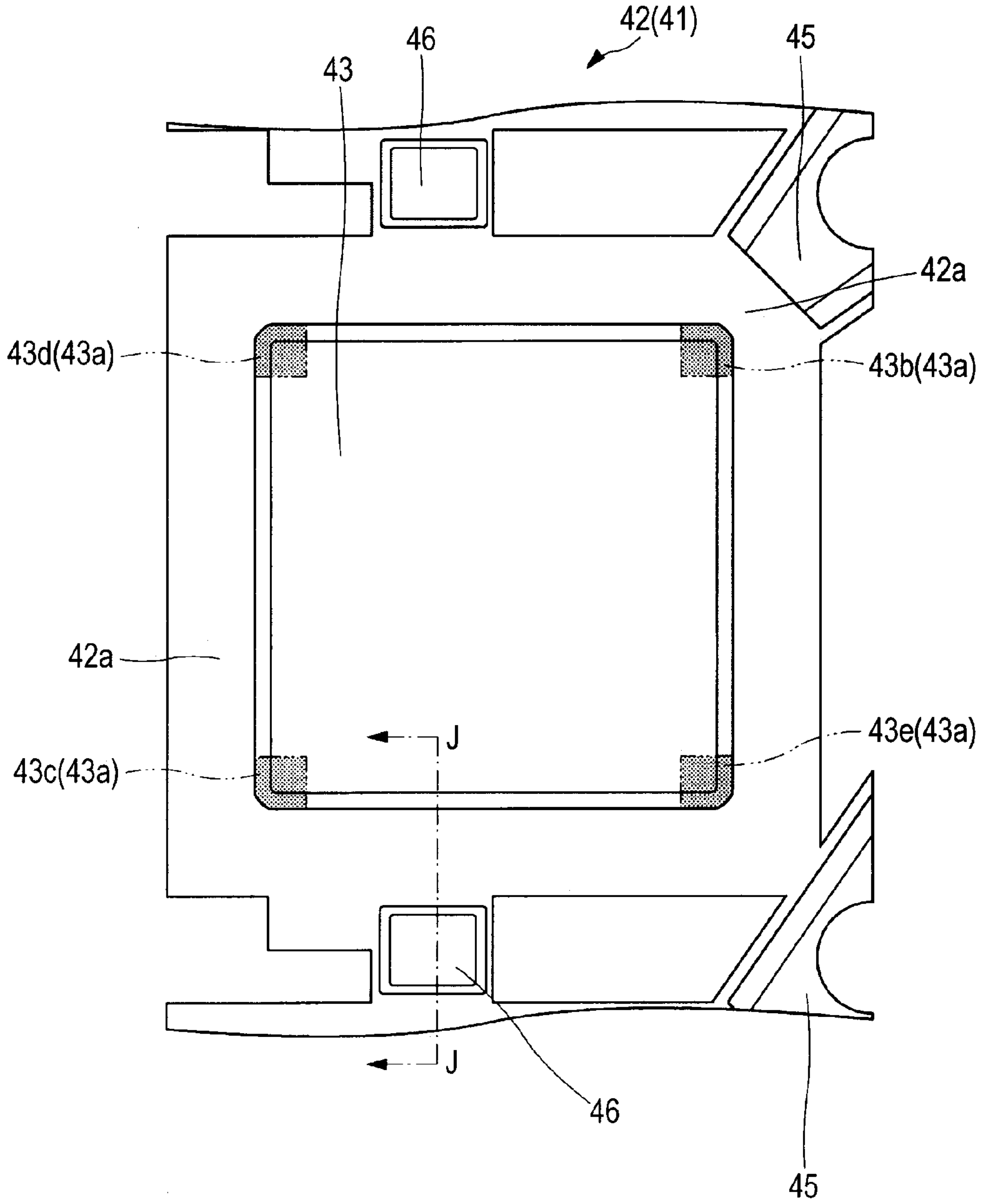
FIG. 25 is an enlarged plan view illustrating the cavity formation surface (lower surface) side of the upper die illustrated in FIG. 24.
Figure 26:
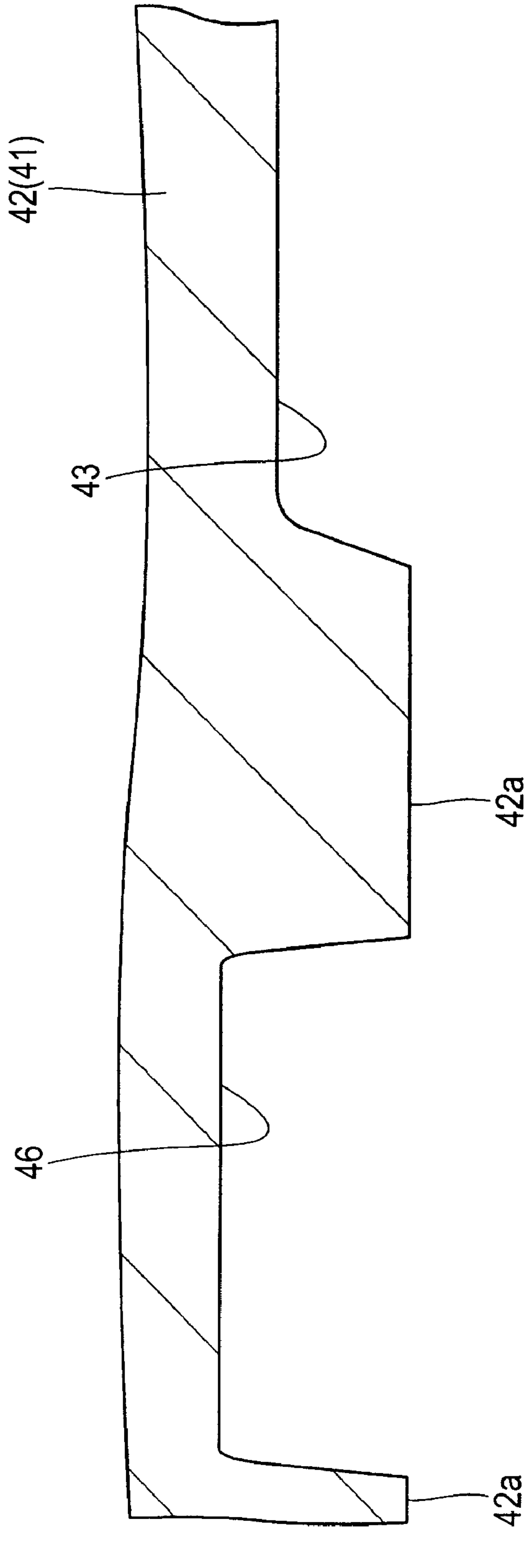
FIG. 26 is an enlarged sectional view taken along line J-J of FIG. 25.

At the molding die preparation step, the molding die 41 illustrated in FIG. 24 to FIG. 26 is provided. FIG. 24 is an enlarged sectional view illustrating the molding die used at the molding step; and FIG. 25 is an enlarged plan view illustrating the cavity formation surface (lower surface) side of the upper die illustrated in FIG. 24. FIG. 26 is an enlarged sectional view taken along line J-J of FIG. 25.

The molding die 41 includes: an upper die (first die) 42 having a die surface (first die surface, clamp surface) 42*a* and a cavity (recessed portion, first cavity) 43 formed in this die surface 42*a*; and a lower die (second die) 44 having a die surface (second die surface, clamp surface) 44*a* opposed to the die surface 42*a* of the upper die 42.

As illustrated in FIG. 25, the cavity 43 formed in the upper die 42 is in a square planar shape. A gate portion 45 is arranged outside a first corner portion 43*b* of the four corner portions 43*a* of the cavity 43.

The corner portions 43*a* of the cavity 43 are defined similarly to the corner portions 6*d* of the sealing resin 6 described with reference to FIG. 1 and FIG. 2. That is, each corner portion 43*a* of the cavity 43 includes the peripheral area of a corner that is an intersection of any two sides (two main sides) intersecting with each other of the four sides (four main sides) of the cavity 43. Each corner portion 43*a* of the cavity 43 is partly chamfered. Therefore, to be exact, the intersections of the main sides are placed outside the corner portions 43*a* of the cavity 43. However, since each chamfered portion is sufficiently smaller than the length of each main side, the center of each chamfered portion will be regarded as a corner of the cavity 43 in the description in this specification. In detail, the corner portions 43*a* are areas indicated by dot patterns in FIG. 25 and their boarder is defined as follows. In this embodiment, the upper die 42 is so placed that multiple leads 4 (Refer to FIG. 21) are arranged along each of the four sides of the cavity 43 as described later. The area from each corner (the center of each chamfered portion) of the cavity 43 to the adjacently placed leads 4 of the leads 4 (Refer to FIG. 21) arranged along each side is defined as corner portion 43*a*.

The gate portion 45 becomes a supply port for supplying resin for sealing into the cavity 43 at the sealed body formation step described later. For this reason, it is necessary to couple the gate portion 45 and the cavity 43 together. When a gate portion is formed in a molding die, the gate portion could be extended and coupled to the cavity. In this embodiment, however, the gate portion 45 and the cavity 43 are formed away from each other. In other words, the die surface 42*a* abutted against the upper surface of the lead frame 30 (Refer to FIG. 21) at the clamping step described later is arranged between the gate portion 45 and the cavity 43. As illustrated in FIG. 19, meanwhile, gate slits 34 jointed both to the gate portion 45 (Refer to FIG. 25) and to the cavity 43 (Refer to FIG. 25) are formed in the lead frame 30 in this embodiment. For this reason, even though the gate portion 45 and the cavity 43 are arranged away from each other as illustrated in FIG. 25, they can be jointed to each other through these gate slits 34 (Refer to FIG. 19). Therefore, resin for sealing can be supplied into the cavity 43. In this embodiment, the gate portion 45 and the cavity 43 are not coupled with each other in the molding die 41 (upper die 42). At the sealed body formation step described later, instead, resin for sealing is supplied with the die surface 42*a* of the upper die 42 in abutment with the exposed portion 11 (Refer to FIG. 21) of each hanging lead 10 (Refer to FIG. 21). As a result, a resin flash can be prevented or suppressed from being formed on the following: the upper surface of the exposed portion 11 of each hanging lead 10 placed outside the first corner portion 43*b* (Refer to FIG. 25) of the cavity 43 (Refer to FIG. 25) as illustrated in FIG. 21.

As illustrated in FIG. 25, an air vent portion for discharging air in the cavity is not formed in the molding die 41 (upper die 42) in this embodiment. This is because in this embodiment, air in the cavity 43 illustrated in FIG. 25 can be discharged by forming multiple air vent portions 32 in the lead frame 30 as illustrated in FIG. 12. Since an air vent portion is not formed in the molding die 41 (upper die 42), a resin flash can be prevented or suppressed from being formed on the upper surfaces of the exposed portions 11 of the hanging leads 10 placed outside the following: the three corner portions 43*a* (Refer to FIG. 25) other than the first corner portion 43*b* (Refer to FIG. 25) of the cavity 43 (Refer to FIG. 25) as illustrated in FIG. 21.

As illustrated in FIG. 25, a flow cavity (recessed portion, second cavity) 46 is formed between adjacent cavities 43 in the die surface 42*a* of the upper die 42. FIG. 25 shows only one cavity because it is an enlarged plan view of the upper die corresponding to one product formation region of the lead frame. In the upper die 42, however, a cavity 43 (Refer to FIG. 25) is provided for each of the product formation regions 30*a* illustrated in FIG. 11. In this embodiment, that is, multiple cavities 43 are arranged in a matrix pattern in the upper die 42. For example, 14 cavities are arranged in the direction of row and five cavities are arranged in the direction of column; and 70 cavities 43 in total are arranged in accordance with the arrangement of the product formation regions 30*a* illustrated in FIG. 11. The depth (distance to the bottom surface of the recessed portion) of each flow cavity 46 arranged between cavities 43 is larger than the depth of each cavity 43 as illustrated in FIG. 26. When the flow cavities 46 deeper than the cavities 43 are formed as mentioned above, multiple resin spacers 8 can be formed in the immediate vicinity of the sealing resin 6 as illustrated in FIG. 21. The height of the upper surface 8*a* of each resin spacer 8 is larger than the height of the upper surface 6*a* of the sealing resin 6. Therefore, damage to the sealing resin 6 or the like can be prevented even though multiple lead frames 30 are stacked and conveyed at the molding step and the following steps. As illustrated in FIG. 25, in the molding die 41 (upper die 42), each cavity 43 and each flow cavity 46 are formed away from each other.

As illustrated in FIG. 24, a film (sheet, resin film) 47 is placed over the die surface 44*a* of the lower die 44. The film 47 is formed of, for example, polyimide resin and is so arranged as to cover the die surface 44*a*. The film 47 is softer than the lead frame 30 and the molding die 41.

<Clamping Step>

Figure 27:
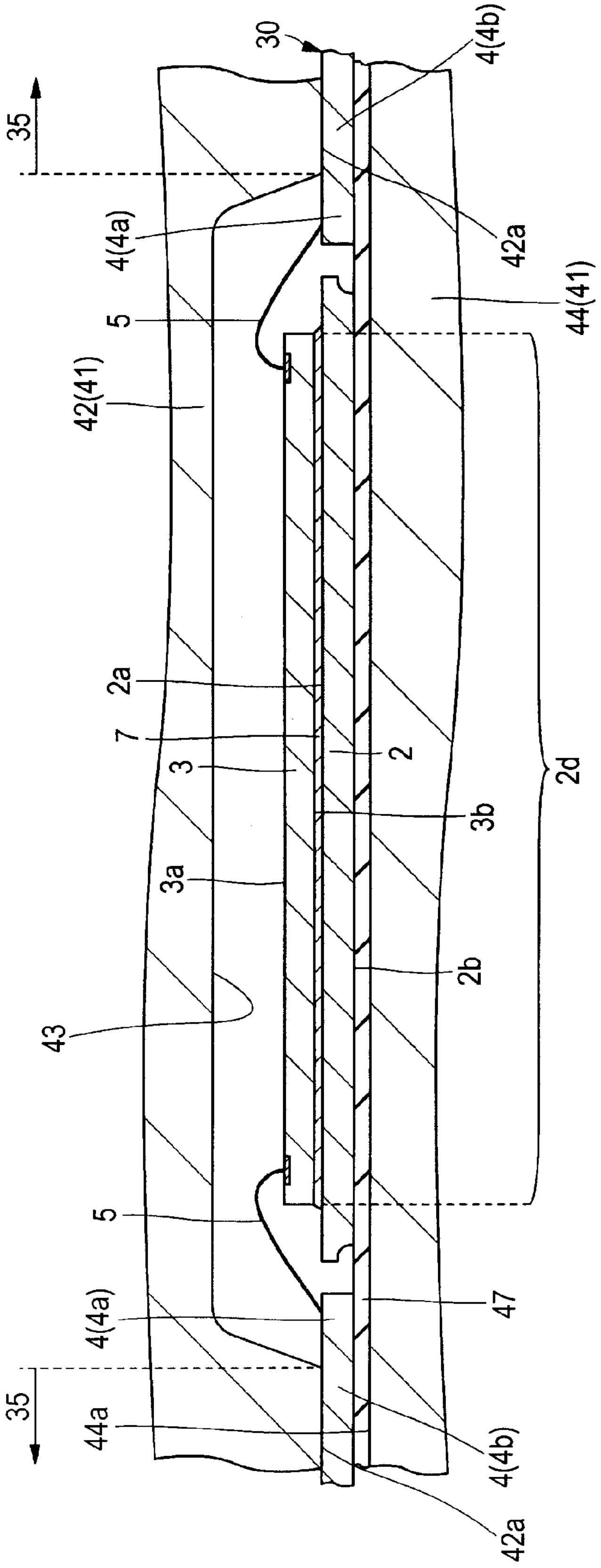
FIG. 27 is an enlarged sectional view illustrating how the lead frame illustrated in FIG. 20 is placed and clamped in the molding die illustrated in FIG. 24.

At the clamping step, as illustrated in FIG. 27, the lead frame 30 is arranged between the upper die 42 and the lower die 44 and the clamp areas 35 of the lead frame 30 are clamped in the molding die 41. FIG. 27 is an enlarged sectional view illustrating the lead frame illustrated in FIG. 20 as is clamped between the upper and lower molding dies illustrated in FIG. 24.

At this step, the lead frame 30 is arranged between the upper die 42 and the lower die 44 as illustrated in FIG. 27. Specifically, the lead frame is so arranged that each die pad 2 with a semiconductor chip 3 mounted thereover, multiple wires 5, and respective parts (multiple inner leads 4*a*) of the multiple leads 4 are positioned in a cavity 43.

Subsequently, as illustrated in FIG. 27, the lead frame 30 is clamped between the upper die 42 and the lower die 44. The die surface 42*a* arranged around each cavity 43 in the upper die 42 is abutted against the clamp area 35 in the upper surface of the lead frame 30 and presses the lead frame 30 against the lower die 44. The film 47 is placed between the lower die 44 and the lead frame 30. Therefore, the die surface 44*a* of the lower die 44 presses the lead frame 30 from the lower surface side against the upper die 42 with the film 47 placed over the die surface 44*a* in between. At the clamping step, either or both of the upper die 42 and the lower die 44 are moved toward the lead frame 30 to clamp the lead frame 30. Either method can be used.

In this embodiment, at this time, the die surface 44*a* is covered with the film 47 softer than the lead frame 30. Therefore, the film 47 is elastically deformed in accordance of the pattern of the lead frame 30 and part of the film 47 digs into the lower surface of the lead frame 30. For this reason, it is possible to suppress the formation of a gap between the lower surface of the lead frame 30 and the film 47 and bring them into close contact with each other. This makes it possible to suppress the resin for sealing from going round to the lower surface side of the lead frame 30 at the next step, or a sealed body formation step. In this embodiment, as mentioned above, air vent portions 32 are formed in the lead frame 30. If these air vent portions 32 are formed on the lower surface side of the lead frame 30, at this time, the air vent portions 32 will be closed with the film 47 when the lead frame 30 is clamped. In this embodiment, meanwhile, the air vent portions 32 are formed on the upper surface side of the lead frame 30. For this reason, even when the lead frame 30 is placed over the film 47 and yet clamped, the air vent portions 32 are not closed with the film 47. As a result, gas (in general, air) in a cavity can be discharged to outside the cavity.

As mentioned above, the lead frame 30 is arranged and clamped between the upper die 42 and the lower die 44 at this clamping step. As a result, the gate portion 45, cavity 43, and flow cavities 46 of the upper die 42 illustrated in FIG. 25 are jointed together and a path through which resin for sealing flows at the next step, or the sealed body formation step is formed. Specifically, the gate portions 45 and cavities 43 formed in the upper die 42 are jointed with each other through the gate slits 34 (Refer to FIG. 19). The air vent portions 32 illustrated in FIG. 21 are jointed to the cavity 43 illustrated in FIG. 25. The flow cavities 46 illustrated in FIG. 25 is jointed to a cavity 43 through one (air vent portion 32*e*) of the air vent portions 32 illustrated in FIG. 21. In this embodiment, they are jointed through the air vent portion 32 arranged in a position where it overlaps with the following corner portion: the second corner portion 43*c* opposed to the first corner portion 43*b* through the central part of the cavity 43 of the four corner portions 43*a* of the cavity 43 illustrated in FIG. 25.

<Sealed Body Formation Step>

Figure 28:
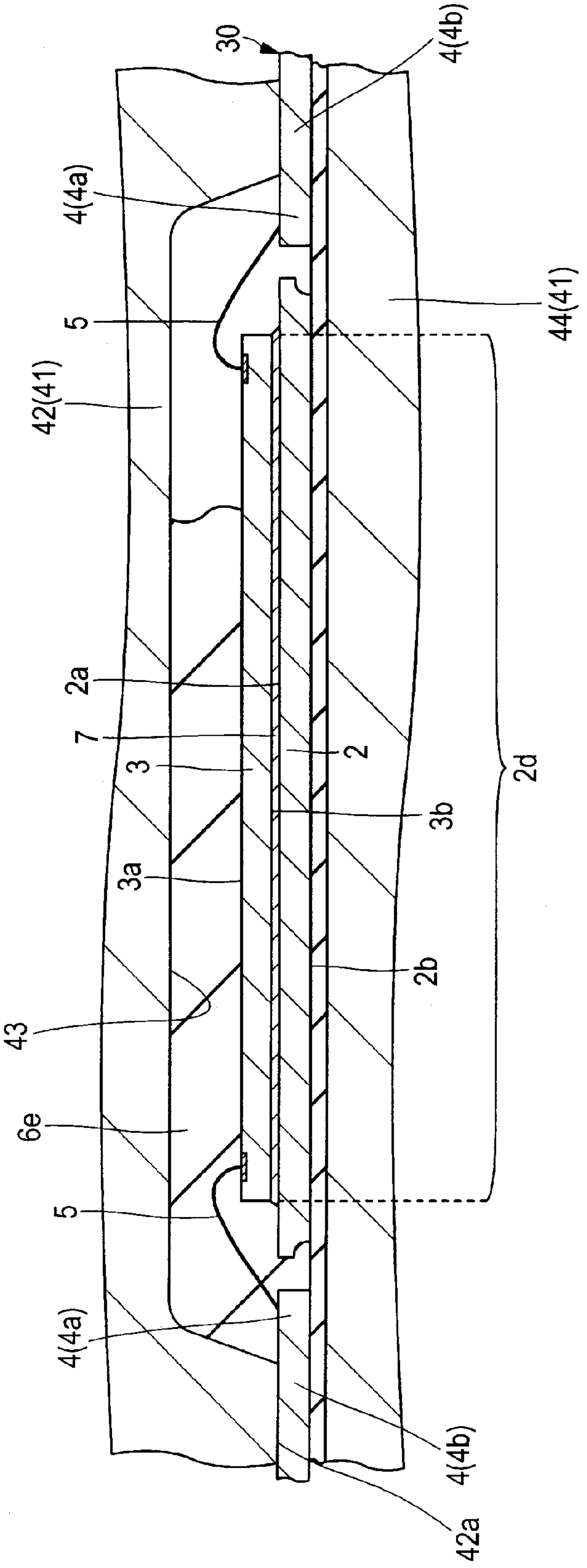
FIG. 28 is an enlarged sectional view illustrating how resin for sealing is supplied into the cavity illustrated in FIG. 27.
Figure 29:
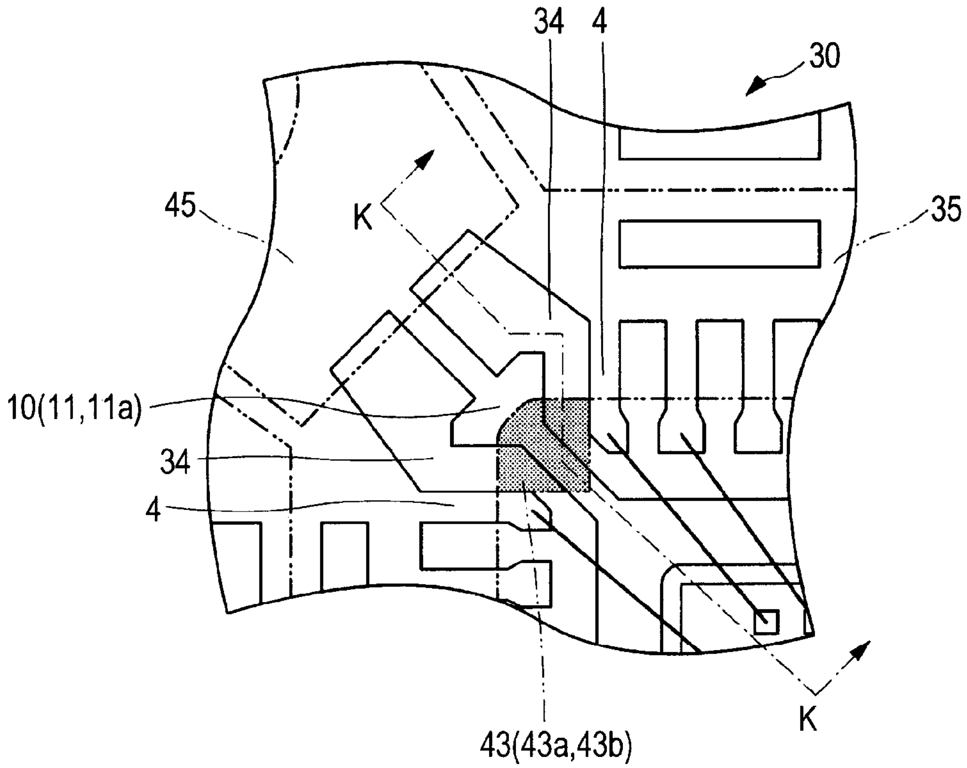
FIG. 29 is an enlarged plan view illustrating the positional relation between a molding die and a lead frame in proximity to the gate slits illustrated in FIG. 19.
Figure 30:
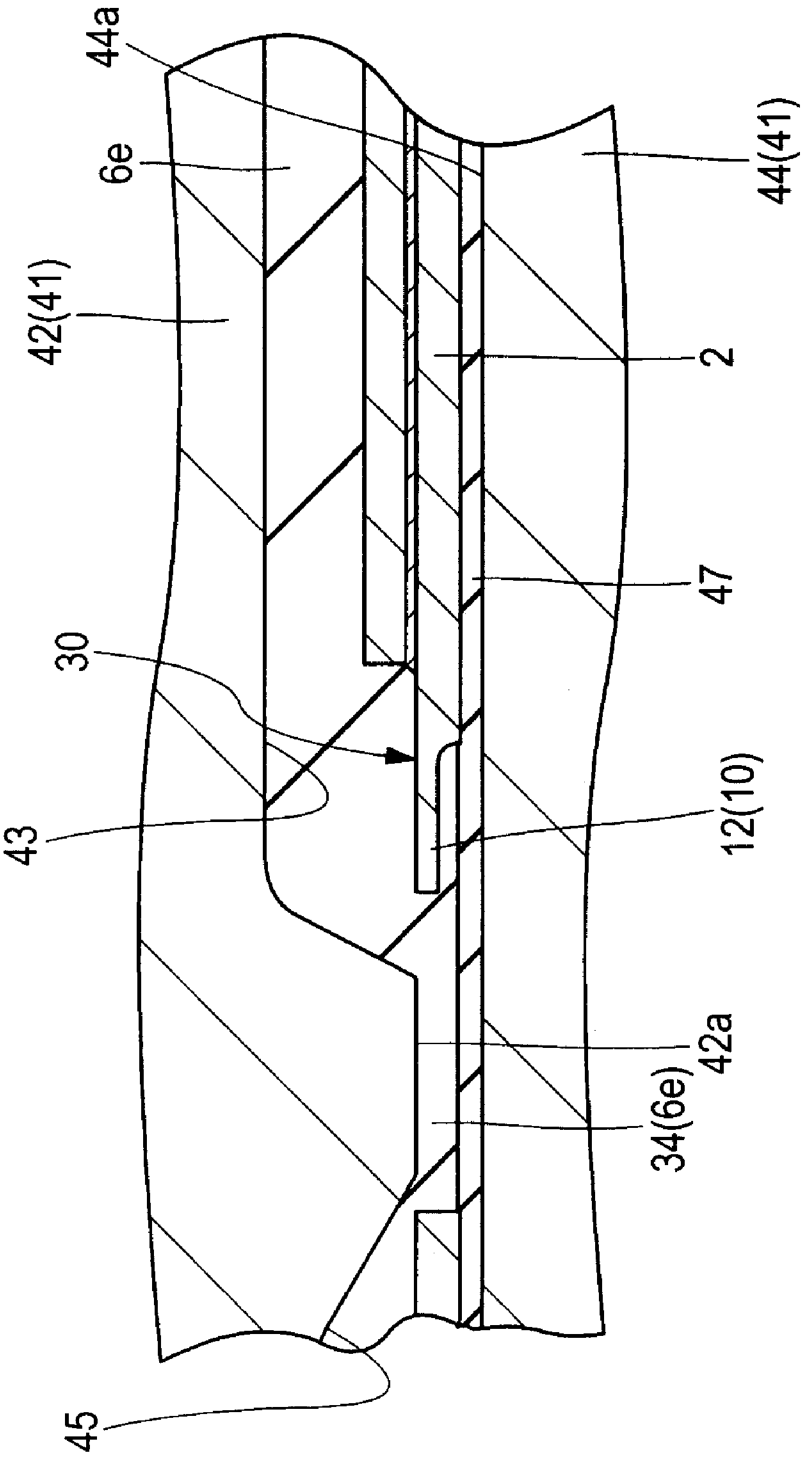
FIG. 30 is an enlarged sectional view taken along line K-K of FIG. 29.
Figure 31:
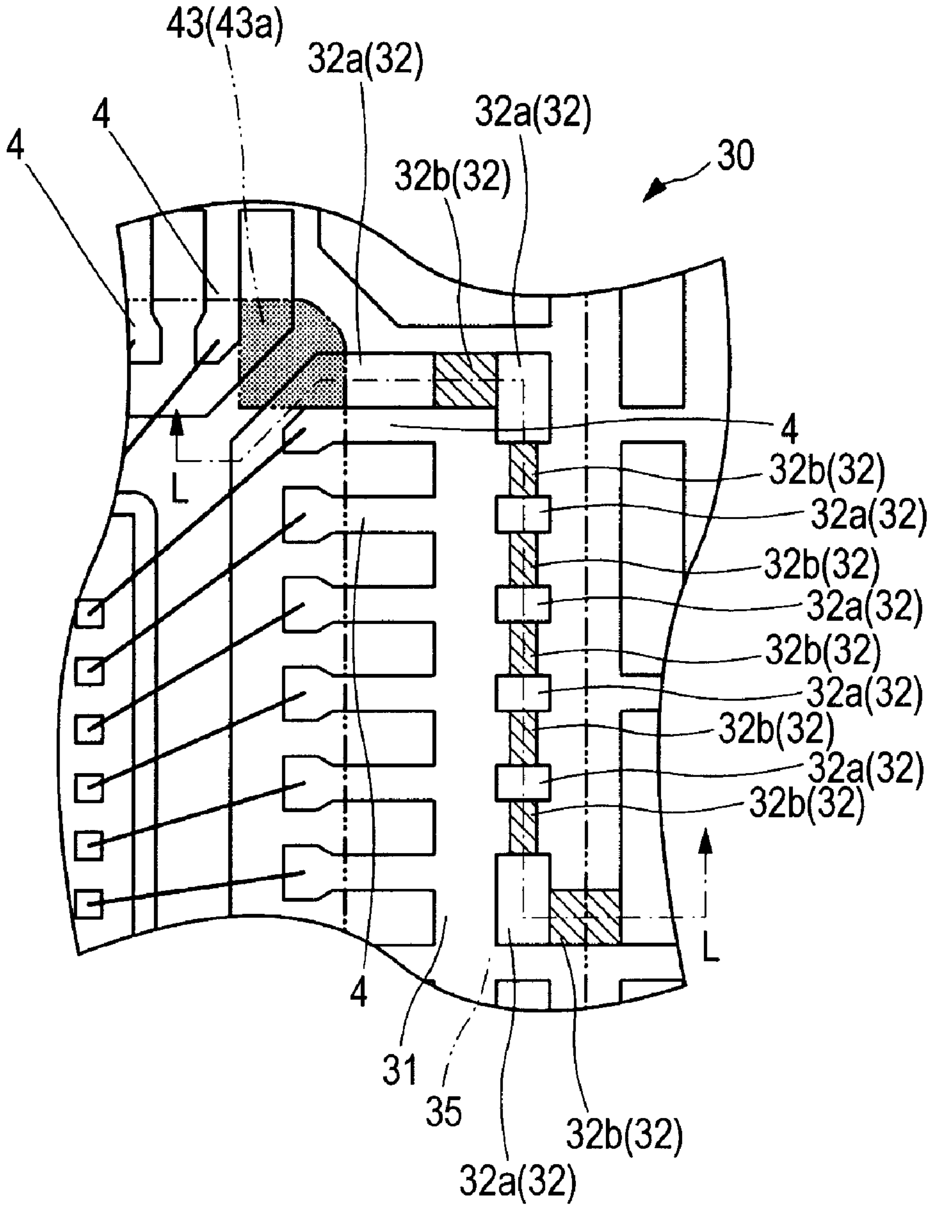
FIG. 31 is an enlarged plan view illustrating the positional relation between a molding die and a lead frame in proximity to an air vent portion illustrated in FIG. 19.
Figure 32:
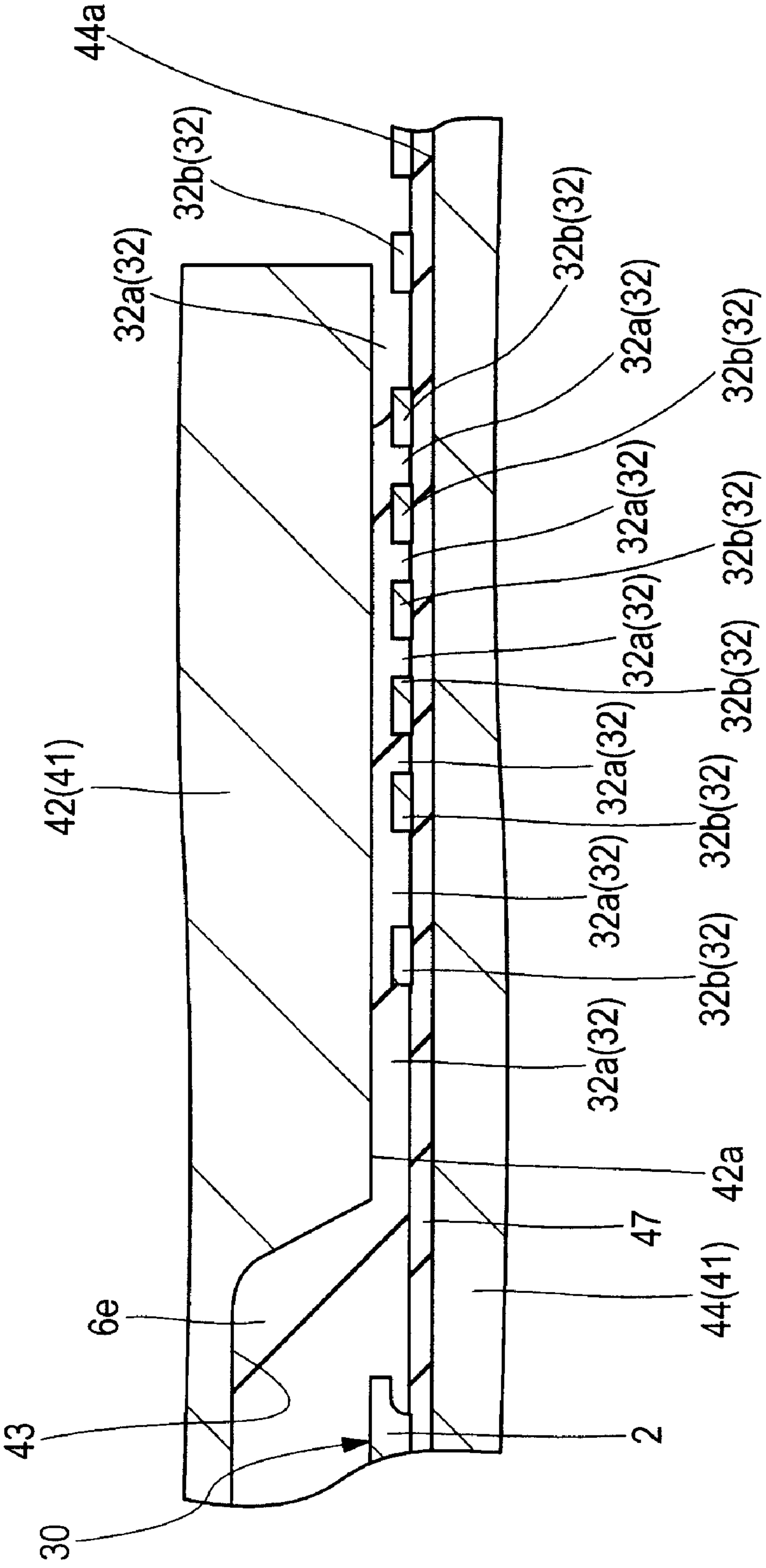
FIG. 32 is an enlarged sectional view taken along line L-L of FIG. 31.

At the sealed body formation step, as illustrated in FIG. 28, resin 6*e* for sealing is supplied (pressed) into each cavity 43 with the lead frame 30 clamped in the molding die 41. Then it is cured to form the sealing resin 6 illustrated in FIG. 21. FIG. 28 is an enlarged sectional view illustrating a state in which the resin for sealing is supplied into the cavity illustrated in FIG. 27. FIG. 29 is an enlarged plan view illustrating the positional relation between the molding die and the lead frame in the vicinity of the gate slits illustrated in FIG. 19; and FIG. 30 is an enlarged sectional view taken along line K-K of FIG. 29. FIG. 31 is an enlarged plan view illustrating the positional relation between the molding die and the lead frame in the vicinity of an air vent portion illustrated in FIG. 19; and FIG. 32 is an enlarged sectional view taken along line L-L of FIG. 31.

At this step, first, a pellet of resin for sealing (not shown) formed of thermosetting resin is softened (plasticized) at a heating chamber (pot portion), not shown. Then the resin 6*e* for sealing (Refer to FIG. 28 and FIG. 30) is supplied to a cavity 43 (Refer to FIG. 28 to FIG. 30). It is supplied through a runner portion (not shown) communicating with a gate portion 45 (Refer to FIG. 29) formed in the upper die 42. The heating chamber and the runner portion are formed in the molding die 41 and the runner portions are arranged along the runner areas 30*c* illustrated in FIG. 11.

At this step, as illustrated in FIG. 30, the gate portions 45 and cavities 43 in the upper die 42 are jointed to the gate slits 34 in the lead frame 30. Thus flow paths for the resin 6*e* for sealing coupling the gate portions 45 and the cavities 43 through the gate slits 34 are formed. The upper surface 11*a* (Refer to FIG. 23) of the exposed portion 11 of each hanging lead 10 placed between a gate portion 45 and a cavity 43 is abutted against the die surface 42*a* of the upper die 42. The lower surface 11*b* (Refer to FIG. 23) of the exposed portion 11 of each hanging lead 10 is abutted against the film 47 placed over the die surface 44*a* of the lower die 44. For this reason, as illustrated in FIG. 23, the resin 6*e* for sealing (Refer to FIG. 30) does not go round to the upper surface 11*a* or lower surface 11*b* of each exposed portion 11 and the exposed portion 11 can be exposed.

As illustrated in FIG. 29, each gate slit 34 coupling a gate portion 45 and a cavity 43 together is arranged in a position where it overlaps with the first corner portion 43*b* of the cavity 43. Specifically, each gate slit 34 is formed between a hanging lead 10 and the leads 4 arranged next to the hanging lead 10.

When the resin 6*e* for sealing is supplied into each cavity 43 through a gate portion 45 and a gate slit 34, gas (air in this embodiment) in the cavity 43 is discharged through the air vent portions 32 illustrated in FIG. 31 and FIG. 32. Then the interior of the cavity 43 is filled with the resin 6*e* for sealing. Since the gaps between the leads 4 illustrated in FIG. 31 communicate with the cavity 43, at this time, the resin 6*e* for sealing flows also into the gaps between adjacent leads 4 and held back by the dam portion 31. For this reason, as illustrated in FIG. 21, in-dam resin 6*f* is formed in each gap between leads 4.

As illustrated in FIG. 31, each air vent portion 32 is arranged in a position where it overlaps with a corner portion 43*a* of a cavity 43 (specifically, a corner portion 43*a* different from the first corner portion 43*b* illustrated in FIG. 29). Since FIG. 31 is a partial enlarged view, only one air vent portion 32 is depicted. In actuality, however, the air vent portion 32 is arranged in positions overlapping with the other corner portions 43*a*, than the first corner portion 43*b*, of the cavity 43 illustrated in FIG. 25. In this embodiment, that is, the measure illustrated in FIG. 25 is taken. That is, a gate portion 45 (Refer to FIG. 29) is jointed to the first corner portion 43*b* of the four corner portions 43*a* of each cavity 43 in a square planar shape; and an air vent portion 32 (Refer to FIG. 31) is jointed to each of the other three corner portions 43*a*. When a cavity 43 in a square planar shape is used at a molding step by transfer molding, as mentioned above, gas in the cavity 43 is prone to be left in each corner portion of the square. The resin 6*e* for sealing supplied into each cavity 43 flows from a gate portion 45 toward air vent portions 32. For this reason, the following is implemented by jointing each corner portion 43*a* to a gate portion 45 or an air vent portion 32 as in this embodiment: the resin 6*e* for sealing flows from the first corner portion 43*b* of the cavity 43 to the other corner portions 43*a* (43*c*, 43*d*, 43*e*). This makes it possible to suppress gas from being left in the cavity 43 and reliably supply the resin 6*e* for sealing to each corner portion 43*a*.

Of the multiple air vent portions 32 (Refer to FIG. 21), the air vent portions 32*c*, 32*d* (Refer to FIG. 21) are jointed to the third corner portion 43*d* and the fourth corner portion 43*e* arranged next to the first corner portion 43*b* illustrated in FIG. 25. These air vent portions 32*c*, 32*d* are led from the corner portions 43*a* (third corner portion 43*d*, fourth corner portion 43*e*) to the second corner portion 43*c* diagonally positioned with respect to the first corner portion 43*b*. In other words, the air vent portions 32*c*, 32*d* (Refer to FIG. 21) coupled to the third corner portion 43*d* and the fourth corner portion 43*e* are led as follows: they are led to the side farther from the gate portion than the diagonal line coupling the third corner portion 43*d* and the fourth corner portion 43*e*. At this step, as mentioned above, the resin 6*e* for sealing (Refer to FIG. 30 and FIG. 32) flows from a gate portion 45 (Refer to FIG. 30) toward air vent portions 32 (Refer to FIG. 32). For this reason, the following can be implemented by leading each air vent portion 32 toward the second corner portion 43*c* far from the gate portion 45: the exhaust system of each air vent portion 32 can be caused to work until the interior of the cavity 43 is filled with the resin 6*e* for sealing.

Of the multiple air vent portions 32 (Refer to FIG. 21), the air vent portion 32*e* (Refer to FIG. 21) coupled to the second corner portion 43*c* diagonally arranged with respect to the first corner portion 43*b* illustrated in FIG. 25 is coupled as follows: the air vent portion 32*e* is coupled to a flow cavity 46. The (cross-sectional area of the) flow path in the air vent portion 32*e* coupled to the flow cavity 46 is larger than the (cross-sectional area of the) flow path in each of the air vent portions 32*c*, 32*d* (Refer to FIG. 21). As mentioned above, the second corner portion 43*c* diagonally positioned with respect to the first corner portion 43*b* to which the gate portion 45 is coupled is coupled to the flow cavity 46. At the same time, the (cross-sectional area of the) flow path in the air vent portion 32*e* coupled to the second corner portion 43*c* is made larger than those of the other air vent portions 32. Thus, after the interior of the cavity 43 is filled with the resin 6*e* for sealing (Refer to FIG. 30 and FIG. 32), the resin 6*e* for sealing can be further supplied into the flow cavity 46.

As illustrated in FIG. 31, each air vent portion 32 is led from a corner portion 43*a* of a cavity 43 to outside a clamp area 35. The following is implemented by leading an end of each air vent portion 32 to outside the clamp area 35 as mentioned above: the end of the air vent portion 32 on the opposite side to the cavity 43 is opened and thus gas in the cavity 43 can be reliably discharged.

Each air vent portion 32 is extended along a side (main side) of a cavity 43 in a clamp area 35. This makes it possible to increase the length of the flow path in the air vent portion 32 formed when the lead frame 30 is clamped between the upper die 42 and the lower die 44 as illustrated in FIG. 32. In this embodiment, for example, the following length is set so that it is equal to or larger than ½ of the length of each side of the cavity 43: the length (pathway distance) of the flow path in each air vent portion 32 from the border between it and the cavity 43 to an end of the clamp area 35 (Refer to FIG. 31) in the clamp area 35. Specifically, the length of each side of the cavity 43 is approximately 6.4 mm. Meanwhile, the length (pathway distance) of the flow path in each air vent portion 32 from the border between it and the cavity 43 to an end of the clamp area 35 (Refer to FIG. 31) in the clamp area 35 is approximately 3.7 mm. As mentioned above, the balance between the pressure (static pressure) in the cavity 43 and the supply pressure of resin 6*e* for sealing (Refer to FIG. 32) is important from the viewpoint of suppressing resin seal failures in transfer molding. The pressure (static pressure) in the cavity 43 can be controlled by the static pressure in the air vent portions 32 as an exhaust passage. Narrowing and elongating the flow path in each air vent portion 32 as in this embodiment is effective in easily controlling the static pressure in the air vent portions 32. That is, the following measure is effective: the width of the flow path in each air vent portion 32 is made substantially equal to the width of the gap between adjacent leads 4 and the length (pathway distance) of the flow path is increased. The following can be implemented by extending each air vent portion 32 along a side (main side) of a cavity 43 in a clamp area 35 as in this embodiment: it is possible to suppress expansion of the product formation region 30*a* (Refer to FIG. 21) and lengthen the flow path in the air vent portion 32. As a result, it is possible to increase the number of products acquired from one lead frame 30.

The extension of an air vent portion 32 along a side (main side) of a cavity 43 is not limited to a mode in which it is extended in parallel with a side of the cavity 43. For example, it may be meandered along a side of the cavity 43 in a clamp area 35 illustrated in FIG. 31 and extended to outside the clamp area 35. In this case, the length of the flow path in the air vent portion 32 can be made larger than that in this embodiment. However, the investigation conducted by the present inventors revealed that resin seal failures can be suppressed by making the length (pathway distance) of the flow path in each air vent portion 32 equal to or smaller than the length of each side of the cavity 43. To meander an air vent portion 32, it is necessary to ensure a space for meandering it. Therefore, it is desirable to take the following measure as in this embodiment from the viewpoint of suppressing expansion of each product formation region 30*a* (Refer to FIG. 21): each air vent portion 32 is extended in parallel with a side of the cavity 43 in areas other than joint areas where it is jointed with the cavity 43 and lead-out areas where it is led to outside the clamp area 35.

It is desirable to make uniform the lengths of the flow paths in air vent portions from the viewpoint of adjusting the balance of static pressure between air vent portions 32. In this embodiment, as illustrated in FIG. 21, the flow paths in the air vent portion 32*c* and the air vent portion 32*d* are made uniform (equal) in length. This makes it possible to prevent or suppress the following event: an event in which the static pressure of either air vent portion 32 becomes excessively high and this causes the formation of a void or the occurrence of a resin leak.

As illustrated in FIG. 31 and FIG. 32, each air vent portion 32 in this embodiment is formed by jointing the following together: multiple hole portions (slit portions) 32*a* penetrating the lead frame 30 and multiple groove portions 32*b* (hatched portions in FIG. 31) jointing the hole portions 32*a* together. In this embodiment, in other words, each air vent portion 32 includes: multiple first passages (hole portions 32*a*) having a first cross-sectional area; and multiple second passages (groove portions 32*b*) having a second cross-sectional area smaller than the first cross-sectional area. The first and second passages are jointed together. Specifically, the first passages and the second passages are alternately arranged. The following can be implemented by alternately arranging passages different in cross-sectional area and jointing them together: it is possible to suppress the outflow of the resin 6*e* for sealing and discharge gas (air) in the cavity 43. At this step, gas in the cavity 43 is discharged through the air vent portions 32. At this time, part of the resin 6*e* for sealing supplied into the cavity 43 also flows out through the air vent portions 32. (Refer to, for example, the sealing resin indicated by a dot pattern in FIG. 21.) The static pressure in an air vent portion 32 is increased more as the cross-sectional area of the air vent portion 32 is reduced. Therefore, this is desirable from the viewpoint of reducing the amount of outflow of the resin 6*e* for sealing. When the cross-sectional area of an air vent portion 32 is small, however, it is clogged with the resin 6*e* for sealing and gas in the cavity 43 cannot be discharged. This causes the formation of a void. Consequently, as in this embodiment, the first passages (hole portions 32*a*) large in cross-sectional area are jointed to the second passages (groove portions 32*b*) small in cross-sectional area. Thus a wide first passage is jointed to an end of a narrow second passage and clogging with the resin 6*e* for sealing can be suppressed. A second passage small in cross-sectional area is arranged at an end of a first passage large in cross-sectional area. Therefore, sufficient static pressure can be ensured in the entire air vent portion 32. As a result, it is possible to reduce the amount of outflow of the resin 6*e* for sealing and discharge gas (air) in the cavity 43. The reason for this is as described below. The air bubbles (void) in the resin 6*e* for sealing are lower in viscosity than the resin 6*e* for sealing. Therefore, when first passages and second passages different in cross-sectional area are alternately jointed, the air bubbles in the resin 6*e* for sealing are easily migrated. The air bubbles are first pushed out in the direction of extension of the air vent portion 32. This effect is designated as the throttle effect of a flow path.

In this embodiment, as illustrated in FIG. 31, the width of each groove portion 32*b* is smaller than the width of each hole portion 32*a*. For example, the width of each groove portion 32*b* is set to ⅓ of the width of each hole portion 32*a*. This facilitates the above-mentioned throttle effect of a flow path and the air bubbles in the resin 6*e* for sealing can be more reliably discharged.

As mentioned above, the cross-sectional area of the flow path in the air vent portion 32*e* (Refer to FIG. 19) coupled to a flow cavity 46 (Refer to FIG. 25) is larger than those of the other air vent portions 32*c*, 32*d* (Refer to FIG. 19). Therefore, in the air vent portion 32*e*, the amount of outflow of the resin 6*e* for sealing is large. The resin 6*e* for sealing flowing out of this air vent portion 32*e* flows into the flow cavity 46 and forms the resin spacer 8 illustrated in FIG. 21. The resin spacer 8 is for preventing damage to the sealing resin 6 and the like even when multiple lead frames 30 are stacked and conveyed at the molding step and following steps. Therefore, even though a void is formed in a resin spacer 8, it does not cause degradation in the reliability of the semiconductor device.

In this embodiment, the multiple hole portions 32*a* are formed in the dam portions 31. Therefore, the hole portions 32*a* and the groove portions 32*b* are arranged as described below from the viewpoint of suppressing degradation in the strength of the lead frame 30. As illustrated in FIG. 31, each hole portion 32*a* is arranged on the extended line from a lead 4 in a dam portion 31; and each groove portion 32*b* is arranged on the extended line from each gap between leads 4. As a result, even though multiple hole portions 32*a* are arranged in a dam portion 31, degradation in the strength of the lead frame 30 can be suppressed.

As illustrated in FIG. 32, each groove portion 32*b* forming an air vent portion 32 in this embodiment is formed by etching the lead frame 30 from the upper surface side. That is, in each groove portion 32*b*, the upper surface side of the lead frame 30 is removed and the metal member forming the lead frame 30 is left on the lower surface side.

When the lead frame is clamped with the film 47 placed over the die surface 44*a* of the lower die 44 as illustrated in FIG. 32, the following takes place: the film 47 digs into the lower surface of the lead frame 30 in accordance with the pattern of the lead frame 30 as mentioned above. For this reason, if an attempt is made to ensure a space to be an exhaust passage in a groove portion 32*b* on the lower surface side of the lead frame 30, the following may result depending on the degree of digging of the film 47: the passage may be closed with the film 47. Especially, since each air vent portion 32 is narrowed from the viewpoint of ensuring static pressure, it is prone to be closed with the film 47. According to this embodiment, meanwhile, an exhaust passage in each groove portion 32*b* can be ensured on the upper surface side of the lead frame 30; therefore, even though the film 47 digs in, the exhaust passage can be prevented from being closed therewith. According to this embodiment, that is, clogging of each exhaust passage can be prevented and thus the formation of a void arising from an air discharge failure can be prevented.

After the interior of each cavity 43 and each flow cavity 46 illustrated in FIG. 25 is filled with the resin 6*e* for sealing (Refer to FIG. 28), the following processing is carried out: the molding die 41 illustrated in FIG. 28 is heated to a temperature equal to or higher than the curing temperature of the resin 6*e* for sealing to thermally cure (temporarily cure) the resin 6*e* for sealing. Thereafter, the upper die 42 and the lower die 44 are released from each other and the lead frame 30 illustrated in FIG. 21 is taken out of the molding die 41. In the lead frame 30 taken out, as illustrated in FIG. 21, there are formed the sealing resin 6, resin spacers 8, and in-dam resin 6*f*. In each air vent portion 32 (Refer to FIG. 19), there is formed in-vent portion resin 6*g* obtained when the resin for sealing flowing out to the air vent portion 32 is cured.

5. Baking Step

Figure 33:
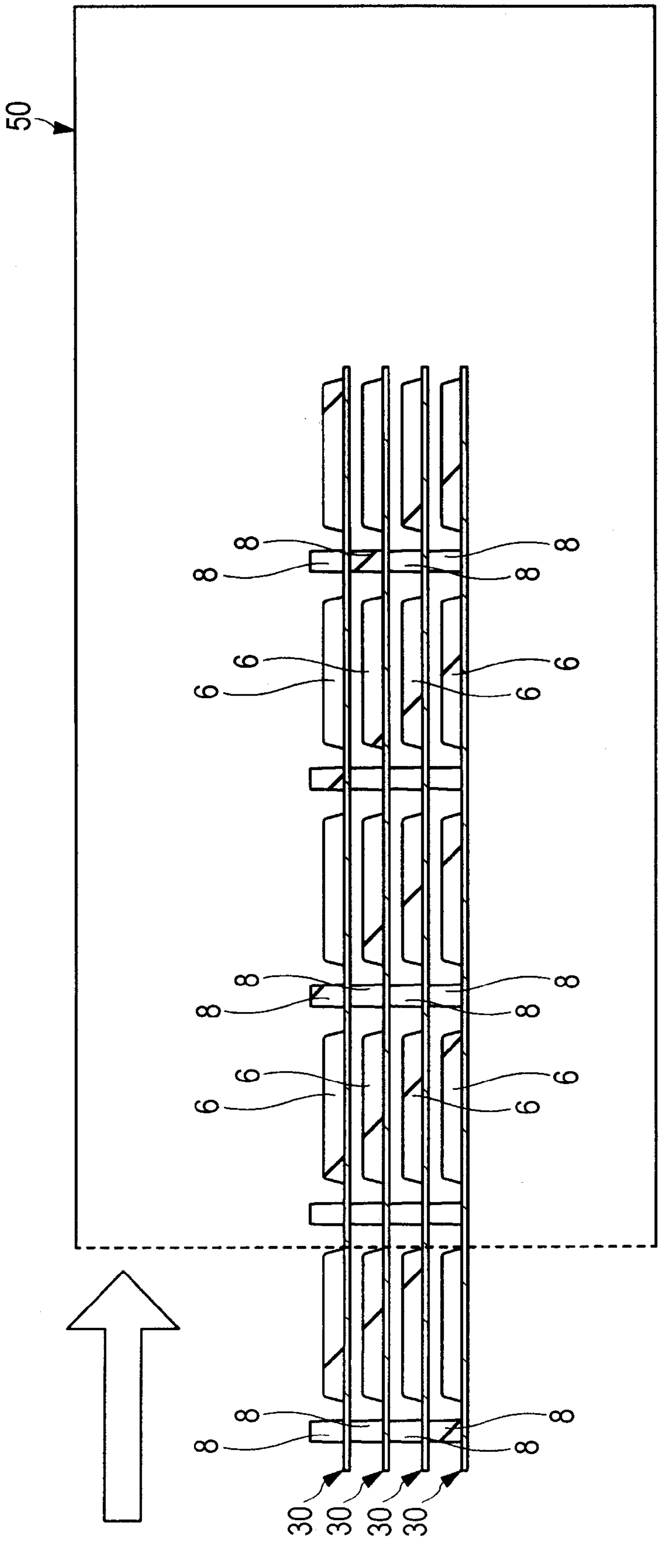
FIG. 33 is an explanatory drawing schematically illustrating how the multiple lead frames illustrated in FIG. 21 are stacked and conveyed into a baking furnace.

FIG. 33 is an explanatory drawing schematically illustrating how the multiple lead frames illustrated in FIG. 21 are stacked and conveyed into a baking furnace.

At the baking step (S5) illustrated in FIG. 10, lead frames 30 taken out of the molding die are conveyed into the baking furnace 50 as illustrated in FIG. 33 and each lead frame 30 is heat treated again. At the sealed body formation step in the above-mentioned molding step, the resin supplied into each cavity is cured but the resin has not been completely cured yet. This is intended to quickly carry out the molding step on the next lead frames 30 conveyed to the molding die 41. In this embodiment, for this purpose, the step of curing resin for sealing is divided into two steps. At this baking step, the sealing resin 6 formed at the above-mentioned molding step is completely cured (regularly cured).

In this embodiment, the step of conveyance into the baking furnace 50 and the step of heating and curing in the baking furnace 50 can be carried out with multiple lead frames 30 stacked as illustrated in FIG. 33. In each lead frame 30, there are formed multiple resin spacers 8 and the height of each resin spacer 8 is larger than the height of the sealing resin 6. As a result, even though multiple lead frames 30 are stacked, damage to the sealing resin 6 can be prevented or suppressed. Stacking multiple lead frames 30 contributes to space saving and the number of lead frames 30 that can be processed at a time is increased.

In the above description of this embodiment, a case where a method of stacking and conveying multiple lead frames 30 or heating them as are stacked together is applied to the baking step has been taken as an example. A mode in which lead frames are stacked and conveyed as illustrated in FIG. 33 is not limited to this step and can be applied to each step up to the segmentation step described later.

6. In-Dam Resin Removal Step

Figure 34:
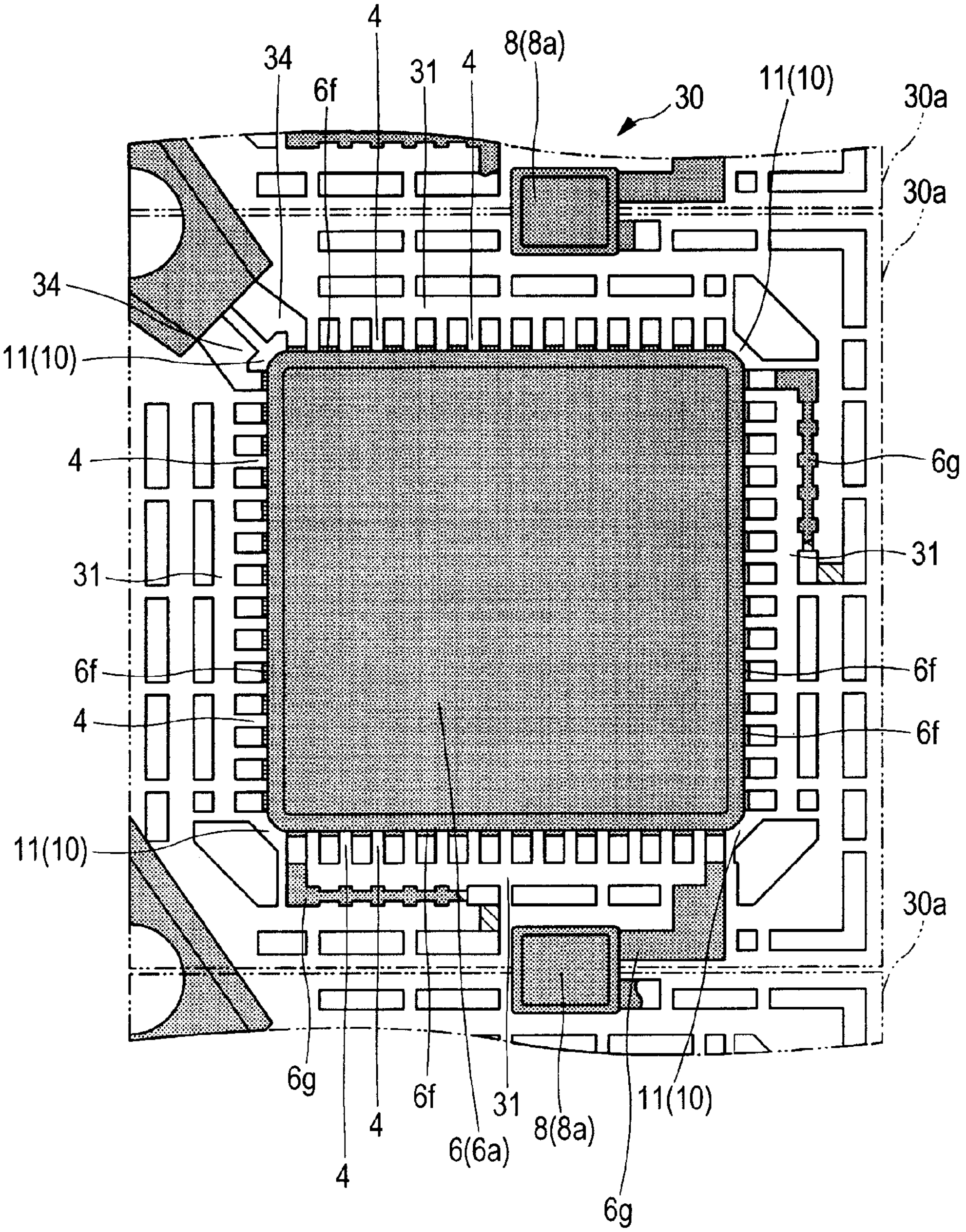
FIG. 34 is an enlarged plan view illustrating a state in which the in-dam resin illustrated in FIG. 21 is removed.
Figure 35:
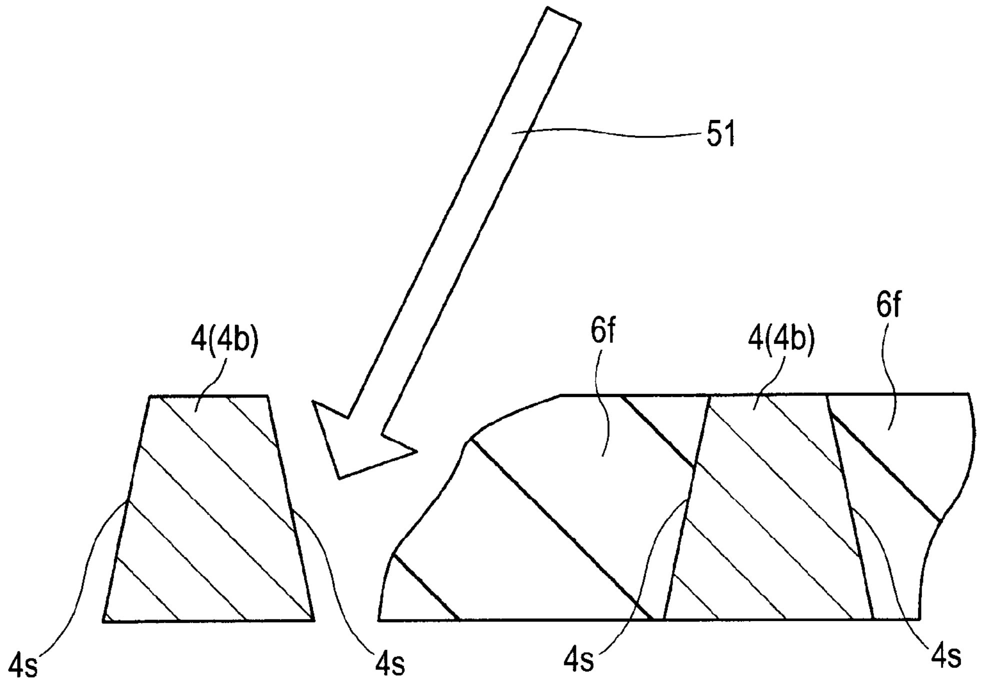
FIG. 35 is an enlarged sectional view how a laser is applied to the in-dam resin illustrated in FIG. 21.

FIG. 34 is an enlarged plan view illustrating a state in which the in-dam resin illustrated in FIG. 21 is removed; and FIG. 35 is an enlarged sectional view illustrating how a laser is applied to the in-dam resin illustrated in FIG. 21.

At the in-dam resin removal step (S6) illustrated in FIG. 10, the in-dam resin 6*f* (Refer to FIG. 21) formed between leads 4 (outer leads 4*b*) is removed as illustrated in FIG. 34. As illustrate in FIG. 34, the in-dam resin formed in each gate slit 34 and part of the in-vent portion resin 6*g* formed in each air vent portion 32 are also similarly removed. (With respect to part of the in-vent portion resin 6*g* formed in each air vent portion 32, that formed in the vicinity of the exposed portion 11 of each hanging lead 10 and each lead 4 only has to be removed.) At this step, as illustrated in FIG. 35, the in-dam resin 6*f* between outer leads 4*b* is irradiated with a laser 51 to remove it. In this embodiment, the side surfaces 4*s* of each lead 4 are exposed by applying a laser 51 from the upper surface side of the lead 4 toward the side surfaces 4*s* of the lead 4. A laser 51 could be applied to the upper surface of the in-dam resin 6*f* from the direction orthogonal thereto. In this embodiment, a laser 51 is applied at an irradiation angle smaller than 90° from the viewpoint of reliably applying a laser to the side surface 4*s* side of each lead 4.

As illustrated in FIG. 14 to which description has been given with reference, the following takes place at this step if a protruded portion 4*d* is formed on the side surfaces 4*s* of a lead 4: a laser 51 is not applied to an area hidden behind the protruded portion 4*d* in the direction of laser 51 irradiation and there is a possibility that the in-dam resin 6*f* cannot be removed. In this embodiment, as mentioned above, the protruded portions 4*d* (Refer to FIG. 14) formed on the side surfaces 4*s* of each outer lead 4*b* are removed beforehand to planarize the side surfaces 4*s*. Therefore, a laser 51 can be applied to the entire side surfaces 4*s* of each lead 4 and the in-dam resin 6*f* can be easily removed.

When a laser 51 is applied to remove in-dam resin 6*f*, dirt may stick to a lead 4. In this case, for example, any of the following methods can be carried out as a cleaning step to remove the dirt after a laser 51 is applied: a method of immersing a lead frame in electrolyte; a method of spraying pressure-applied cleaning water; and a combination of them.

It is desirable to remove all the in-dam resin 6*f* from the viewpoint of increasing the exposed surface area of each lead 4. If a laser 51 is applied to the border between the sealing resin 6 and the in-dam resin 6*f*, the sealing resin 6 may be damaged by the laser 51. In this embodiment, consequently, the in-dam resin 6*f* is not removed and is left on the side of the border between it and the sealing resin 6 as illustrated in FIG. 34.

7. Plating Step

Figure 36:
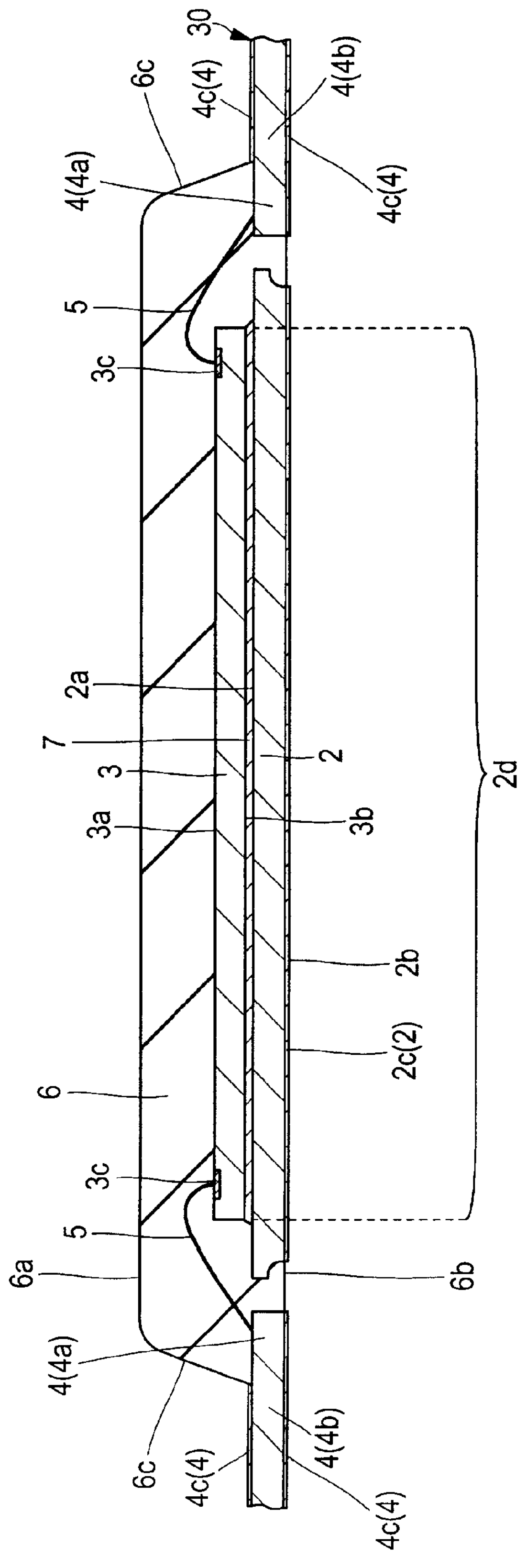
FIG. 36 is an enlarged sectional view illustrating how a face plating film is formed over the exposed surfaces of multiple leads and die pad exposed from the sealing resin illustrated in FIG. 34.
Figure 37:
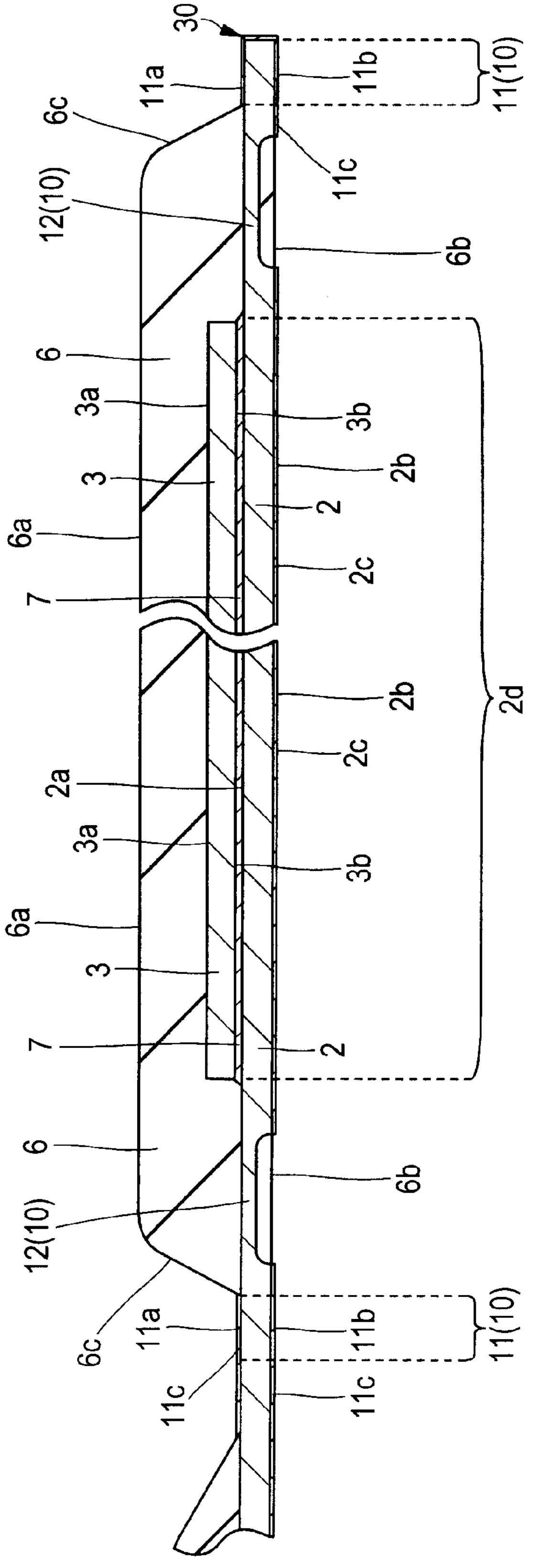
FIG. 37 is an enlarged sectional view illustrating how a face plating film is formed over the exposed portions of hanging leads and the exposed surface of a die pad exposed from the sealing resin illustrated in FIG. 34.

FIG. 36 is an enlarged sectional view illustrating how a face plating film is formed over the exposed surfaces of the multiple leads and the die pad exposed from the sealing resin illustrated in FIG. 34; and FIG. 37 is an enlarged sectional view illustrating how a face plating film is formed over the exposed portion of each hanging lead and the exposed surface of the die pad exposed from the sealing resin illustrated in FIG. 34.

At the plating step (S7) illustrated in FIG. 10, face plating films 4*c*, 11*c*, 2*c* are formed over the following exposed from the sealing resin 6 as illustrated in FIG. 36 and FIG. 37: multiple leads 4 (outer leads 4*b*), the exposed portion 11 of each hanging lead 10, and the exposed surface of the die pad 2.

At this step, the lead frame 30 as a workpiece to be plated is placed in a plating bath (not shown) filled with plating solution (not shown) and the face plating films 4*c*, 11*c*, 2*c* are formed by, for example, electrolytic plating. According to this electrolytic plating, a face plating film can be formed over the areas exposed from the sealing resin 6 in a lump. Therefore, the face plating film 4*c* illustrated in FIG. 36 is formed over the upper surface, lower surface, and side surfaces of each of the multiple outer leads 4*b*. The face plating film 2*c* is formed over the lower surface 2*b* of the die pad 2. The face plating film 11*c* illustrated in FIG. 37 is formed over the upper surface 11*a*, lower surface 11*b*, and side surfaces of the exposed portion 11 of each hanging lead 10.

The face plating films 4*c*, 11*c*, 2*c* in this embodiment are formed of so-called lead-free solder that substantially does not contain Pb (lead). Examples of this lead-free solder are solder of only Sn (tin), Sn (tin)-Bi (bismuth), or Sn (tin)-Ag (silver)-Cu (copper). The lead-free solder cited here refers to those with the lead (Pb) content of 0.1 wt % or below and this content is prescribed as the standards of the RoHs (Restriction of Hazardous Substances) Directive.

For this reason, the plating solution used at this plating step contains metal salt, such as $Sn^{2+}$ or $Bi^{3+}$. In this embodiment, an alloy metal plating of Sn—Bi is used as an example of lead-free solder plating. Instead, Bi may be replaced with such metal as Cu or Ag.

8. Marking Step

At the marking step (S8) illustrated in FIG. 10, an identification code for identifying the semiconductor device is marked. In this embodiment, for example, a laser is applied to the upper surface 6*a* of the sealing resin 6 illustrated in FIG. 36 to mark an identification code.

9. Segmentation Step

Figure 38:
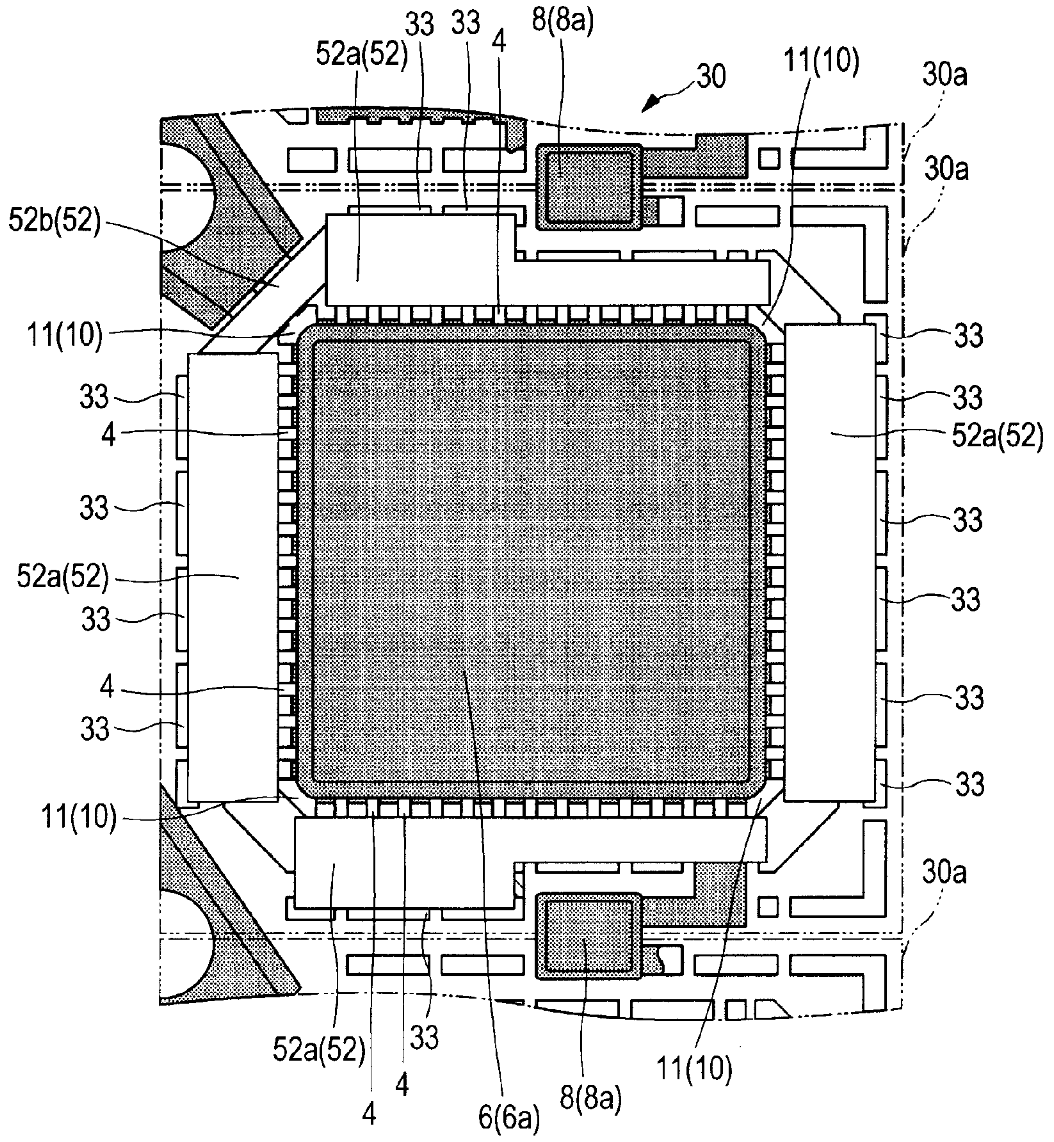
FIG. 38 is an enlarged plan view illustrating how a cutting edge (punch) is arranged after a face plating film is formed over the lead frame illustrated in FIG. 34.

FIG. 38 is an enlarged plan view a cutting edge (punch) is arranged after the face plating films are formed over the lead frame illustrated in FIG. 34.

At the segmentation step (S9) illustrated in FIG. 10, the leads 4 and hanging leads 10 jointed to the dam portions 31 (Refer to FIG. 34) are cut as illustrated in FIG. 38. The lead frame is thereby segmented into each product formation region 30*a* to obtain the multiple QFNs 1 (Refer to FIG. 1). The leads 4 and the hanging leads 10 are cut, for example, as follows: the punch (cutting edge) 52 is arranged on the upper surface side of the lead frame 30 as illustrated in FIG. 38 and a die (supporting member, not shown) is arranged on the lower surface side. Then the punch is pressed.

As illustrated in FIG. 38, the punch 52 includes: multiple lead cut punches 52*a* arranged along the arrangement line of the multiple lead 4 (in other words, along each side of the sealing resin 6); and a gate cut punch 52*b* arranged over the hanging lead 10 arranged between gate slits 34 (Refer to FIG. 34). The inside ends of the punch 52 are respectively placed inside a dam portion 31 (Refer to FIG. 34) and the leads 4 and the hanging leads 10 are cut inside the dam portions 31. In this embodiment, each hanging lead 10 is cut outside the exposed portion 11 thereof so that part (exposed portion 11) thereof is left.

The reason why the gate cut punch 52*b* is arranged in addition to the lead cut punches 52*a* is as follows. As illustrated in FIG. 34, each hanging lead 10 arranged in the corner portions other than the first corner portion of the sealing resin 6 is bifurcated into two outside the exposed portion 11. Each of the bifurcated hanging leads 10 is extended along the direction of extension of leads 4. For this reason, these bifurcated hanging leads 10 can be cut with the lead cut punches 52*a* illustrated in FIG. 38. However, if the hanging lead 10 arranged between the gate slits 34 illustrated in FIG. 34, that is, the hanging lead 10 arranged in the first corner portion is structured similarly to the other hanging leads, the following will take place: the cavity 43 and the gate portion 45 cannot be coupled with each other through the gate slits 34 as illustrated in FIG. 29. For this reason, the hanging lead 10 arranged in the first corner portion is not bifurcated outside the exposed portion 11 and is extended along a diagonal line of the sealing resin 6 and thereby coupled with a dam portion 31. Since the hanging lead 10 arranged between the gate slits 34 is different in shape from the other hanging leads 10 as mentioned above, the hanging lead 10 is cut by taking the following measure: the gate cut punch 52*b* is arranged so that it intersects with the direction of extension of the hanging lead 10 as illustrated in FIG. 38. It is desirable that the width of a cut area of each hanging lead 10 should be narrow from the viewpoint of reducing the load on the punch 52. In this embodiment, for this reason, each hanging lead 10 is cut not at its wide area but it is cut at its narrow area smaller in width than the wide area, formed outside the wide area. The protruded portion 11*e* formed in the exposed portion 11*d* illustrated in FIG. 8 to which description has been given with reference is the remaining part obtained after the hanging lead 10 arranged between the gate slits 34 illustrated in FIG. 34 is cut. In this embodiment, that is, the following measure is taken to prevent the sealing resin from going round to the upper surface and lower surface of the exposed portion 11 illustrated in FIG. 29: the gate slits 34 are formed in the lead frame 30 to couple each gate portion 45 and each cavity 43 together. As a result, the protruded portion 11*e* is formed in the exposed portion 11*d* illustrated in FIG. 8.

It is desirable to reduce the amount of members to be cut with the punch 52 from the viewpoint of reducing the load on the punch 52 and reducing the frequency of punch replacement. Especially, the frequency of breakage of the punch 52 can be significantly reduced by reducing the amount of members to be cut in positions where they overlap with end portions (edge portions) of the punch 52. In this embodiment, for this reason, the lead cut punches 52*a* are so arranged as to avoid the resin spacers 8 as illustrated in FIG. 38. In addition, multiple slit portions 33 are arranged along sides forming the end portions of each lead cut punch 52*a* in areas where the members to be cut overlap with end portions (edge portions) of the lead cut punches 52*a*.

The QFN 1 illustrated in FIG. 1 is finished by the steps described up to this point. Thereafter, required tests and inspections such as appearance inspection and electrical test are carried out and then shipped or mounted over the mounting board 20 illustrated in FIG. 5 and FIG. 6.

Second Embodiment

Figure 39:
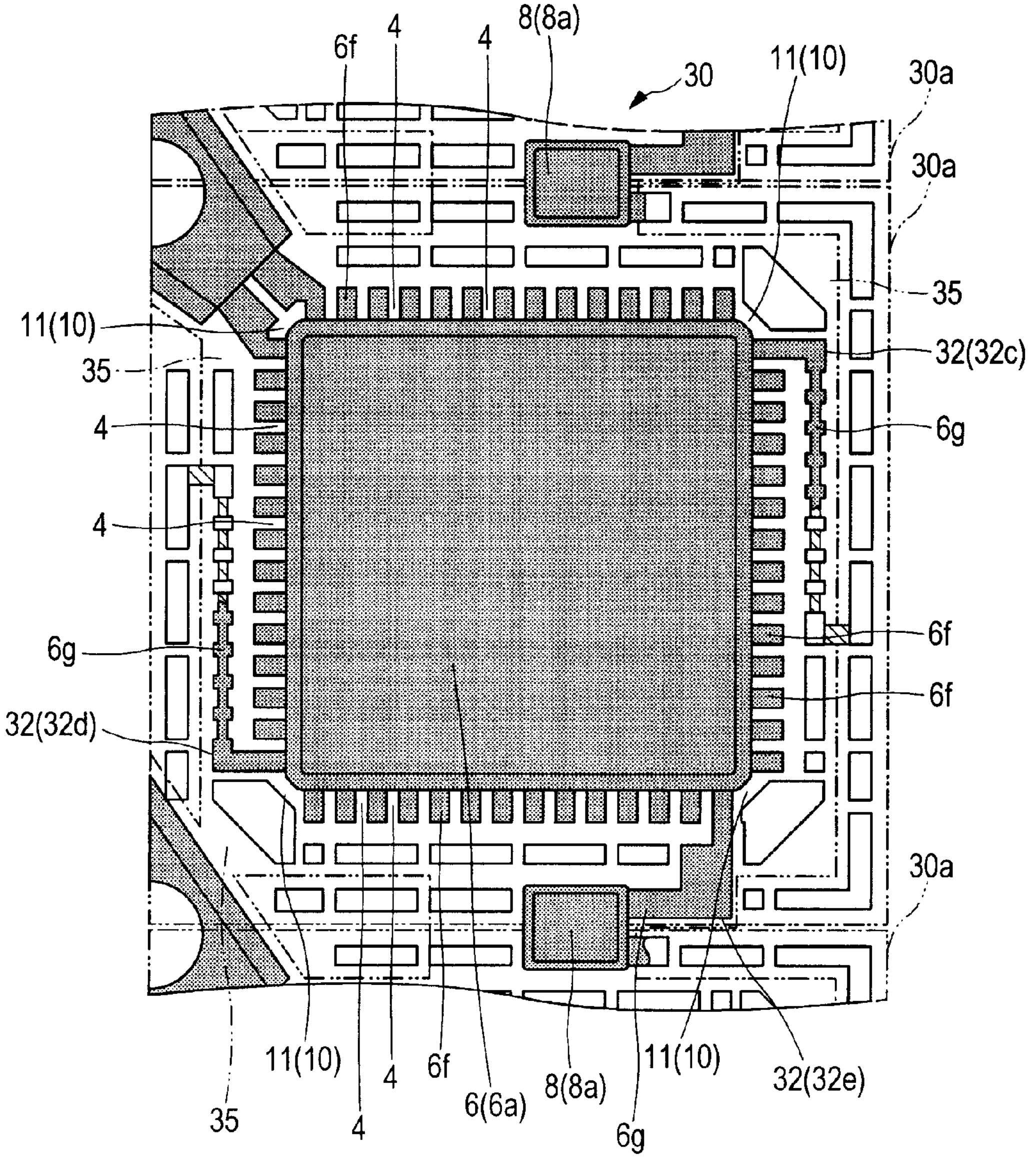
FIG. 39 is an enlarged plan view illustrating a modification to the lead frame illustrated in FIG. 21 in another embodiment of the invention.

Description will be given to another embodiment in which the QFN 1 described in relation to the first embodiment is manufactured. The description of this embodiment will be given mainly to a difference from the method of manufacturing a semiconductor device described in relation to the first embodiment and the description of common elements will be omitted. Also with respect to drawings, those required for explaining a difference from the first embodiment will be presented and drawings referred to in relation to the first embodiment will be referred to as required in the following description. FIG. 39 is an enlarged plan view illustrating a modification to the lead frame illustrated in FIG. 21.

A difference between the lead frame 60 illustrated in FIG. 39 and the lead frame 30 illustrated in FIG. 21 is in the direction in which each air vent portion 32 is led. In the lead frame 30 illustrated in FIG. 21, as described in relation to the first embodiment, the following air bent portions of the multiple air vent portions 32 are led as described below: the air vent portions 32*c*, 32*d* coupled to the third corner portion 43*d* (Refer to FIG. 25) and the fourth corner portion 43*e* (Refer to FIG. 25) arranged next to the first corner portion 43*b* (Refer to FIG. 25). These air vent portions are respectively led from the corner portions 43*a* (the third corner portion 43*d* and the fourth corner portion 43*e*: Refer to FIG. 25) toward the second corner portion 43*c* (Refer to FIG. 25).

For this reason, the air vent portion 32*e* and the air vent portion 32*d* coupled to a flow cavity 46 (Refer to FIG. 25) are so led that they are brought close to each other. If the two air vent portions 32 are coupled together in a clamp area 35 at this time, the exhaust passage is closed and gas in the cavity 43 (Refer to FIG. 25) cannot be discharged. This causes the formation of a void. To prevent this, the air vent portion 32*e* and the air vent portion 32*d* described in relation to the first embodiment are prevented from being coupled together in the clamp area 35 by adjusting their respective lengths. That is, to lead multiple air vent portions 32 along a side of a cavity 43 (Refer to FIG. 25), it is necessary to adjust their lengths to prevent the air vent portions 32 from being coupled together in a clamp area 35. As a result, restriction is imposed on the length of each air vent portion 32.

As a method for avoiding the coupling between the air vent portion 32*d* and the air vent portion 32*e* in the lead frame 30 illustrated in FIG. 21, the air vent portion 32*e* could be led to the opposite direction to the air vent portion 32*d*. On the opposite side of the air vent portion 32*d*, however, there is arranged a runner area 30*c* illustrated in FIG. 11, described in relation to the first embodiment. That is, the runner portions (not shown) of the molding die are arranged there at the molding step. In this case, a new problem arises. That is, the air vent portion 32*e* or the flow cavity 46 (Refer to FIG. 25) is coupled to the runner portion.

Consequently, this embodiment is configured as illustrated in FIG. 39 from the viewpoint of avoiding the coupling between the air vent portion 32*d* and the air vent portion 32*e* and further preventing restriction from being imposed on the length of each air vent portion 32. More specific description will be given to the lead frame 60 in this embodiment illustrated in FIG. 39. Of the multiple air vent portions 32 (Refer to FIG. 21), the air vent portion 32*c* coupled to the third corner portion 43*d* (Refer to FIG. 25) arranged next to the first corner portion 43*b* is led as follows: similarly to the lead frame 30 illustrated in FIG. 21, it is led from the third corner portion 43*d* (Refer to FIG. 25) toward the second corner portion 43*c* (Refer to FIG. 25). In other words, the air vent portion 32*c* is led toward the opposite corner to the gate portion 45 illustrated in FIG. 25. Meanwhile, the air vent portion 32*d* coupled to the fourth corner portion 43*e* (Refer to FIG. 25) is led from the fourth corner portion 43*e* (Refer to FIG. 25) toward the first corner portion 43*b* (Refer to FIG. 25). In other words, the air vent portion 32*d* is led toward the gate portion 45 illustrated in FIG. 25. In the molding die used in this embodiment, the same measure as in the molding die 41 illustrated in FIG. 25, described in relation to the first embodiment, is taken. That is, each cavity 43 is formed in the upper die 42 and flow cavities 46 are arranged along the line coupling the fourth corner portion 43*e* and the second corner portion 43*c* of each cavity 43. Each flow cavity 46 is coupled to a cavity 43 through the air vent portion 32*e* (Refer to FIG. 39) coupled to the second corner portion 43*c*. In this embodiment, in other words, multiple air vent portions are not arranged along each side of each cavity 43.

In this embodiment, for this reason, the following effect can be obtained in addition to the effect described in relation to the first embodiment: the length of each air vent portion 32 and the size of the clamp area around each flow cavity 46 (Refer to FIG. 25) can be freely designed. An example will be taken. In the first embodiment, as illustrated in FIG. 21, the air vent portions 32*c*, 32*d* are led to outside a clamp area 35 at a substantially intermediate point of the cavity 43 (FIG. 25) from the viewpoint of making their lengths equal. In this embodiment, meanwhile, the air vent portions 32*c*, 32*d* can be made larger in length than in the above embodiment and equal in length as illustrated in FIG. 39. Another example will be taken. In the first embodiment, as illustrated in FIG. 21, the lead-out area of the air vent portion 32*d* is arranged in proximity to a resin spacer 8. Therefore, the width of the clamp area 35 around the resin spacer 8 (in other words, around each flow cavity 46 illustrated in FIG. 25) is reduced. In this embodiment, meanwhile, a sufficient distance can be ensured between the resin spacer 8 and the air vent portion 32*d* as illustrated in FIG. 39. Therefore, the width of the clamp area 35 around each resin spacer 8 (in other words, around each flow cavity 46 illustrated in FIG. 25) can be made larger than in the first embodiment. As a result, the area around each flow cavity 46 illustrated in FIG. 25 can be widely and firmly clamped and the occurrence of a resin leak can be further reduced.

The method of manufacturing a semiconductor device in this embodiment is the same as the method of manufacturing a semiconductor device described above in relation to the first embodiment except the above difference. Though repetitive description will be omitted, therefore, the aspects of the invention described in relation to the first embodiment can be applied except the above difference.

Third Embodiment

Figure 40:
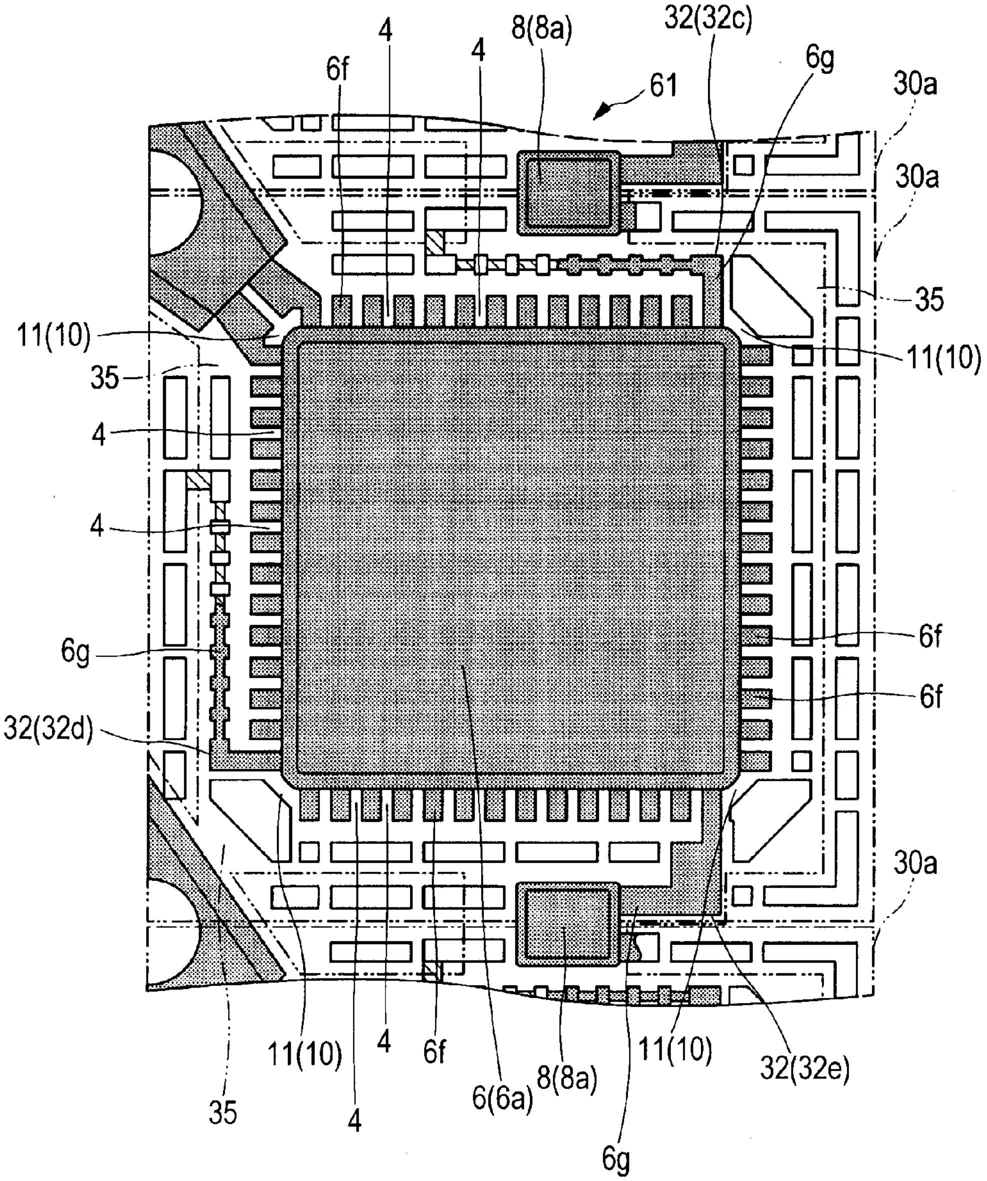
FIG. 40 is an enlarged plan view illustrating a modification to the lead frame illustrated in FIG. 39 in another embodiment of the invention.

Description will be given to another embodiment in which the QFN 1 described in relation to the first embodiment is manufactured. The description of this embodiment will be given mainly to a difference from the method of manufacturing a semiconductor device described in relation to the second embodiment and the description of common elements will be omitted. Also with respect to drawings, those required for explaining a difference from the second embodiment will be presented and drawings referred to in relation to the first embodiment will be referred to as required in the following description. FIG. 40 is an enlarged plan view illustrating a modification to the lead frame illustrated in FIG. 39.

A difference between the lead frame 61 illustrated in FIG. 40 and the lead frame 60 illustrated in FIG. 39 is in the direction in which each air vent portion 32 is led. In the second embodiment, the multiple air vent portions 32 are led as follows: of these air vent portions, the air vent portion 32*c* (Refer to FIG. 39) is led from the third corner portion 43*d* (Refer to FIG. 25) toward the first corner portion 43*b* (Refer to FIG. 25); and the air vent portion 32*d* (Refer to FIG. 39) is led from the fourth corner portion 43*e* (Refer to FIG. 25) toward the second corner portion 43*c* (Refer to FIG. 25). That is, the air vent portion 32*c* is led toward the opposite corner to the gate portion and the air vent portion 32*d* is led toward the gate portion. However, it is more desirable to take the following measure from the viewpoint of making the static pressures in the air vent portions 32*c*, 32*d* equal to each other: the direction of leading the air vent portions 32*c*, 32*d* is aligned with the direction of flow of resin for sealing at the molding step.

Consequently, this embodiment is configured as illustrated in FIG. 40 from the viewpoint of making the static pressures in the air vent portions 32*c*, 32*d* equal to each other. More specific description will be given to the lead frame 61 in this embodiment illustrated in FIG. 40. Of the multiple air vent portions 32 (Refer to FIG. 21), the following air vent portions are led toward the first corner portion 43*b* (Refer to FIG. 25): the air vent portion 32*c* coupled to the third corner portion 43*d* (Refer to FIG. 25) arranged next to the first corner portion 43*b*; and the air vent portion 32*d* coupled to the fourth corner portion 43*e* (Refer to FIG. 25). In other words, the air vent portions 32*c*, 32*d* are led toward the gate portion 45 illustrated in FIG. 25.

In this embodiment, for this reason, the static pressures in the air vent portions 32*c*, 32*d* can be more accurately made equal to each other than in the second embodiment. As described in relation to the first embodiment, however, it is desirable to take the following measure from the viewpoint of causing the exhaust system of each air vent portion 32 to work until the interior of the cavity 43 is filled with the resin 6*e* for sealing: as in the first embodiment, each air vent portion 32 is led toward the second corner portion 43*c* far from the gate portion 45.

The method of manufacturing a semiconductor device in this embodiment is the same as the method of manufacturing a semiconductor device described above in relation to the first embodiment except the above difference. Though repetitive description will be omitted, therefore, the aspects of the invention described in relation to the first embodiment can be applied except the above difference.

Fourth Embodiment

Figure 41:
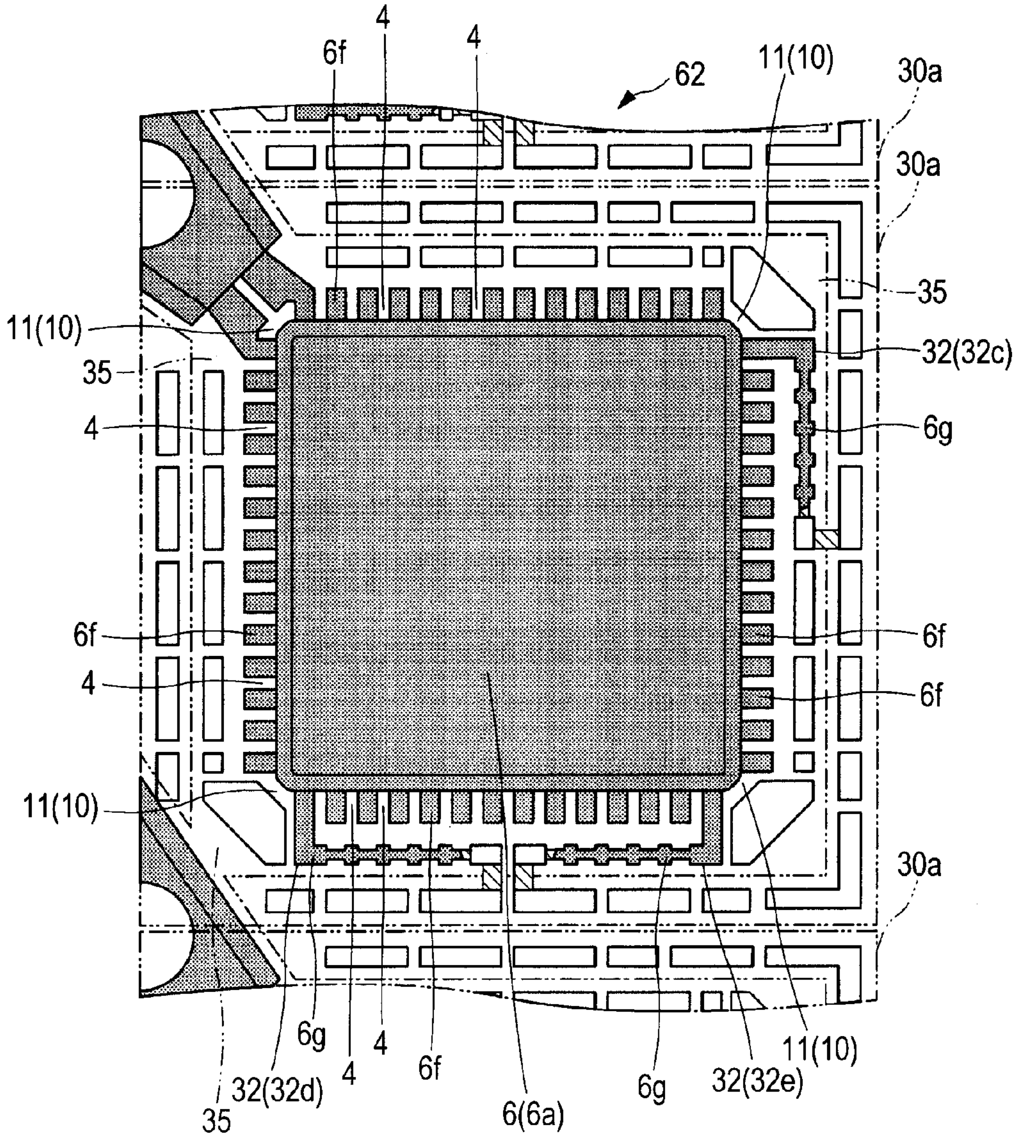
FIG. 41 is an enlarged plan view illustrating a modification to the lead frame in FIG. 21 in another embodiment of the invention.
Figure 42:
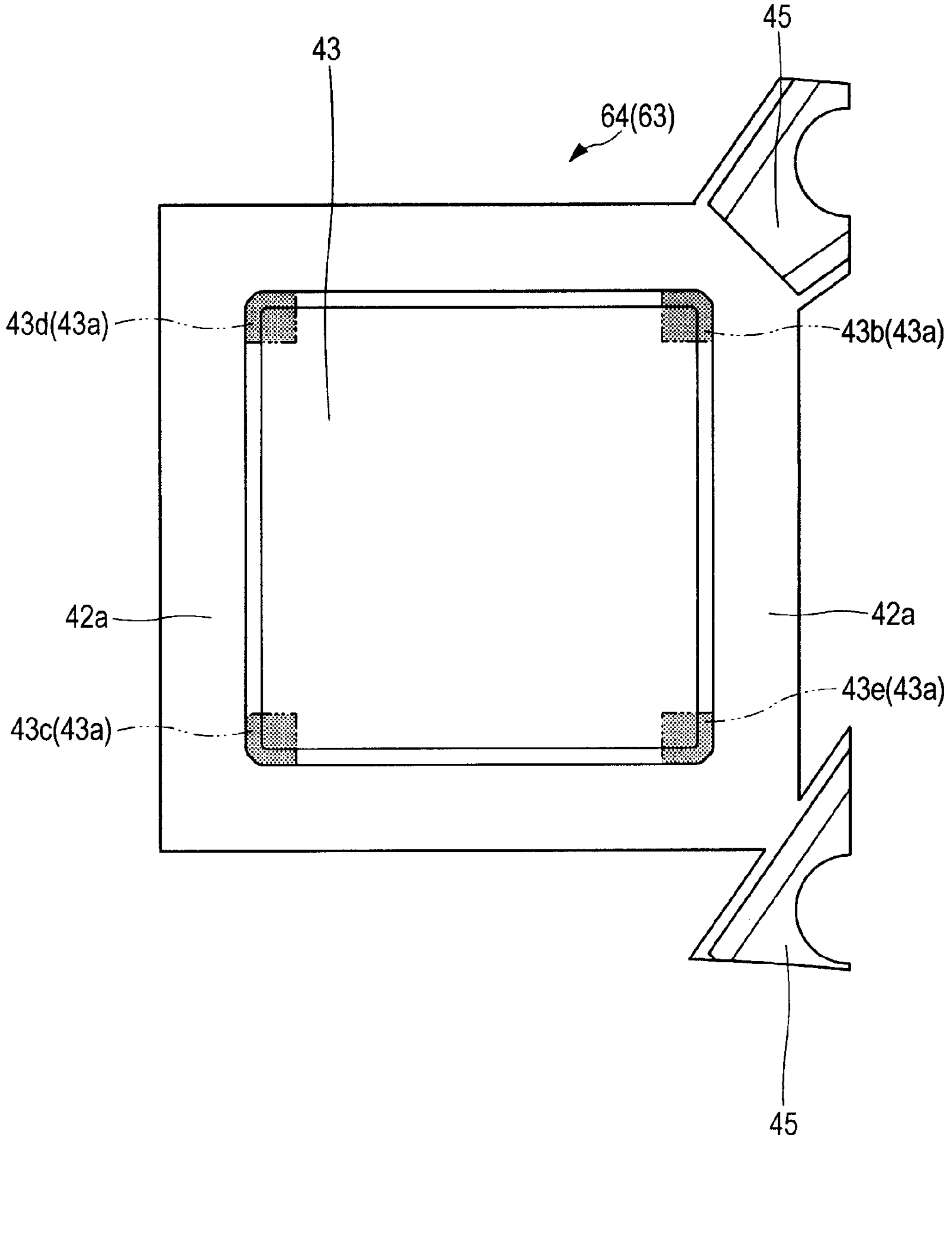
FIG. 42 is an enlarged plan view illustrating a molding die used in a method of manufacturing a semiconductor device illustrated in FIG. 41, which is a modification to the molding die (upper die) illustrated in FIG. 25.

Description will be given to another embodiment in which the QFN 1 described in relation to the first embodiment is manufactured. The description of this embodiment will be given mainly to a difference from the method of manufacturing a semiconductor device described in relation to the first embodiment and the description of common elements will be omitted. Also with respect to drawings, those required for explaining a difference from the first embodiment will be presented and drawings referred to in relation to the first embodiment will be referred to as required in the following description. FIG. 41 is an enlarged plan view illustrating a modification to the lead frame illustrated in FIG. 21. FIG. 42 is an enlarged plan view illustrating a modification to the molding die (upper die) illustrated in FIG. 25.

A difference between the lead frame 62 illustrated in FIG. 41 and the lead frame 30 illustrated in FIG. 21 is in that in this embodiment, a resin spacer 8 is not formed. As described in relation to the first embodiment, each resin spacer 8 illustrated in FIG. 21 is formed to prevent damage to the sealing resin 6 and the like when the following processing is carried out: processing in which multiple lead frames 30 are stacked and conveyed at each of the molding step and the subsequent steps. When they are formed in multiple places in the lead frame 30, therefore, they need not be formed in all the product formation regions 30*a*. Even when resin spacers 8 are formed in the frame portions 30*b* illustrated in FIG. 11, multiple lead frames 30 can be stacked together as long as the amount of deformation in each lead frame 30 in the out-of-plane direction is small.

In the description of this embodiment, consequently, a case where a resin spacer 8 (Refer to FIG. 21) is not formed in each product formation region 30*a* as illustrated in FIG. 41 will be taken as an example. In this embodiment, the resin spacer 8 described in FIG. 21 is not formed. Therefore, all the three air vent portions 32 (air vent portions 32*c*, 32*d*, 32*e*) can be made equal in length as illustrated in FIG. 41. As described in relation to the first embodiment, it is effective to make equal the lengths of air vent portions 32 from the viewpoint of making equal the static pressures in the air vent portions 32. According to this embodiment, the static pressures can be easily made equal by making equal the lengths of the three air vent portions 32. Therefore, it is possible to more easily control the pressure balance in each cavity at the molding step than in the first embodiment.

According to this embodiment, a resin spacer 8 (Refer to FIG. 21) is not formed in each product formation region 30*a*. This makes it possible to simplify the structure of semiconductor device manufacturing equipment. For example, the flow cavities 46 illustrated in FIG. 25 are not formed in the molding die 63 (upper die 64) illustrated in FIG. 42. This makes it unnecessary to form the die surface 42*a* in accordance of the shape of each flow cavity 46. At the segmentation step described in relation to the first embodiment, the lead cut punches 52*a* are arranged so as to avoid each resin spacer 8 as illustrated in FIG. 38. Therefore, the lead cut punches 52*a* are in such a planar shape that they were cut in accordance with the planar shape of the resin spacer 8. Since a resin spacer 8 is not formed in this embodiment, meanwhile, the planar shape of each lead cut punch 52*a* can be made rectangular. The endurance of semiconductor device manufacturing equipment can be enhanced by simplifying the structure of the equipment as mentioned above.

The method of manufacturing a semiconductor device in this embodiment is the same as the method of manufacturing a semiconductor device described above in relation to the first embodiment except the above difference. Though repetitive description will be omitted, therefore, the aspects of the invention described in relation to the first embodiment can be applied except the above difference.

Up to this point, concrete description has been given to the invention made by the present inventors based on embodiments thereof. However, the invention is not limited to the above embodiments and can be variously modified without departing from the subject matter thereof, needless to add.

Some examples will be taken. In the above description of the first embodiment to the fourth embodiment, the QFN 1, which is a semiconductor device concretely examined by the present inventors, has been taken as examples. However, the invention can be applied to any other semiconductor device. In the QFN 1, for example, part (exposed portion 11) of each hanging lead 10 is exposed outside a corner portion 6*d* of the sealing resin 6. However, the invention can also be applied to semiconductor devices (QFN) of such a type that the exposed portions 11 are cut at the segmentation step described in relation to the first embodiment.

In the above description of the fourth embodiment, the method of manufacturing a semiconductor device in which a resin spacer 8 is not formed in each product formation region 30*a* has been taken as an example of a modification to the first embodiment. However, the technology described in relation to the fourth embodiment can be combined with the second embodiment or the third embodiment when it is applied.

As a modification obtained by combining the first embodiment with the technology described in relation to the fourth embodiment, the following configuration may be adopted: a configuration in which a resin spacer 8 is formed in some of the multiple product formation regions 30*a* and a resin spacer 8 is not formed in the others.

The invention is applicable to resin sealed semiconductor devices, for example, QFNs.

What is claimed is:

1. A method of manufacturing a semiconductor device comprising the steps of:

(a) providing a lead frame including a plurality of product formation regions each having a die pad having an upper surface and a lower surface opposite to the upper surface, a plurality of suspension leads each coupled to the die pad, a plurality of leads arranged around the die pad, and arranged between the suspension leads, and dam portion coupled to the leads;

(b) mounting a semiconductor chip, having a first main surface, a plurality of electrode pads formed on the first main surface, and a second main surface opposite to the first main surface, on the upper surface of the die pad;

(c) electrically coupling the electrode pads of the semiconductor chip and the leads via a plurality of conductive members, respectively;

(d) providing a molding die having an upper die, a first cavity formed in the upper die, a gate portion arranged outside a first corner portion of the four corner portions of the first cavity, and a lower die facing the upper die, a shape in a plan view of the first cavity being a quadrangle;

(e) disposing the lead frame on which the semiconductor chip is mounted between the upper die and the lower die such that the semiconductor chip is arranged inside of the first cavity, clamping a clamp area located around an area of the lead frame overlapped with the first cavity, and in this state, sealing the semiconductor chip, the conductive members, and an inner lead of each of the leads with resin such that a lower surface of each of the leads is exposed, and forming a sealed body; and (f) at an inside of the dam portion of each of the product formation regions, cutting the leads and the suspension leads, and separating the product formation regions into individual pieces, wherein in the lead frame, a plurality of air vent portions, which discharge gas in the first cavity to outside the first cavity in the step (e), are formed at positions, respectively, overlapping with the other corner portions of the first cavity, and wherein the air vent portions are led out from the other corner portions of the first cavity to outside the clamp areas, respectively, and extended along sides of the first cavity, respectively, in the clamp areas.

2. The method of manufacturing a semiconductor device according to claim 1, wherein the hanging leads are arranged so that the hanging leads are extended from the respective corner portions of the die pad in a square planar shape to the respective corner portions of the first cavity, wherein the air vent portions are arranged between the hanging leads and a first lead arranged next to the hanging leads of the leads, wherein at the step (e), the sealed body is so formed that respective parts of the hanging leads are exposed outside the respective corner portions of the first cavity, and wherein at the step (f), the hanging leads are cut so that the parts of the hanging leads exposed from the sealed body are left.

3. The method of manufacturing a semiconductor device according to claim 2, wherein the first corner portion and the gate portion of the first cavity formed in the upper die of the molding die are formed at a distance from each other, and wherein at the step (e), the gate portion and the first cavity are coupled with each other through gate slits formed in the lead frame.

4. The method of manufacturing a semiconductor device according to claim 3, wherein the first cavity has the first corner portion, a second corner portion positioned at the opposite corner to the first corner portion, and third and fourth corner portions positioned next to the first corner portion, and wherein, of the air vent portions, a first air vent portion coupled to the third corner portion and a second air vent portion coupled to the fourth corner portion are led toward the second corner portion.

5. The method of manufacturing a semiconductor device according to claim 4, wherein the lengths of the flow paths in the first and second air vent portions in the clamp areas from the border between the first and second air vent portions and the first cavity to ends of the clamp areas are equal to or larger than half of the length of each side of the first cavity.

6. The method of manufacturing a semiconductor device according to claim 5, wherein each of the air vent portions is formed by jointing together a plurality of hole portions penetrating the lead frame and a plurality of groove portions jointing together the hole portions.

7. The method of manufacturing a semiconductor device according to claim 6, wherein the groove portions are formed by removing part of the lead frame on the upper surface side, and wherein the step (e) is carried out with a film softer than the lead frame placed between the lower die and the lower surface of the lead frame.

8. The method of manufacturing a semiconductor device according to claim 6, wherein the width of each the groove portion is smaller than the width of each the hole portion.

9. The method of manufacturing a semiconductor device according to claim 5, wherein a plurality of the first cavities are formed in the upper die of the molding die, wherein a second cavity deeper than the first cavity is formed between the first cavities adjoining to each other, and wherein the second cavities are coupled to the first cavities through a third air vent portion coupled to the second corner portion of each the first cavity of the air vent portions.

10. The method of manufacturing a semiconductor device according to claim 9, wherein the cross-sectional area of the flow path in the third air vent portion is larger than the cross-sectional area of the flow path in each of the first and second air vent portions.

11. The method of manufacturing a semiconductor device according to claim 3, wherein the first cavity has the first corner portion, a second corner portion positioned at the opposite corner to the first corner portion, and third and fourth corner portions positioned next to the first corner portion, wherein of the air vent portions, a first air vent portion coupled to the third corner portion is led toward the second corner portion, and wherein a second air vent portion coupled to the fourth corner portion is led toward the first corner portion.

12. The method of manufacturing a semiconductor device according to claim 11, wherein a plurality of the first cavities are formed in the upper die of the molding die, wherein a second cavity deeper than the first cavity is formed between the first cavities adjoining to each other, and wherein the second cavities are coupled to the first cavities through a third air vent portion coupled to the second corner portion of each the first cavity of the air vent portions and arranged along a side coupling together the fourth corner portion and the second corner portion of each the first cavity.

13. The method of manufacturing a semiconductor device according to claim 12, wherein the lengths of the flow paths in the first and second air vent portions in the clamp areas from the border between the first and second air vent portions and the first cavity to ends of the clamp areas are equal to or larger than half of the length of each side of the first cavity.

14. The method of manufacturing a semiconductor device according to claim 13, wherein each of the air vent portions is formed by jointing together a plurality of hole portions penetrating the lead frame and a plurality of groove portions jointing together the hole portions.

15. The method of manufacturing a semiconductor device according to claim 14, wherein the groove portions are formed by removing part of the lead frame on the upper surface side, and wherein the step (e) is carried out with a film softer than the lead frame placed between the lower die and the lower surface of the lead frame.

16. The method of manufacturing a semiconductor device according to claim 14, wherein the width of each the groove portion is smaller than the width of each the hole portion.

17. The method of manufacturing a semiconductor device according to claim 3, wherein the first cavity has the first corner portion, a second corner portion positioned at the opposite corner to the first corner portion, and third and fourth corner portions positioned next to the first corner portion, and wherein of the air vent portions, a first air vent portion coupled to the third corner portion and a second air vent portion coupled to the fourth corner portion are respectively led toward the first corner portion.

* * * * *